(12) United States Patent
Kim et al.

(10) Patent No.: US 12,219,868 B2
(45) Date of Patent: Feb. 4, 2025

(54) ORGANIC ELECTROLUMINESCENCE DEVICE

(71) Applicant: Samsung Display Co., Ltd., Yongin-si (KR)

(72) Inventors: Hyeongmin Kim, Suwon-si (KR); Heechoon Ahn, Seoul (KR); Hyunah Um, Seoul (KR); Yeseul Lee, Busan (KR); Hyoyoung Lee, Suwon-si (KR); Yirang Im, Daejeon (KR); Seowon Cho, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 744 days.

(21) Appl. No.: 17/220,707

(22) Filed: Apr. 1, 2021

(65) Prior Publication Data
US 2022/0045287 A1 Feb. 10, 2022

(30) Foreign Application Priority Data
Aug. 10, 2020 (KR) .................. 10-2020-0100103

(51) Int. Cl.
*H10K 85/40* (2023.01)
*C07F 7/08* (2006.01)
(Continued)

(52) U.S. Cl.
CPC ........... *H10K 85/40* (2023.02); *C07F 7/0816* (2013.01); *C09K 11/06* (2013.01);
(Continued)

(58) Field of Classification Search
None
See application file for complete search history.

(56) References Cited

U.S. PATENT DOCUMENTS

| 8,895,966 B2 | 11/2014 | Numata et al. |
| 8,932,731 B2 | 1/2015 | Parham et al. |

(Continued)

FOREIGN PATENT DOCUMENTS

| CN | 110396111 A | 11/2019 |
| JP | 5724588 B2 | 5/2015 |

(Continued)

*Primary Examiner* — Jeffrey D Washville
(74) *Attorney, Agent, or Firm* — Lewis Roca Rothgerber Christie LLP

(57) ABSTRACT

An organic electroluminescence device of the present disclosure includes a first electrode, a second electrode oppositely disposed to the first electrode, and multiple organic layers disposed between the first electrode and the second electrode, wherein at least one organic layer among the multiple organic layers includes a fused polycyclic compound represented by Formula 1, thereby showing improved emission efficiency.

Formula 1

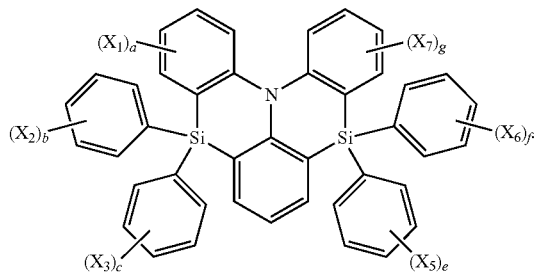

20 Claims, 6 Drawing Sheets

(51) Int. Cl.
  *C09K 11/06* (2006.01)
  *H10K 50/11* (2023.01)
  *H10K 85/60* (2023.01)
  *H10K 101/10* (2023.01)

(52) U.S. Cl.
  CPC ...... *C09K 2211/1018* (2013.01); *H10K 50/11* (2023.02); *H10K 85/657* (2023.02); *H10K 85/6572* (2023.02); *H10K 2101/10* (2023.02)

(56) References Cited

U.S. PATENT DOCUMENTS

| | | | |
|---|---|---|---|
| 2014/0058099 A1 | 2/2014 | Wakamiya et al. | |
| 2022/0109120 A1* | 4/2022 | MacInnis | C07F 15/0033 |
| 2023/0422614 A1* | 12/2023 | Seifermann | C07F 5/025 |

FOREIGN PATENT DOCUMENTS

| | | |
|---|---|---|
| JP | 5813707 B2 | 11/2015 |
| KR | 10-2014-0013001 A | 2/2014 |
| KR | 10-1546215 B1 | 8/2015 |
| KR | 10-1862881 B1 | 5/2018 |

* cited by examiner

ORGANIC ELECTROLUMINESCENCE DEVICE

CROSS-REFERENCE TO RELATED APPLICATIONS

This application claims priority to and the benefit of Korean Patent Application No. 10-2020-0100103, filed on Aug. 10, 2020, the entire content of which is hereby incorporated by reference.

BACKGROUND

1. Field

One or more aspects of embodiments of the present disclosure relate to an organic electroluminescence device, and for example, to an organic electroluminescence device including a fused polycyclic compound as a light-emitting material.

2. Description of Related Art

Organic electroluminescence displays are being actively developed as image displays. An organic electroluminescence display is different from a liquid crystal display, and is so-called a self-luminescent display, in which holes and electrons respectively injected from a first electrode and a second electrode recombine in an emission layer, such that a light-emitting material including an organic compound in the emission layer emits light to achieve display.

In the application of an organic electroluminescence device to a display, a decrease in driving voltage, an increase in emission efficiency, and/or an increase in the life (life span) of the organic electroluminescence device are desired, and development of materials for an organic electroluminescence device stably achieving such requirements is desired.

For example, in order to accomplish an organic electroluminescence device with high efficiency, recent development has focused on phosphorescence emission utilizing triplet state energy, or delayed fluorescence emission utilizing the generation of singlet excitons by the collision of triplet excitons (triplet-triplet annihilation, TTA).

SUMMARY

One or more aspects of embodiments of the present disclosure are directed toward an organic electroluminescence device with high efficiency.

One or more embodiments of the present disclosure provide an organic electroluminescence device including: a first electrode; a second electrode oppositely disposed to the first electrode; and multiple organic layers disposed between the first electrode and the second electrode, wherein at least one organic layer among the multiple organic layers includes a fused polycyclic compound; the fused polycyclic compound includes: a nitrogen atom at which a first phenyl group, a second phenyl group, and a third phenyl group are substituted; a first silicon atom connecting the first phenyl group and the second phenyl group; and a second silicon atom connecting the second phenyl group and the third phenyl group, wherein a fourth phenyl group and a fifth phenyl group are each connected with the first silicon atom; a sixth phenyl group and a seventh phenyl group are each connected with the second silicon atom; a nitrogen-containing substituent is substituted in at least one among the first to seventh phenyl groups; and the first electrode and the second electrode each independently include at least one selected from silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), tin (Sn), zinc (Zn), and ytterbium (Yb), a compound of two or more thereof, a mixture of two or more thereof, or an oxide thereof.

In an embodiment, the multiple organic layers may include a hole transport region, an emission layer, and an electron transport region, and the fused polycyclic compound may be included in the emission layer.

In an embodiment, the emission layer may be to emit thermally activated delayed fluorescence or phosphorescence.

In an embodiment, the emission layer may be to emit light having a central wavelength of about 420 nm to about 470 nm.

In an embodiment, the emission layer may include a host and a dopant, and the host may include the fused polycyclic compound.

In an embodiment, the nitrogen-containing substituent may be substituted by one, two or three phenyl groups selected from the first to seventh phenyl groups.

In an embodiment, at least one phenyl group selected from the first to seventh phenyl groups may be an unsubstituted phenyl group.

In an embodiment, the nitrogen-containing substituent may be a substituted or unsubstituted diphenylamine group, or a substituted or unsubstituted carbazole group.

In an embodiment, the fused polycyclic compound may be represented by Formula 1:

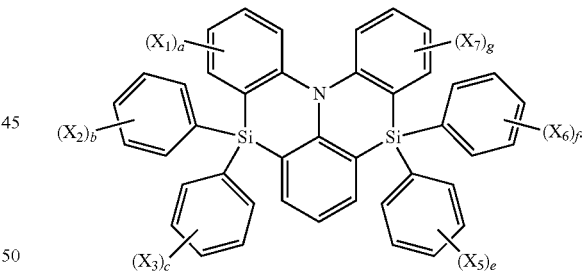

Formula 1

In Formula 1, $X_1$ to $X_7$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, a substituted or unsubstituted heteroaryl group of 2 to 30 ring-forming carbon atoms, or represented by Formula 2, "a" may be an integer of 0 to 4, "b" and "c" may each independently be an integer of 0 to 5, "d" may be an integer of 0 to 3, "e" and "f" may each independently be an integer of 0 to 5, "g" may be an integer of 0 to 4, and at least one among $X_1$ to $X_7$ may be represented by Formula 2:

Formula 2

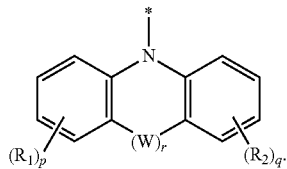

In Formula 2, $R_1$ and $R_2$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, "p" and "q" may each independently be an integer of 0 to 4, "W" may be a direct linkage, and "r" may be 0 or 1.

In an embodiment, any one among $X_1$ to $X_7$ may be represented by Formula 2.

In an embodiment, any two among $X_1$ to $X_7$ may each independently be represented by Formula 2.

In an embodiment, any three among $X_1$ to $X_7$ may each independently be represented by Formula 2.

In an embodiment, the fused polycyclic compound represented by Formula 1 may be represented by any one among Formula 1-1a to Formula 1-1c:

Formula 1-1a

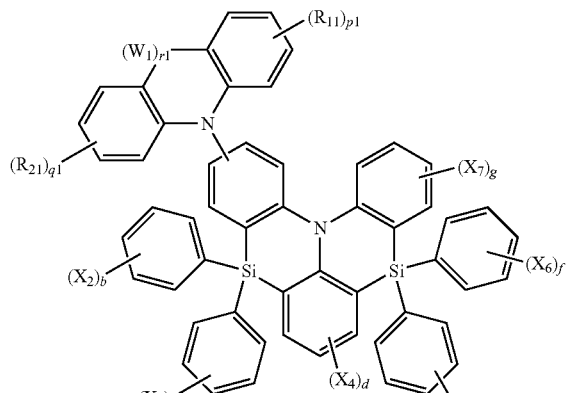

Formula 1-1b

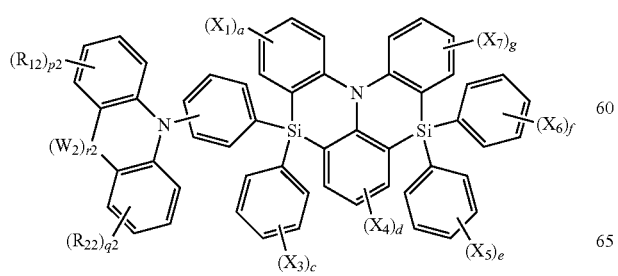

Formula 1-1c

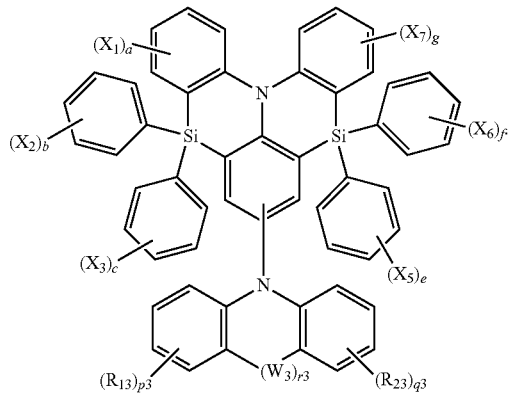

In Formula 1-1a to Formula 1-1c, $R_{11}$, $R_{12}$, $R_{13}$, $R_{21}$, $R_{22}$, and $R_{23}$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, p1, p2, p3, q1, q2, and q3 may each independently be an integer of 0 to 5, $W_1$, $W_2$, and $W_3$ may each independently be a direct linkage, r1, r2, and r3 may each independently be 0 or 1, and $X_1$ to $X_7$, and "a" to "g" may each independently be the same as defined in Formula 1 and Formula 2.

In an embodiment, the fused polycyclic compound represented by Formula 1 may be represented by any one among Formula 1-2a and Formula 1-2b:

Formula 1-2a

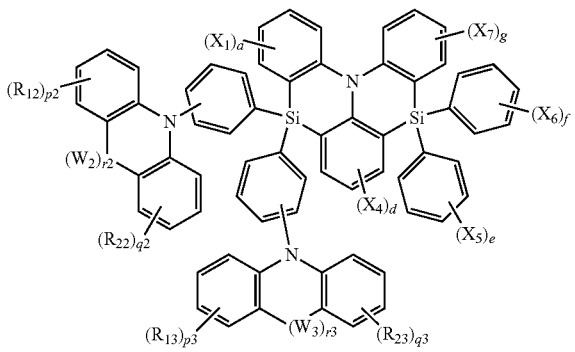

-continued

Formula 1-2b

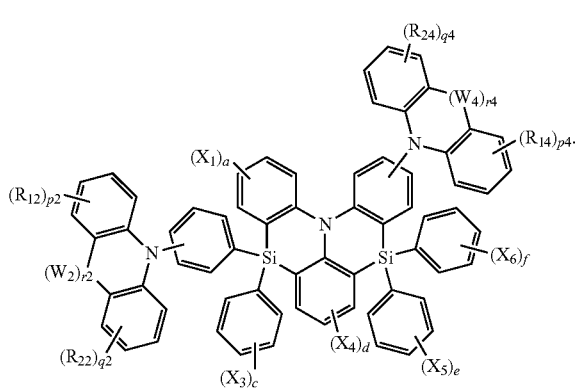

In Formula 1-2a and Formula 1-2b, $R_{12}$, $R_{13}$, $R_{14}$, $R_{22}$, $R_{23}$, and $R_{24}$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, p2, p3, p4, q2, q3, and q4 may each independently be an integer of 0 to 5, $W_2$, $W_3$, and $W_4$ may each independently be a direct linkage, r2, r3, and r4 may each independently be 0 or 1, and $X_1$ to $X_7$, and "a" to "g" may each independently be the same as defined in Formula 1 and Formula 2:

In an embodiment, the fused polycyclic compound represented by Formula 1 may be represented by Formula 1-3:

Formula 1-3

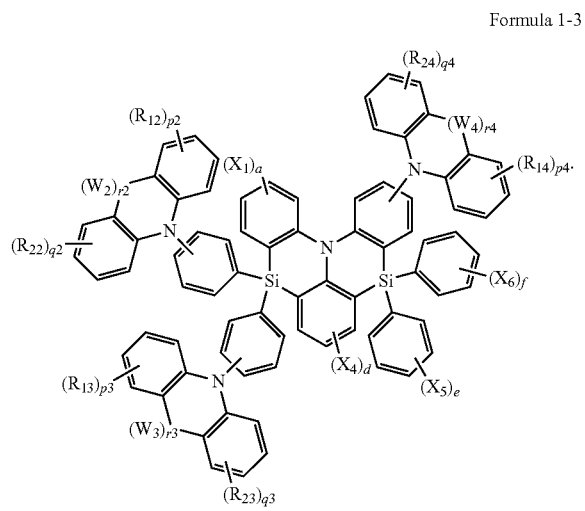

In Formula 1-3, $R_{12}$, $R_{13}$, $R_{14}$, $R_{22}$, $R_{23}$, and $R_{24}$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, p2, p3, p4, q2, q3, and q4 may each independently be an integer of 0 to 5, $W_2$, $W_3$, and $W_4$ may each independently be a direct linkage, r2, r3, and r4 may each independently be 0 or 1, and $X_1$ to $X_7$, and "a" to "g" may each independently be the same as defined in Formula 1 and Formula 2.

In an embodiment, Formula 2 may be represented by Formula 2-1 or Formula 2-2.

Formula 2-1

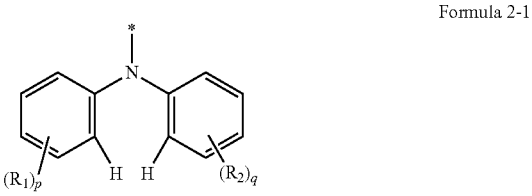

Formula 2-2

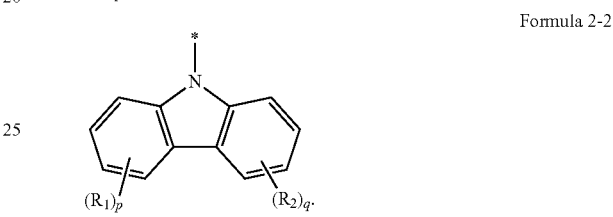

In Formula 2-1 and Formula 2-2, $R_1$, $R_2$, "p", and "q" may each independently be the same as defined in Formula 2.

In an embodiment, $R_1$ and $R_2$ may each independently be a hydrogen atom, a substituted or unsubstituted silyl group, a substituted or unsubstituted alkyl group of 1 to 30 carbon atoms, or a substituted or unsubstituted heteroaryl group of 2 to 30 ring-forming carbon atoms.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure, and together with the description, serve to explain principles of the present disclosure. In the drawings.

DETAILED DESCRIPTION

Figure 1:
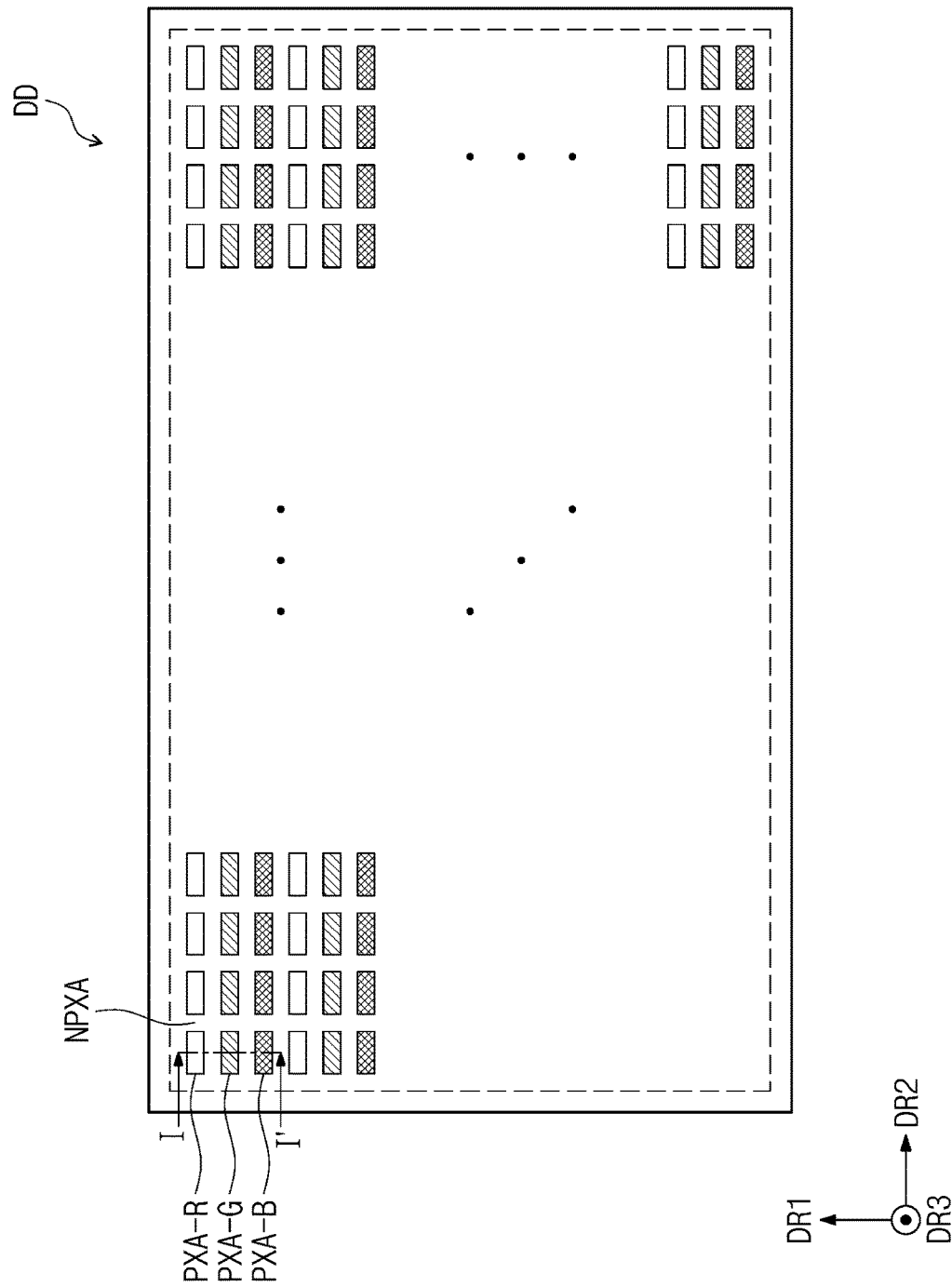
FIG. 1 is a plan view of a display apparatus of an embodiment.

The present disclosure may modified in various suitable ways and may be embodied in different forms, and example embodiments will be explained in more detail with reference to the accompanying drawings. The present disclosure may, however, be embodied in different forms and should not be construed as being limited to the embodiments set forth herein. Rather, all modifications, equivalents, and substitutions that are included in the spirit and technical scope of the present disclosure should be included in the present disclosure.

Like reference numerals refer to like elements throughout, and duplicative descriptions thereof may not be provided. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. For example, a first element could be termed a second element without departing from the teachings of the present disclosure. Similarly, a second element could be termed a first element. As used herein, the singular forms are intended to include the plural forms as well, unless the context clearly indicates otherwise.

The term "and/or" includes any and all combinations of one or more of the associated listed items.

In the description, it will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the description, it will also be understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. Also, when an element is referred to as being disposed "on" another element, it can be disposed under the other element. When an element is referred to as being "directly on," "directly above," or "directly below" another element, there are no intervening elements present.

In the description, the term "substituted or unsubstituted" corresponds to a state of being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the substituents may be further substituted or unsubstituted. For example, a biphenyl group may be interpreted as a named aryl group, or as a phenyl group substituted with a phenyl group.

In the description, the term "combined with an adjacent group to form a ring" may refer to forming a substituted or unsubstituted hydrocarbon ring, or a substituted or unsubstituted heterocycle via combination (e.g., bonding) with an adjacent group. The hydrocarbon ring may be an aliphatic hydrocarbon ring or an aromatic hydrocarbon ring. The heterocycle may be an aliphatic heterocycle or an aromatic heterocycle. The ring formed by the combination with an adjacent group may be a monocyclic ring or a polycyclic ring. In some embodiments, the ring formed via the combination with an adjacent group may be further combined with another ring to form a spiro structure.

In the description, the term "adjacent group" may refer to a substituent on an adjacently bonded atom, a substituent on the same atom, or a substituent sterically positioned at the nearest position to (e.g., within bonding distance of) a corresponding substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other.

In the description, the halogen atom may be a fluorine atom, a chlorine atom, a bromine atom, or an iodine atom.

In the description, the term "alkyl" may refer to a linear, branched or cyclic alkyl group. The carbon number of the alkyl may be 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the term "hydrocarbon ring group" may refer to an optional functional group or substituent derived from an aliphatic hydrocarbon ring. The hydrocarbon ring group may be a saturated hydrocarbon ring group of 5 to 20 carbon atoms for forming a ring.

In the description, the term "aryl group" may refer to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the fluorenyl group may be substituted, and two substituents may be combined with each other to form a spiro structure. Examples of a substituted fluorenyl group may be as follows. However, embodiments of the present disclosure are not limited thereto.

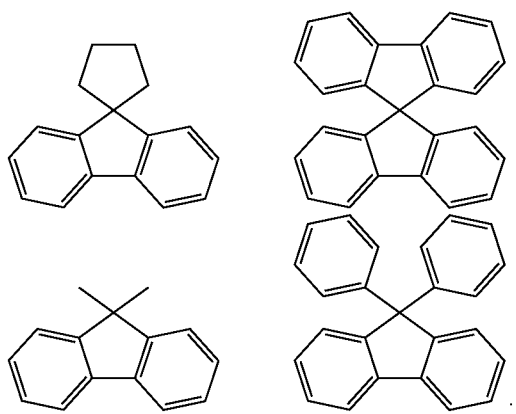

In the description, the term "heterocyclic group" may refer to an optional functional group or substituent derived from a ring including one or more among boron (B), oxygen (O), nitrogen (N), phosphorus (P), silicon (Si) and sulfur (S) as heteroatoms. The heterocyclic group may be an aliphatic heterocyclic group or an aromatic heterocyclic group. The aromatic heterocyclic group may be a heteroaryl group. The aliphatic heterocycle and the aromatic heterocycle may each independently be a monocycle or a polycycle.

In the description, the heterocyclic group may include one or more among boron (B), oxygen (O), nitrogen (N), phosphorus (P), silicon (Si) and sulfur (S) as heteroatoms. When the heterocyclic group includes two or more heteroatoms, the two or more heteroatoms may be the same or different. The heterocyclic group may be a monocyclic heterocyclic group or a polycyclic heterocyclic group, and in some embodiments may be a heteroaryl group. The number of carbon atoms in each ring of the heterocyclic group may be, for example, 2 to 30, 2 to 20, or 2 to 10.

In the description, the aliphatic heterocyclic group may include one or more among B, O, N, P, Si and S as heteroatoms. The number of carbon atoms in each ring of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the heteroaryl group may include one or more among B, O, N, P, Si and S as heteroatoms. When the heteroaryl group includes two or more heteroatoms, the two or more heteroatoms may be the same or different. The heteroaryl group may be a monocyclic heteroaryl group or a polycyclic heteroaryl group. The number of carbon atoms in each ring of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the explanation of the aryl group may be applied to the arylene group, except that the arylene group is a divalent group. The explanation of the heteroaryl group may be applied to the heteroarylene group, except that the heteroarylene group is a divalent group.

In the description, the term "silyl group" includes an alkyl silyl group and an aryl silyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the description, the alkenyl group may be a linear or branched chain alkenyl. The carbon number is not specifically limited, but for example may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the carbon number of the amine group is not specifically limited, but for example may be 1 to 30.

The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, the alkyl group in an alkylthio group, an alkylsulfoxy group, an alkylaryl group, an alkylamino group, an alkyl boron group, an alkyl silyl group, and an alkyl amine group is the same as described with respect to the alkyl group.

In the description, the aryl group in an aryloxy group, an arylthio group, an arylsulfoxy group, an arylamino group, an aryl boron group, an aryl silyl group, and an aryl amine group is the same as described with respect to the aryl group.

In the description, the term "direct linkage" may refer to a single bond.

In some embodiments, in the description, "⁓" and "—*" refer to positions of connection (e.g., to another group, moiety, etc.).

Hereinafter, embodiments of the present disclosure will be explained with reference to the attached drawings.

Figure 2:
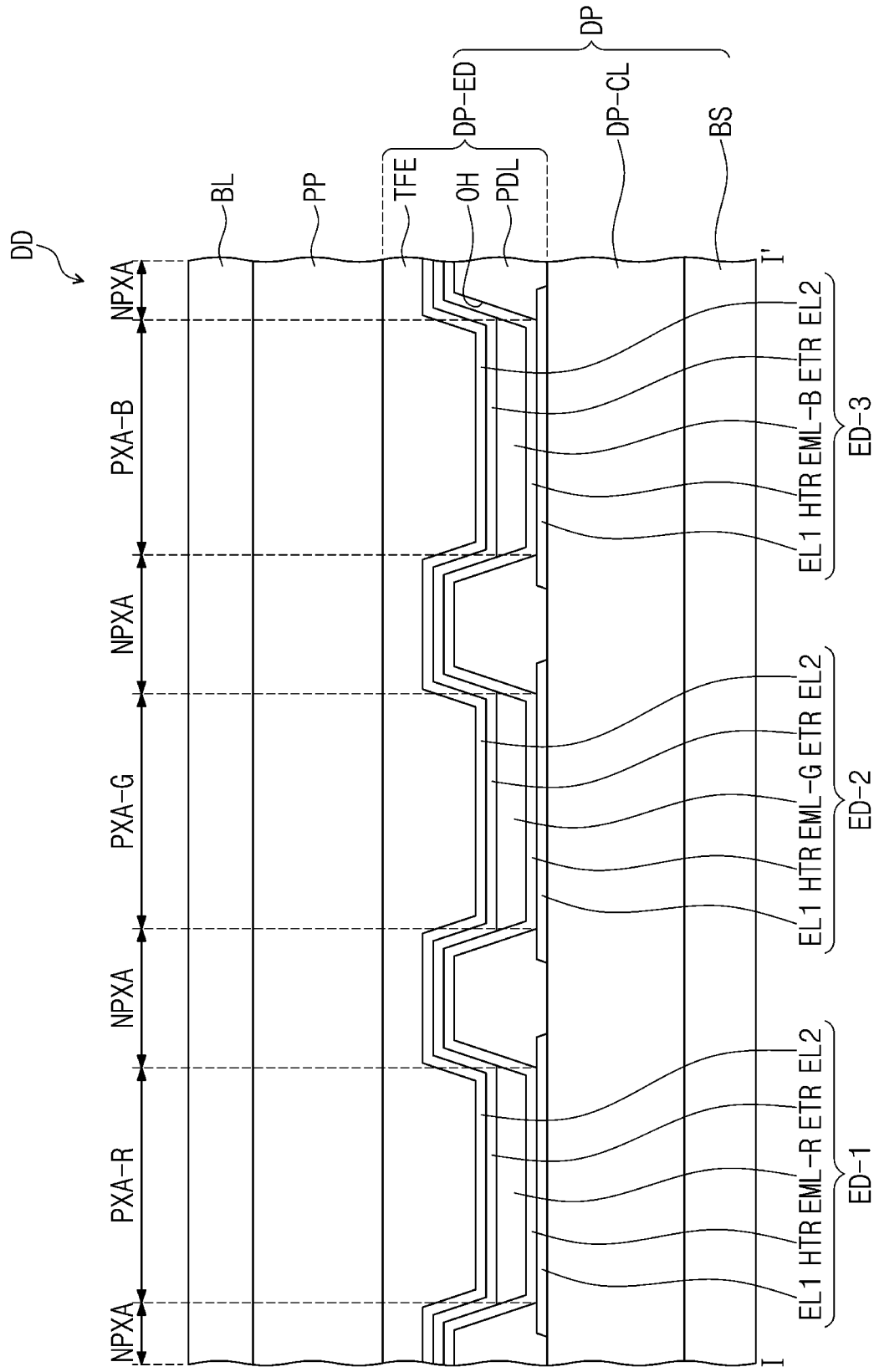
FIG. 2 is a cross-sectional view of a display apparatus of an embodiment.

FIG. 1 is a plan view showing an embodiment of a display apparatus DD. FIG. 2 is a cross-sectional view of a display apparatus DD of an embodiment. FIG. 2 is a cross-sectional view showing a part corresponding to line I-I' in FIG. 1.

The display apparatus DD may include a display panel DP and an optical layer PP positioned on the display panel DP. The display panel DP includes light-emitting devices ED-1, ED-2 and ED-3. The display apparatus DD may include multiple light-emitting devices ED-1, ED-2 and ED-3. The optical layer PP is positioned on the display panel DP and may control or reduce reflection of external light by the display panel DP. The optical layer PP may include, for example, a polarization layer and/or a color filter layer. In some embodiments, the optical layer PP in the display apparatus DD of an embodiment may be omitted. In some embodiments, a plugging layer may be further included between the optical layer PP and the display panel DP. The plugging layer may include at least one selected from a silicon-based resin, an epoxy-based resin, and an acrylic resin.

The display panel DP may include a base layer BS, a circuit layer DP-CL on the base layer BS, and a display device layer DP-ED. The display device layer DP-ED may include a pixel definition layer PDL, light-emitting devices ED-1, ED-2 and ED-3 disposed between the pixel definition layers PDL, and an encapsulating layer TFE disposed on the light-emitting devices ED-1, ED-2 and ED-3.

The base layer BS may be a member providing a base surface where the display device layer DP-ED is disposed. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL may be disposed on the base layer BS, and the circuit layer DP-CL may include multiple transistors. Each of the multiple transistors may include a control electrode, an input electrode, and an output electrode. For example, the circuit layer DP-CL may include switching transistors and driving transistors for driving the light-emitting devices ED-1, ED-2, and ED-3 of the display device layer DP-ED.

Each of the light-emitting devices ED-1, ED-2 and ED-3 may have the structure of a light-emitting device ED of an embodiment according to FIG. 3 to FIG. 6, which will be explained later. Each of the light-emitting devices ED-1, ED-2, and ED-3 may include a first electrode EL1, a hole transport region HTR, emission layers EML-R, EML-G and EML-B, an electron transport region ETR, and a second electrode EL2.

FIG. 2 is an embodiment in which the emission layers EML-R, EML-G, and EML-B of the light-emitting devices ED-1, ED-2, and ED-3 are disposed in opening portions OH defined in the pixel definition layer PDL, and the hole transport region HTR, the electron transport region ETR, and the second electrode EL2 are provided as common layers in all light-emitting devices ED-1, ED-2, and ED-3. However, embodiments of the present disclosure are not limited thereto. In some embodiments, the hole transport region HTR and the electron transport region ETR may be patterned and provided in the opening portions OH defined in the pixel definition layer PDL. For example, in an embodiment, the hole transport region HTR, the emission layers EML-R, EML-G. and EML-B, and the electron transport region ETR of the light-emitting devices ED-1, ED-2, and ED-3 may each be patterned and provided by an ink jet printing method.

The encapsulating layer TFE may cover the light-emitting devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stack of multiple layers. The encapsulating layer TFE may include at least one insulating layer. The encapsulating layer TFE according to an embodiment may include at least one inorganic layer (hereinafter, encapsulating inorganic layer). In some embodiments, the encapsulating layer TFE according to an embodiment may include at least one organic layer (hereinafter, encapsulating organic layer) and at least one encapsulating inorganic layer.

The encapsulating inorganic layer may protect the display device layer DP-ED from moisture/oxygen, and the encapsulating organic layer may protect the display device layer DP-ED from foreign materials (such as dust particles). The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed while plugging the opening portion OH.

Referring to FIG. 1 and FIG. 2, the display apparatus DD may include a non-light-emitting area NPXA and light-emitting areas PXA-R, PXA-G, and PXA-B. The light-emitting areas PXA-R, PXA-G, and PXA-B may be areas to emit light produced from the light-emitting devices ED-1, ED-2, and ED-3, respectively. The light-emitting areas PXA-R, PXA-G, and PXA-B may be separated from each other on a plane.

The light-emitting areas PXA-R, PXA-G, and PXA-B may be separated by the pixel definition layer PDL. The non-light-emitting areas NPXA may be areas between neighboring light-emitting areas PXA-R, PXA-G, and PXA-B, and may correspond to the pixel definition layer PDL. In some embodiments, in the disclosure, each of the light-emitting areas PXA-R, PXA-G, and PXA-B may correspond to respective pixels. The pixel definition layer PDL may divide the light-emitting devices ED-1, ED-2, and ED-3.

The emission layers EML-R, EML-G, and EML-B of the light-emitting devices ED-1, ED-2 and ED-3 may be disposed and divided in the opening portions OH defined in the pixel definition layer PDL.

The light-emitting areas PXA-R, PXA-G, and PXA-B may be divided into groups according to the color of light produced from the light-emitting devices ED-1, ED-2, and ED-3. In the display apparatus DD of an embodiment, as shown, three light-emitting areas PXA-R, PXA-G, and PXA-B respectively to emit red light, green light and blue light are illustrated in FIG. 1 and FIG. 2. For example, the display apparatus DD of an embodiment may include a red light-emitting area PXA-R, a green light-emitting area PXA-G, and a blue light-emitting area PXA-B, which are separated from each other.

In the display apparatus DD according to an embodiment, multiple light-emitting devices ED-1, ED-2 and ED-3 may be to emit light having different wavelength regions. For example, in an embodiment, the display apparatus DD may include a first light-emitting device ED-1 to emit red light, a second light-emitting device ED-2 to emit green light, and a third light-emitting device ED-3 to emit blue light. For example, each of the red light-emitting area PXA-R, the green light-emitting area PXA-G, and the blue light-emitting area PXA-B may correspond to the first light-emitting device ED-1, the second light-emitting device ED-2, and the third light-emitting device ED-3, respectively.

However, embodiments of the present disclosure are not limited thereto, and the first to third light-emitting devices ED-1, ED-2, and ED-3 may be to emit light in the same wavelength region, or at least one thereof may be to emit light in a different wavelength region. For example, all the first to third light-emitting devices ED-1, ED-2 and ED-3 may be to emit blue light.

The light-emitting areas PXA-R, PXA-G, and PXA-B in the display apparatus DD according to an embodiment may be arranged in a stripe shape. Referring to FIG. 1, multiple red light-emitting areas PXA-R, multiple green light-emitting areas PXA-G and multiple blue light-emitting areas PXA-B may be arranged along a second direction DR2. In some embodiments, the red light-emitting area PXA-R, the green light-emitting area PXA-G and the blue light-emitting area PXA-B may be arranged by turns (e.g., alternatingly arranged) along a first direction DR1.

In FIG. 1 and FIG. 2, the areas of the light-emitting areas PXA-R, PXA-G and PXA-B are shown as being similar or substantially the same, but embodiments of the present disclosure are not limited thereto. In some embodiments, the areas of the light-emitting areas PXA-R, PXA-G, and PXA-B may be different from each other according to the wavelength region of light emitted. In some embodiments, the areas of the light-emitting areas PXA-R, PXA-G, and PXA-B may refer to areas on a plane defined by the first direction DR1 and the second direction DR2.

In some embodiments, the arrangement type or kind of the light-emitting areas PXA-R, PXA-G, and PXA-B is not limited to the configuration shown in FIG. 1, and the arrangement order of the red light-emitting areas PXA-R, the green light-emitting areas PXA-G, and the blue light-emitting areas PXA-B may be provided in one or more suitable combinations according to the properties of display quality required for the display apparatus DD. For example, the arrangement or kind of the light-emitting areas PXA-R, PXA-G, and PXA-B may be a PENTILE® arrangement, or a diamond arrangement.

In some embodiments, the areas of the light-emitting areas PXA-R, PXA-G, and PXA-B may be different from each other. For example, in an embodiment, the area of the green light-emitting area PXA-G may be smaller than the area of the blue light-emitting area PXA-B, but embodiments of the present disclosure are not limited thereto.

Hereinafter, FIG. 3 to FIG. 6 are cross-sectional views schematically showing light-emitting devices according to example embodiments. The light-emitting device ED according to an embodiment may include a first electrode EL1, a hole transport region HTR, an emission layer EML, an electron transport region ETR, and a second electrode EL2, stacked in this order.

Figure 3:
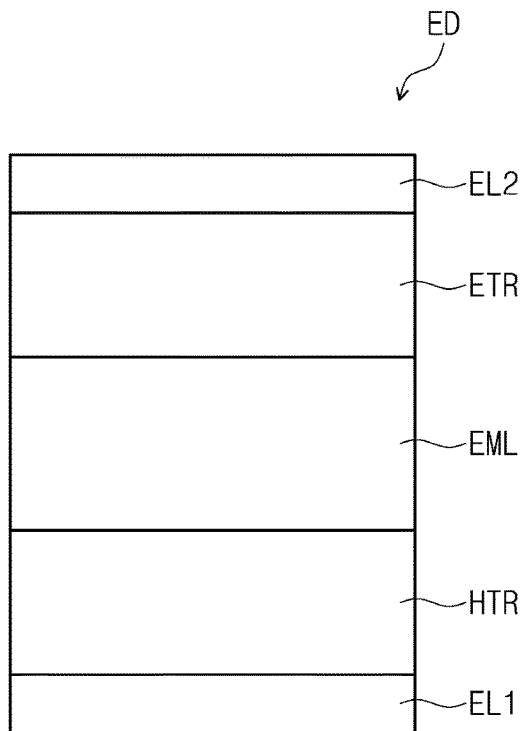
FIG. 3, FIG. 4, FIG. 5 and FIG. 6 are cross-sectional views schematically showing light-emitting devices of embodiments.
Figure 4:
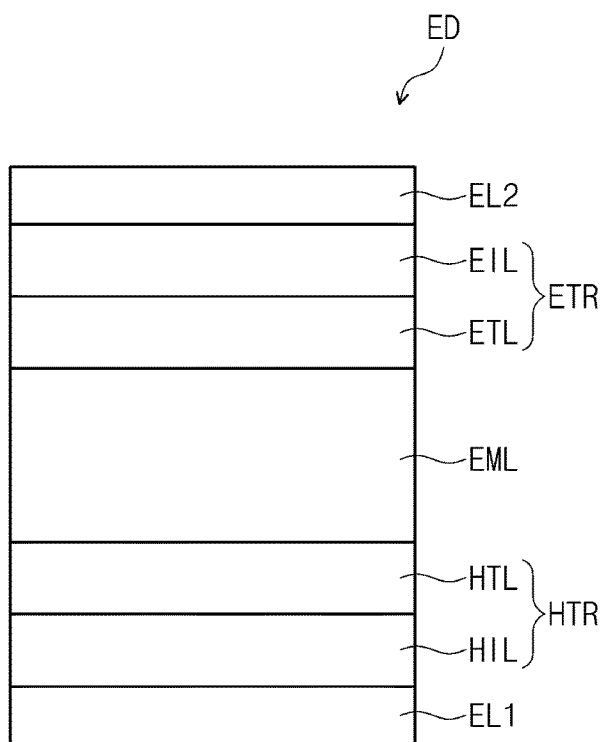
Figure 5:
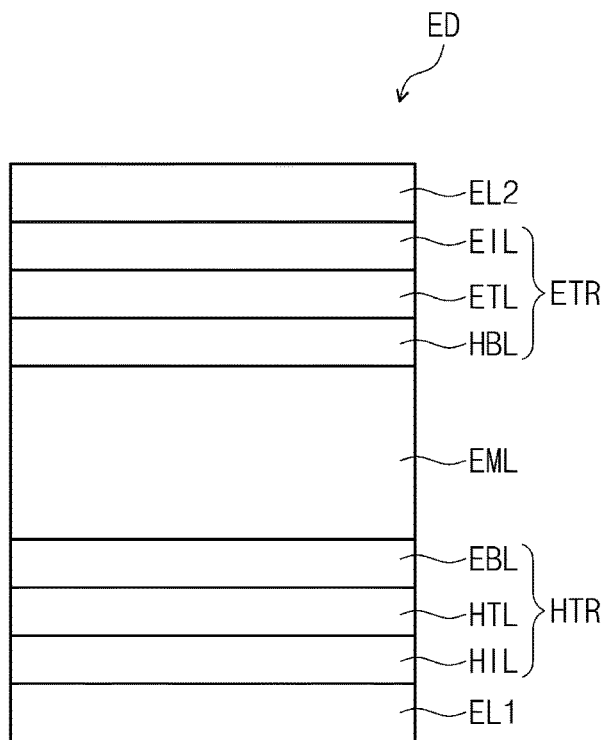
Figure 6:
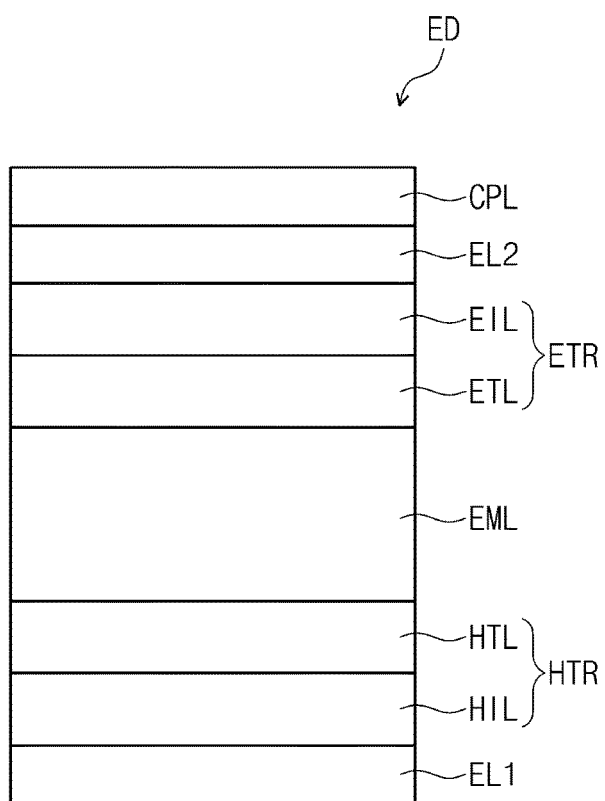

Compared with FIG. 3, FIG. 4 shows the cross-sectional view of a light-emitting device ED of an embodiment, wherein the hole transport region HTR includes a hole injection layer HIL and a hole transport layer HTL, and the electron transport region ETR includes an electron injection layer EIL and an electron transport layer ETL. Compared with FIG. 3, FIG. 5 shows the cross-sectional view of a light-emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 shows the cross-sectional view of a light-emitting device ED of an embodiment, including a capping layer CPL disposed on the second electrode EL2.

The first electrode EL1 may have conductivity. The first electrode EL1 may be formed utilizing a metal alloy and/or a conductive compound. The first electrode EL1 may be an anode or a cathode. However, embodiments of the present disclosure are not limited thereto. In some embodiments, the first electrode EL1 may be a pixel electrode. The first electrode EU may be a transmissive electrode, a transflective electrode, or a reflective electrode. When the first electrode EL1 is a transmissive electrode, the first electrode EL1 may be formed utilizing a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), tin (Sn), zinc (Zn), ytterbium (Yb), tungsten (W), a compound thereof, a mixture thereof (for example, AgMg, AgYb, and/or MgAg), or an oxide thereof. In some embodiments, the first electrode EL1 may have a structure including multiple layers (for example including a reflective layer or a transflective layer formed utilizing the materials, and a transmissive conductive layer formed utilizing ITO, IZO, ZnO, and/or ITZO). In some embodiments, the first electrode EL1 may include a three-layer structure of ITO/Ag/ITO. However, embodiments of the present disclosure are not limited thereto. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include at least one of a hole injection layer HIL, a hole transport layer HTL, a hole buffer layer, an emission auxiliary layer, or an electron blocking layer EBL. The thickness of the hole transport region HTR may be about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, or may have a structure of a single layer formed utilizing a hole injection material and a hole transport material. In some embodiments, the hole transport region HTR may have a structure of a single layer formed utilizing multiple different materials, or a structure stacked from the first electrode EU of e.g., hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed utilizing one or more suitable methods (such as a vacuum deposition method, a spin coating method, a cast method, a Langmuir-Blodgett (LB) method, an inkjet printing method, a laser printing method, and a laser induced thermal imaging (LITI) method).

The hole transport region HTR may include, for example, a phthalocyanine compound (such as copper phthalocyanine), $N^1,N^{1'}$-([1,1'-biphenyl]-4,4'-diyl)bis($N^1$-(phenyl-$N^4$, $N^4$-di-m-tolylbenzene-1,4-diamine (DNTPD), 4,4',4"-[tris (3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(1-naphthalene-1-yl)-N,N'-diphenyl-benzidine (NPB), triphenylamine-containing polyether ketone (TPAPEK), 4-isopropyl-4'-methyldiphenyliodonium [tetrakis(pentafluorophenyl) borate], and dipyrazino[2,3-f:2',3'-h] quinoxaline-2,3,6,7, 10,11-hexacarbonitrile (HAT-CN).

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include a compound represented by Formula H-1:

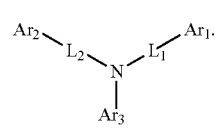

Formula H-1

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, $Ar_1$ and ($Ar_2$ may each independently be a substituted or unsubstituted aryl group of 6 to 30 ring-forming carbon atoms, or a substituted or unsubstituted heteroaryl group of 2 to 30 ring-forming carbon atoms. In some embodiments, in Formula H-1, Ara may be a substituted or unsubstituted aryl group of 6 to 30 ring-forming carbon atoms.

In some embodiments, the compound represented by Formula H-1 may be a monoamine compound. In some embodiments, the compound represented by Formula H-1 may be a diamine compound in which at least one selected from $Ar_1$ to Ara includes an amine group as a substituent. In some embodiments, the compound represented by Formula H-1 may be a carbazole-based compound in which a substituted or unsubstituted carbazole group is included in at least one selected from $Ar_1$ and $Ar_2$, or a fluorene-based compound in which a substituted or unsubstituted fluorene group is included in at least one among $Ar_1$ and $Ar_2$.

The compound represented by Formula H-1 may be represented by any one selected from the compounds represented in Compound Group H. However, the compound represented by Formula H-1 is not limited to those embodiments represented in Compound Group H:

Compound Group H

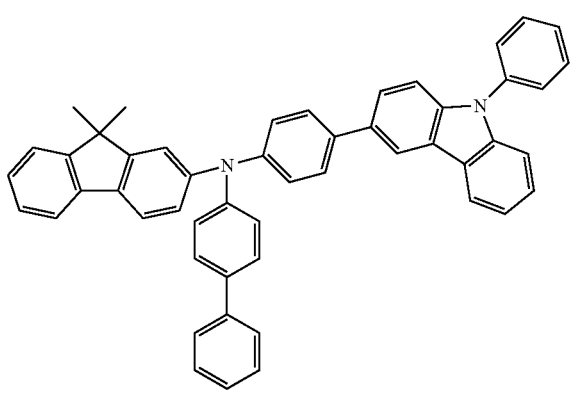

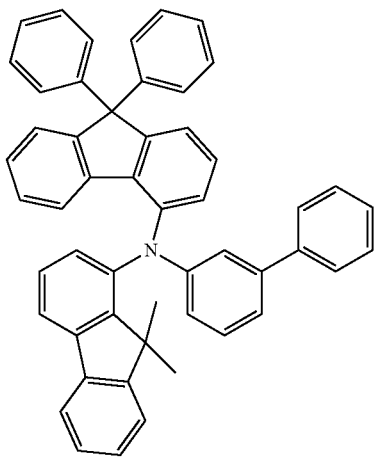

-continued

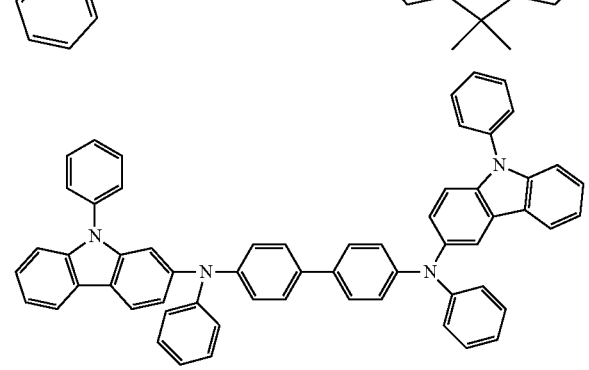

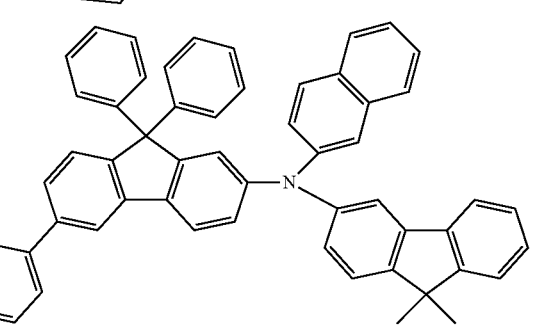

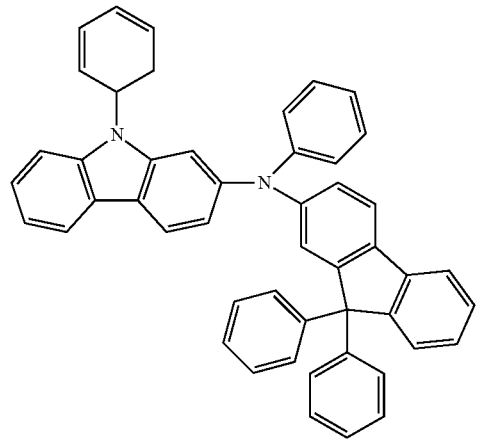

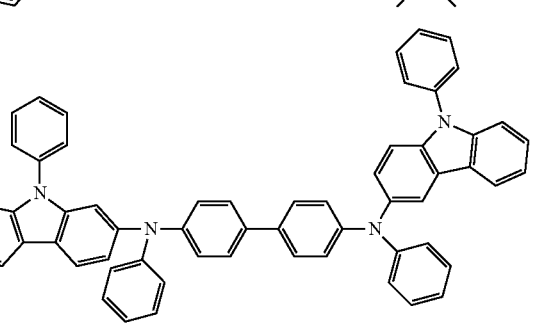

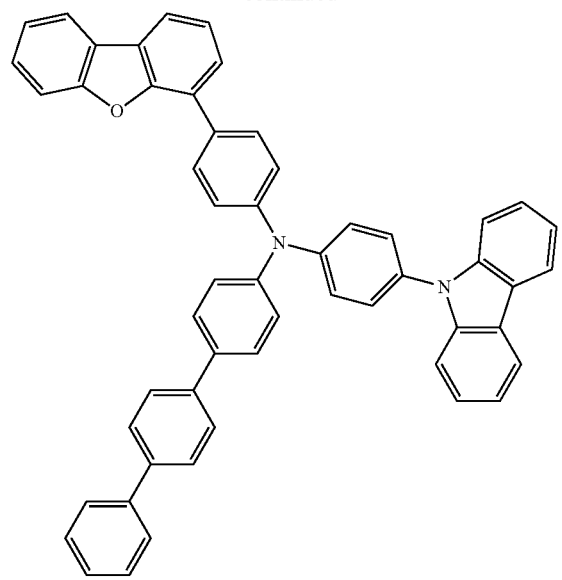
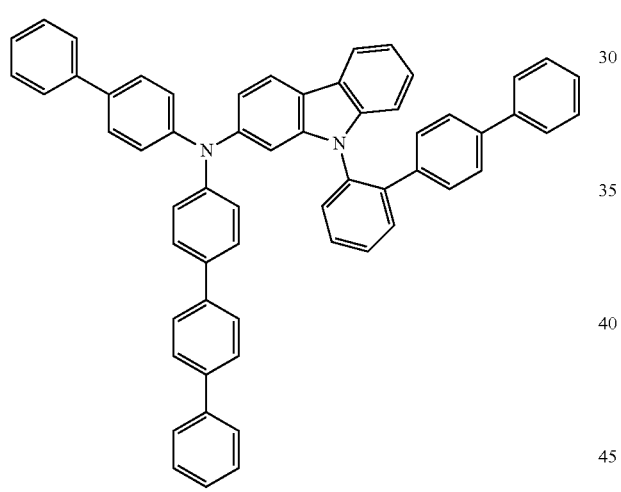
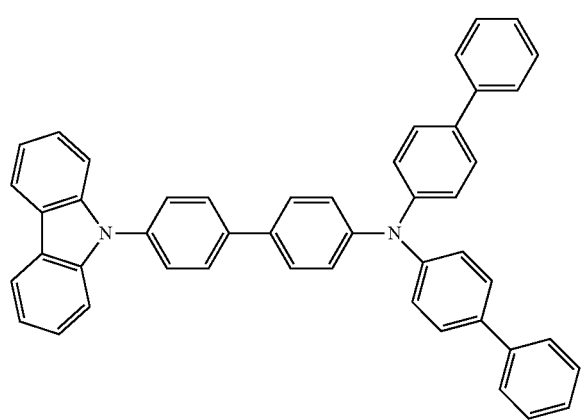
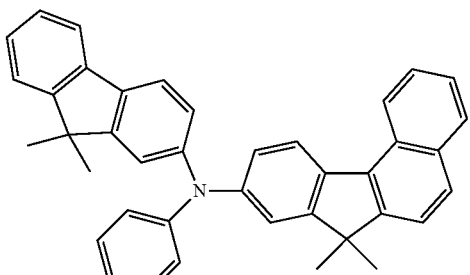
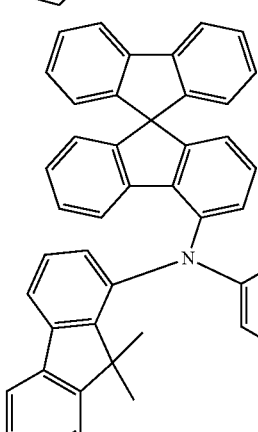
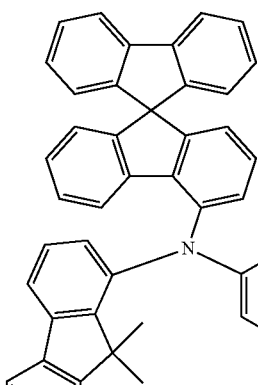
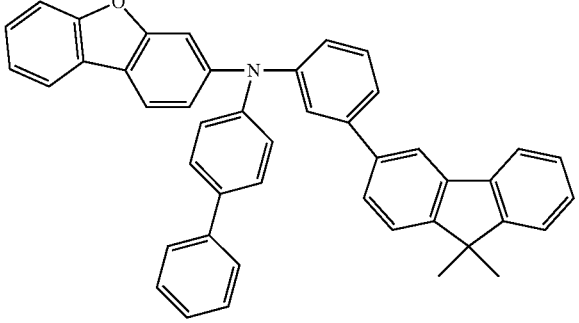

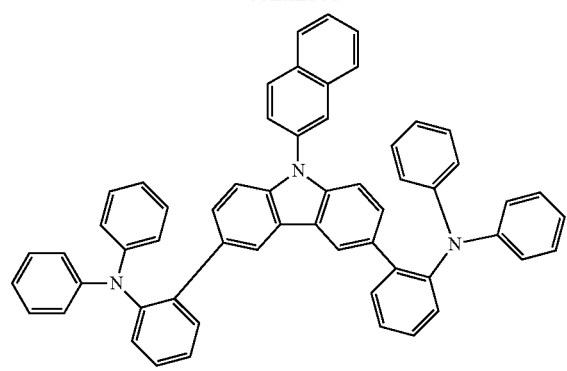
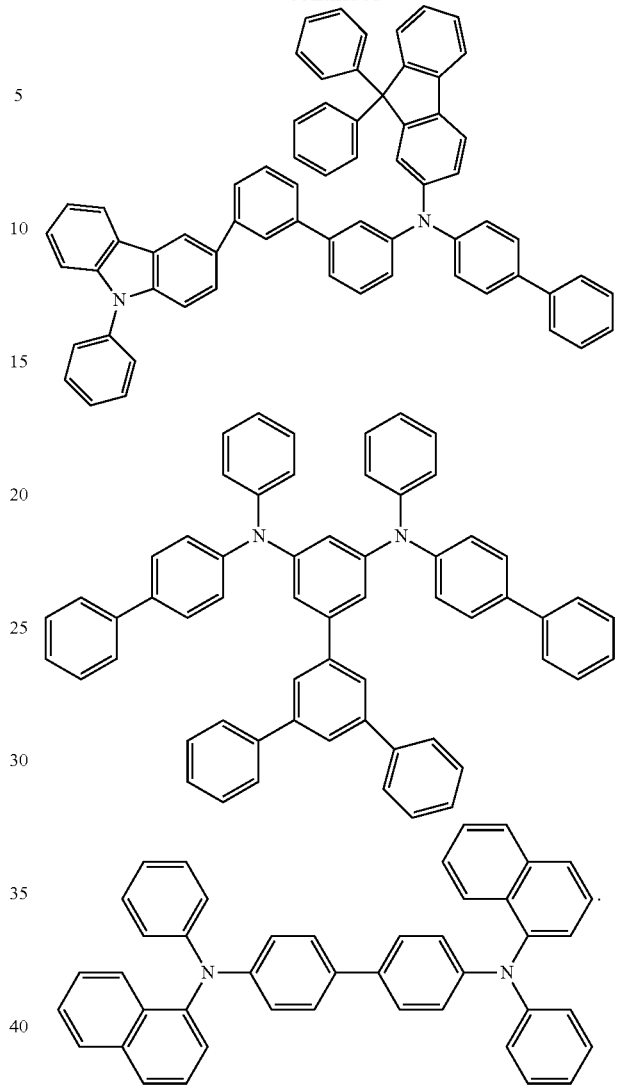
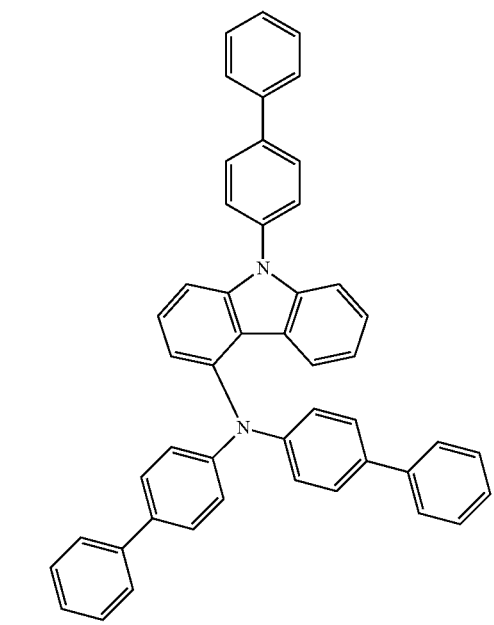

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to increase conductivity. The charge generating material may be dispersed substantially uniformly or non-uniformly in the hole transport region HTR. The charge generating material may be, for example, a p-dopant. The p-dopant may include any one selected from quinone derivatives, metal oxides, and cyano group-containing compounds, without limitation. For example, non-limiting examples of the p-dopant include quinone derivatives (such as tetracyanoquinodimethane (TCNQ) and/or 2,3,5,6-tetrafluoro-7,7', 8,8-tetracyanoquinodimethane (F4-TCNQ)), metal oxides (such as tungsten oxide and/or molybdenum oxide), metal halides (such as CuI and/or RbI), dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, etc.

As described above, the hole transport region HTR may further include at least one of a hole buffer layer or an electron blocking layer EBL, in addition to the hole injection layer HIL and the hole transport layer HTL. The hole buffer layer may compensate for an optical resonance distance of a wavelength of light emitted from an emission layer EML, and may thereby increase the light emission efficiency of the device. Materials that may be included in the hole transport region HTR may also be included in the hole buffer layer. The electron blocking layer EBL may prevent or reduce electron injection from the electron transport region ETR to the hole transport region HTR.

The emission layer EML is provided on the hole transport region HTR. The emission layer EML may, for example, have a thickness of about 100 Å to about 1,000 Å or about 100 Å to about 300 Å. The emission layer EML may have a single layer formed utilizing a single material, a single layer formed utilizing multiple different materials, or a multilayer structure having multiple layers formed utilizing multiple different materials.

The emission layer EML of the organic electroluminescence device 10 of an embodiment may include the fused polycyclic compound of an embodiment.

The fused polycyclic compound of the present disclosure includes: a nitrogen atom at which a first phenyl group, a second phenyl group, and a third phenyl group are substituted; a first silicon atom connecting the first phenyl group and the second phenyl group; and a second silicon atom connecting the second phenyl group and the third phenyl group. A fourth phenyl group and a fifth phenyl group are each connected with the first silicon atom, and a sixth phenyl group and a seventh phenyl group are each connected with the second silicon atom.

A nitrogen-containing substituent may be substituted in (on) at least one selected from the first to seventh phenyl groups. For example, at least one phenyl group selected from the first to seventh phenyl groups may be an unsubstituted phenyl group. For example, the nitrogen-containing substituent may be substituted in one, two or three phenyl groups selected from the first to seventh phenyl groups. In an embodiment, the nitrogen-containing substituent may be a substituted or unsubstituted diphenylamine group, or a substituted or unsubstituted carbazole group.

The emission layer EML of the organic electroluminescence device ED of an embodiment may include a fused polycyclic compound of an embodiment, as represented by Formula 1:

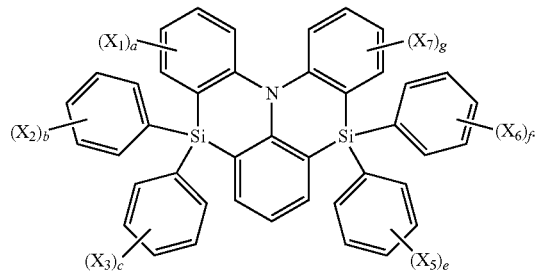

Formula 1

In Formula 1, $X_1$ to $X_7$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, a substituted or unsubstituted heteroaryl group of 2 to 30 ring-forming carbon atoms, or represented by Formula 2. For example, $X_1$ to $X_7$ may each independently be a hydrogen atom or represented by Formula 2. For example, at least one selected from $X_1$ to $X_7$ may be represented by Formula 2. For example, one, two or three selected from $X_1$ to $X_7$ may be represented by Formula 2.

In Formula 1, "a" may be an integer of 0 to 4. For example, "a" may be 0 or 1. In an embodiment, a case where "a" is 0 may have the same structure as a case where $X_1$ is a hydrogen atom.

"b" and "c" may each independently be an integer of 0 to 5. For example, each of "b" and "c" may be 0 or 1. In an embodiment, a case where "b" is 0 may have the same structure as a case where $X_2$ is a hydrogen atom. In an embodiment, a case where "c" is 0 may have the same structure as a case where $X_3$ is a hydrogen atom.

"d" may be an integer of 0 to 3. For example, "d" may be 0 or 1. In an embodiment, a case where "d" is 0 may have the same structure as a case where $X_4$ is a hydrogen atom.

"e" and "f" may each independently be an integer of 0 to 5. For example, each of "e" and "f" may be 0 or 1. In an embodiment, a case where "e" is 0 may have the same structure as a case where $X_5$ is a hydrogen atom. In an embodiment, a case where "f" is 0 may have the same structure as a case where $X_6$ is a hydrogen atom.

"g" may be an integer of 0 to 4. For example, "g" may be 0 or 1. In an embodiment, a case where "g" is 0 may have the same structure as a case where $X_7$ is a hydrogen atom.

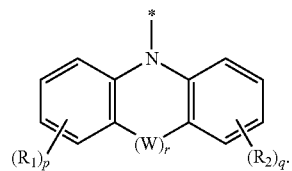

Formula 2

In Formula 2, $R_1$ and $R_2$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

For example, $R_1$ and $R_2$ may each independently be a hydrogen atom, a substituted or unsubstituted silyl group, a substituted or unsubstituted alkyl group of 1 to 30 carbon atoms, or a substituted or unsubstituted heteroaryl group of 2 to 30 ring-forming carbon atoms. For example, $R_1$ and $R_2$ may be a silyl group substituted with a phenyl group, for example, a triphenylsilyl group. For example, $R_1$ and $R_2$ may be a methyl group or a t-butyl group. For example, $R_1$ and $R_2$ may be an unsubstituted carbazole group, for example, an unsubstituted carbazole group, a carbazole group substituted with a methyl group, or a carbazole group substituted with a t-butyl group.

"p" and "q" may each independently be an integer of 0 to 4. For example, each of "p" and "q" may be 0 or 1. In an embodiment, a case where "p" is 0 may have the same structure as a case where $R_1$ is a hydrogen atom. In an embodiment, a case where "q" is 0 may have the same structure as a case where $R_6$ is a hydrogen atom.

"W" may be a direct linkage, and "r" may be 0 or 1. Formula 2 may represent the nitrogen-containing substituent. In an embodiment, when "r" is 0, Formula 2 may represent a substituted or unsubstituted diphenylamine. When "r" is 1, Formula 2 may represent a substituted or unsubstituted carbazole group.

In an embodiment, the fused polycyclic compound represented by Formula 1 may be represented by any one selected from Formula 1-1a to Formula 1-1c:

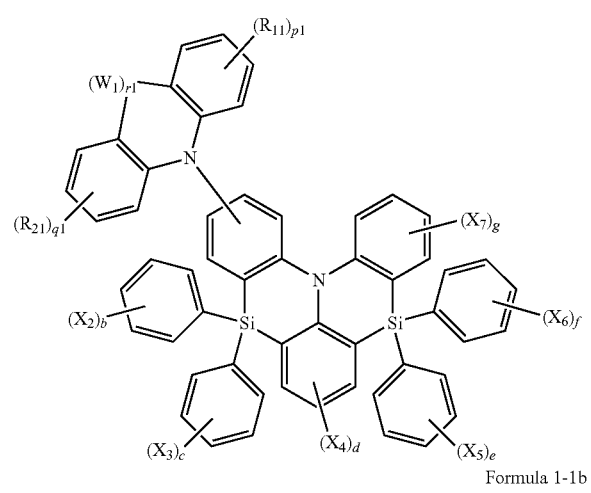

Formula 1-1a

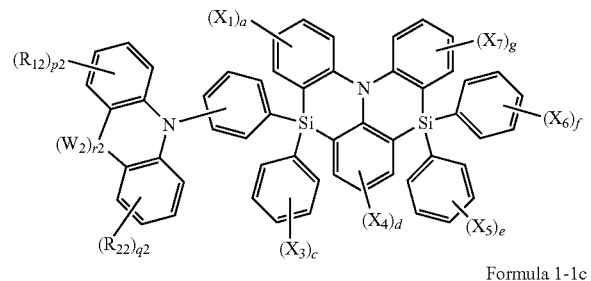

Formula 1-1b

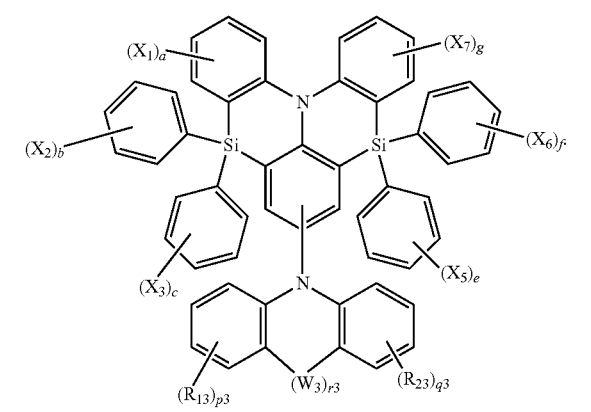

Formula 1-1c

Formula 1-1a is an embodiment of a case where $X_1$ (among $X_1$ to $X_7$) is Formula 2, and "a" is 1.

Formula 1-1b is an embodiment of a case where $X_2$ (among $X_1$ to $X_7$) is Formula 2, and "b" is 1.

Formula 1-1c is an embodiment of a case where $X_4$ (among $X_1$ to $X_7$) is Formula 2, and "d" is 1.

In Formula 1-1a to Formula 1-1c, $R_{11}$, $R_{12}$, $R_{13}$, $R_{21}$, $R_{22}$, and $R_{23}$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

For example, $R_{11}$, $R_{12}$, $R_{13}$, $R_{21}$, $R_{22}$, and $R_{23}$ may each independently be a hydrogen atom, a substituted or unsubstituted silyl group, a substituted or unsubstituted alkyl group of 1 to 30 carbon atoms, or a substituted or unsubstituted heteroaryl group of 2 to 30 ring-forming carbon atoms. For example, $R_{11}$, $R_{12}$, $R_{13}$, $R_{21}$, $R_{22}$, and $R_{23}$ may each independently be a silyl group substituted with a phenyl group, for example, a triphenylsilyl group. For example, $R_{11}$, $R_{12}$, $R_{13}$, $R_{21}$, $R_{22}$, and $R_{23}$ may each independently be a methyl group or a t-butyl group. For example, $R_{11}$, $R_{12}$, $R_{13}$, $R_{21}$, $R_{22}$, and $R_{23}$ may each independently be a substituted or unsubstituted carbazole group, for example, an unsubstituted carbazole group, a carbazole group substituted with a methyl group, or a carbazole group substituted with a t-butyl group.

p1, p2, p3, q1, q2, and q3 may each independently be an integer of 0 to 5. For example, p1, p2, p3, q1, q2, and q3 may each independently be 0 or 1.

Each of $W_1$, $W_2$, and $W_3$ may be a direct linkage.

r1, r2, and r3 may each independently be 0 or 1.

$X_1$ to $X_7$ and "a" to "g" may each independently be the same as defined in Formula 1 and Formula 2.

In an embodiment, the fused polycyclic compound represented by Formula 1 may be represented by any one selected from Formula 1-2a and Formula 1-2b:

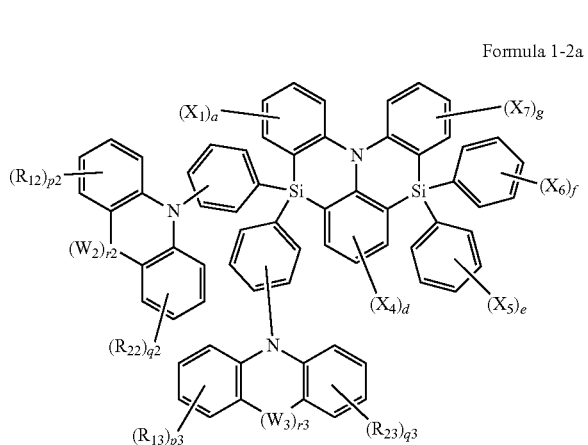

Formula 1-2a

Formula 1-2b

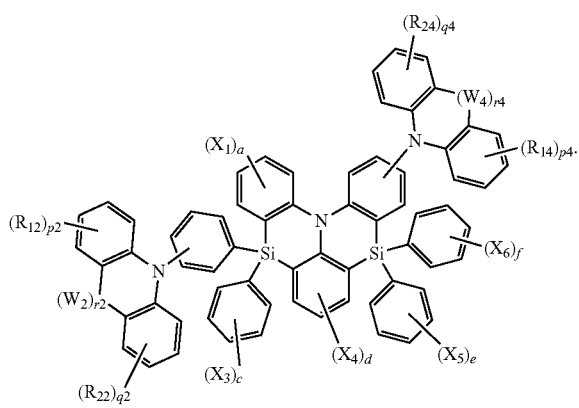

Formula 1-2a is an embodiment of a case where $X_2$ and $X_3$ (among $X_1$ to $X_7$) are Formula 2, and each of "b" and "c" is 1.

Formula 1-2b is an embodiment of a case where $X_2$ and $X_7$ (among $X_1$ to $X_7$) are Formula 2, and each of "b" and "g" is 1.

In Formula 1-2a and Formula 1-2b, $R_{14}$ and $R_{24}$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. For example, $R_{14}$ and $R_{24}$ may each independently be a hydrogen atom, a substituted or unsubstituted silyl group, a substituted or unsubstituted alkyl group of 1 to 30 carbon atoms, or a substituted or unsubstituted heteroaryl group of 2 to 30 ring-forming carbon atoms. In some embodiments, the substituted or unsubstituted silyl group may be a silyl group substituted with a phenyl group, for example, a triphenylsilyl group. In some embodiments, the substituted or unsubstituted alkyl group of 1 to 30 carbon atoms may be a methyl group or a t-butyl group. In some embodiments, the substituted or unsubstituted heteroaryl group of 2 to 30 ring-forming carbon atoms may be a substituted or unsubstituted carbazole group, for example, a carbazole group substituted with a methyl group, or a carbazole group substituted with a t-butyl group.

p4 and q4 may each independently be an integer of 0 to 5. For example, p4 and q4 may each independently be 0 or 1.

$W_4$ may be a direct linkage, and r4 may be 0 or 1.

$X_1$, $X_3$ to $X_7$, $R_{12}$, $R_{13}$, $R_{22}$, $R_{23}$, p2, p3, q2, q3, $W_2$, $W_3$, r2, r3, "a", and "c" to "g" may each independently be the same as defined in Formula 1, Formula 2, and Formula 1-1a to Formula 1-1c.

In an embodiment, the fused polycyclic compound represented by Formula 1 may be represented by Formula 1-3:

Formula 1-3

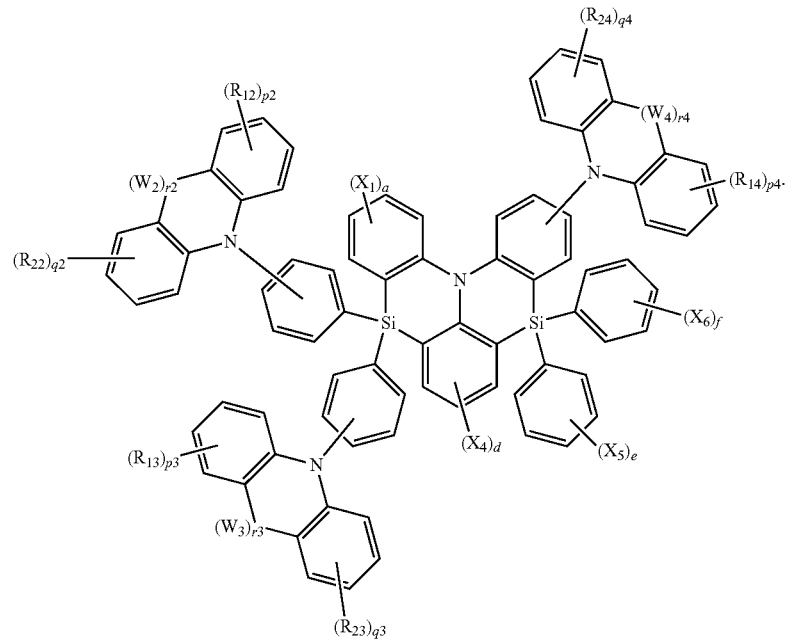

Formula 1-3 is an embodiment (structure) of a case where $X_2$, $X_3$ and $X_7$ (among $X_1$ to $X_7$) are Formula 2, and each of "b", "c" and "g" is 1.

$X_1$, $X_4$ to $X_6$, $R_{12}$, $R_{13}$, $R_{14}$, $R_{22}$, $R_{23}$, $R_{24}$, p2, p3, p4, q2, q3, q4, $W_2$, $W_3$, $W_4$, r2, r3, r4, "a", and "d" to "f" may each independently be the same as defined in Formula 1, Formula 2, Formula 1-1a to Formula 1-1c, Formula 1-2a, and Formula 1-2b.

Formula 1-1a to Formula 1-1c, Formula 1-2a, Formula 1-2b, and Formula 1-3 are embodiments of cases in which one, two or three of $X_1$ to $X_7$ are Formula 2, but embodiments of the present disclosure are not limited thereto. For example, four, five, six, or seven of $X_1$ to $X_7$ may be Formula 2.

In an embodiment, the fused polycyclic compound represented by Formula 1 may be represented by any one selected from Formula 1-4a to Formula 1-4d:

Formula 1-4a

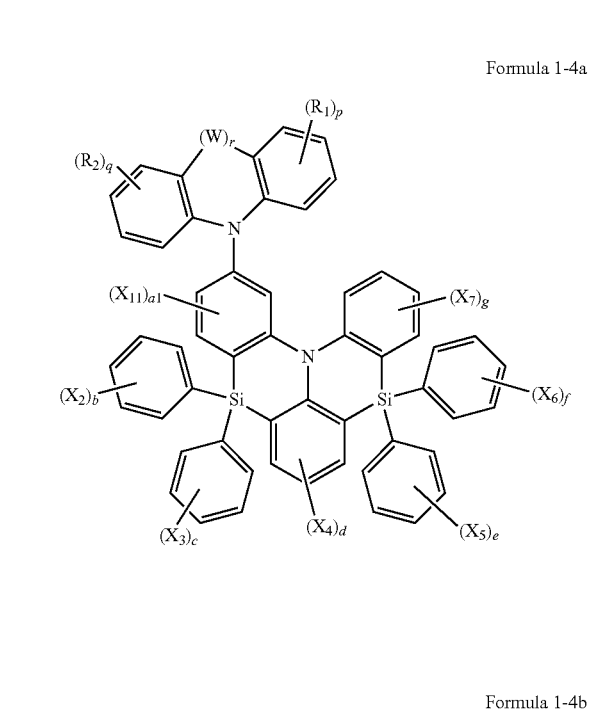

Formula 1-4b

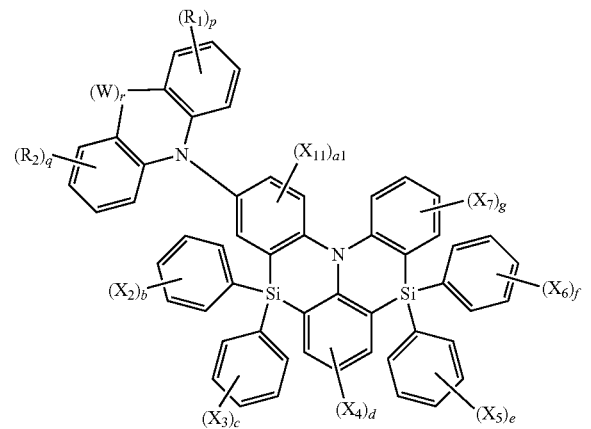

Formula 1-4c

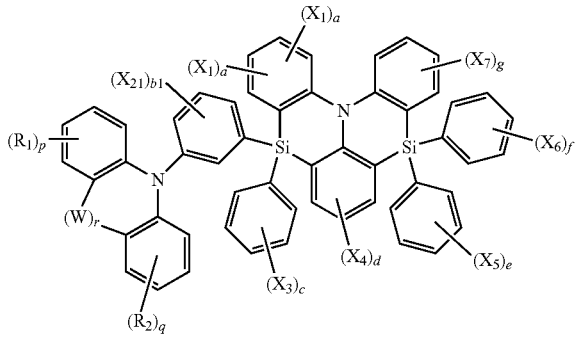

Formula 1-4d

Formula 1-4a to Formula 1-4d are embodiments in which the position of the substituent represented by Formula 2 on the fused polycyclic compound represented by Formula 1 is specified.

Formula 1-4a and Formula 1-4b are embodiments of Formula 1-1a in which the position of the substituent represented by Formula 2 on the fused polycyclic compound represented by Formula 1 is embodied is specified.

For example, Formula 1-4a corresponds to a case where the nitrogen atom in Formula 2 is connected at a meta position with respect to the nitrogen atom in Formula 1. Formula 1-4b corresponds to a case where the nitrogen atom in Formula 2 is connected at a para position with respect to the nitrogen atom in Formula 1.

Formula 1-4c is an embodiment of Formula 1-1b in which the position of the substituent represented by Formula 2 on the fused polycyclic compound represented by Formula 1 is specified.

For example, Formula 1-4c corresponds to a case where the nitrogen atom in Formula 2 is connected at a meta position with respect to the nitrogen atom in Formula 1.

Formula 1-4d is an embodiment of Formula 1-1c in which the position of the substituent represented by Formula 2 on the fused polycyclic compound represented by Formula 1 is specified.

For example, Formula 1-4d corresponds to a case where the nitrogen atom in Formula 2 is connected at a para position with respect to the nitrogen atom in Formula 1.

In Formula 1-4a to Formula 1-4d, $X_{11}$, $X_{21}$, and $X_{41}$ may each independently be a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, a substituted or unsubstituted heteroaryl group of 2 to 30 ring-forming carbon atoms, or represented by Formula 2.

For example, $X_{11}$, $X_{21}$, and $X_{41}$ may each independently be a hydrogen atom, or represented by Formula 2.

a1 may be an integer of 0 to 3. For example, a1 may be 0.

b1 may be an integer of 0 to 4. For example, b1 may be 0.

d1 may be an integer of 0 to 2. For example, d1 may be 0.

$X_1$ to $X_7$, "a" to "g", $R_1$, $R_2$, W, "p", "q" and "r" may each independently be the same as defined in Formula 1 and Formula 2.

In an embodiment, Formula 2 may be represented by Formula 2-1 or Formula 2-2:

Formula 2-1

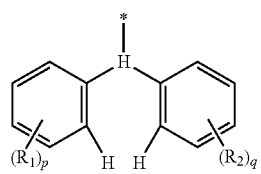

Formula 2-2

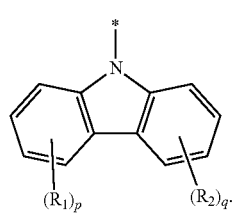

Formula 2-1 is an embodiment of Formula 2 where "r" is 0. Formula 2-1 may be a substituted or unsubstituted diphenylamine.

Formula 2-2 is an embodiment of Formula 2 where W is a direct linkage, and "r" is 1. Formula 2-2 may be a substituted or unsubstituted carbazole group.

$R_1$, $R_2$, "p" and "q" may each independently be the same as defined in Formula 2.

In some embodiments, the fused polycyclic compound represented by Formula 1 may include at least one selected from the compounds represented in Compound Group 1:

Compound Group 1

1

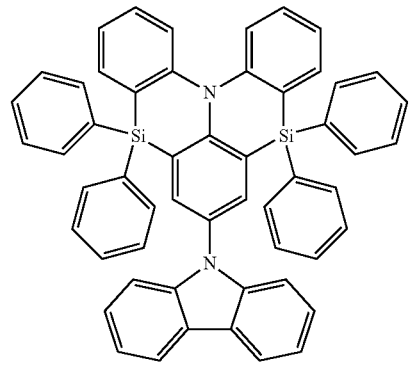

2

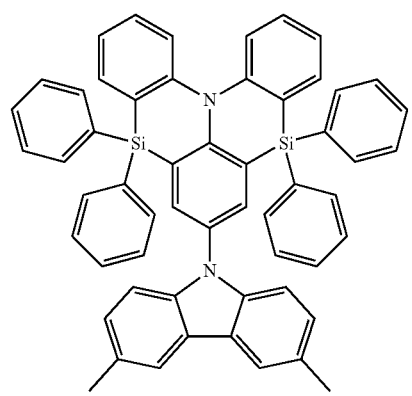

3

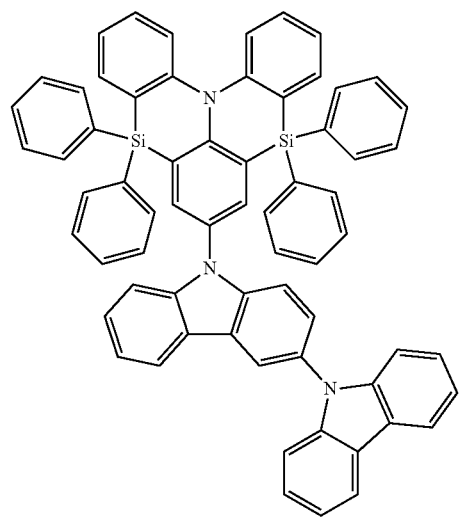

4
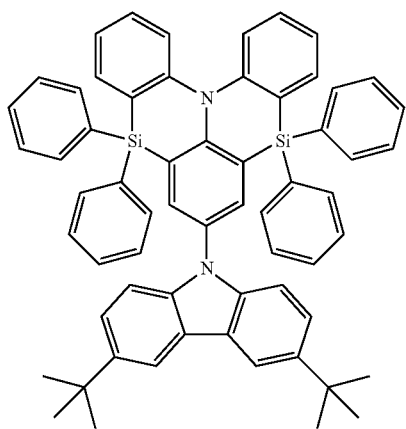
5
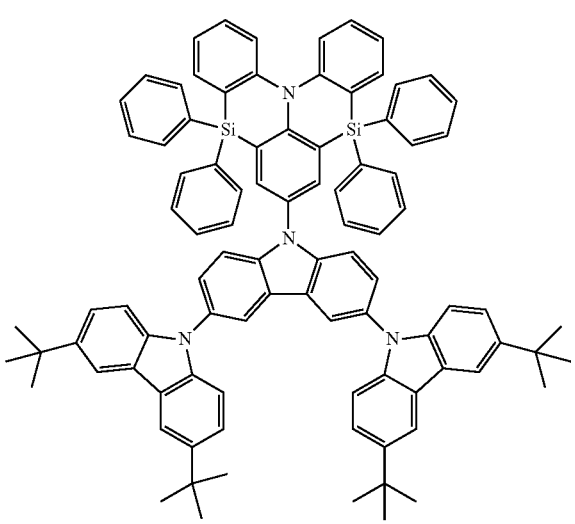
6
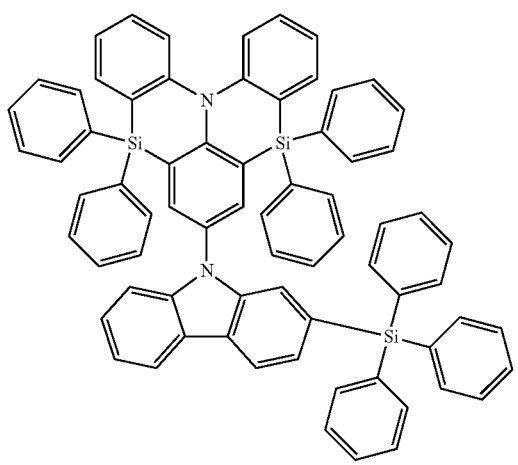
7
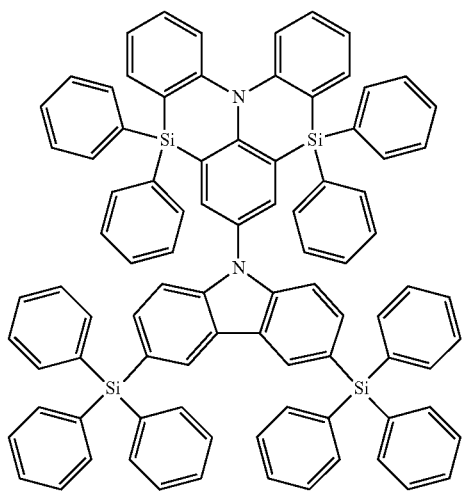
8
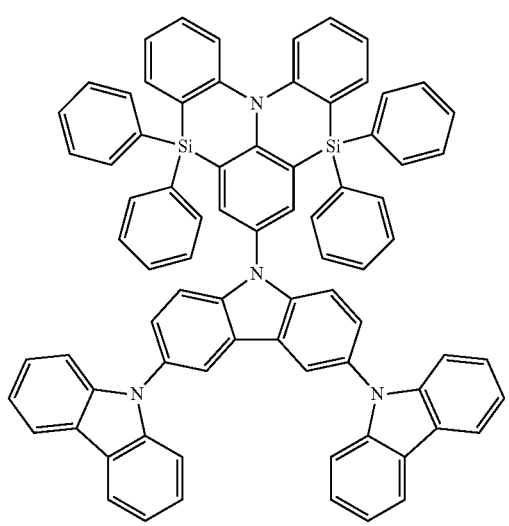
9
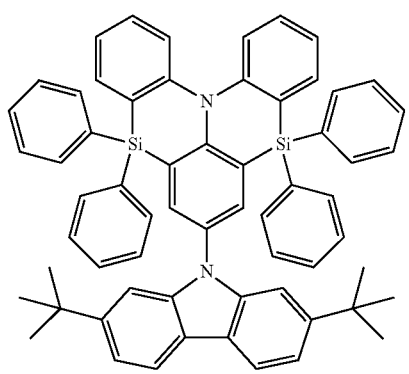

10
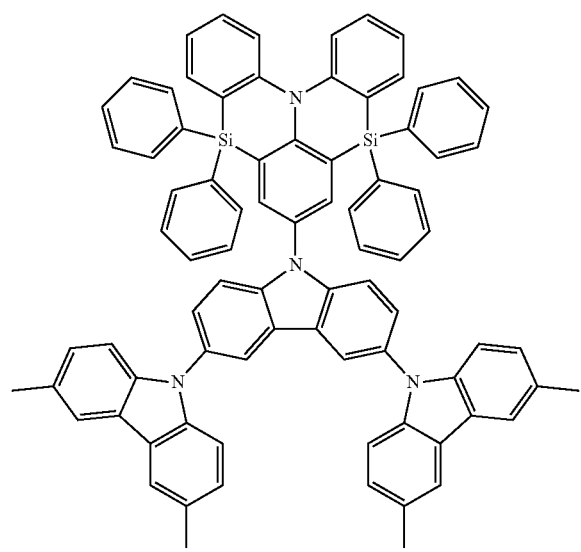
11
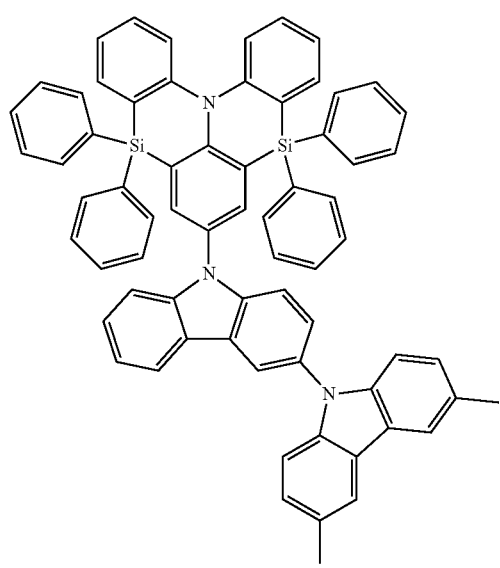
12
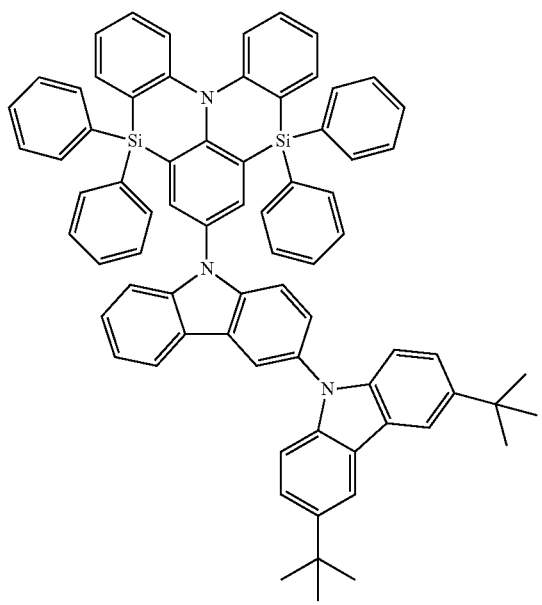
13
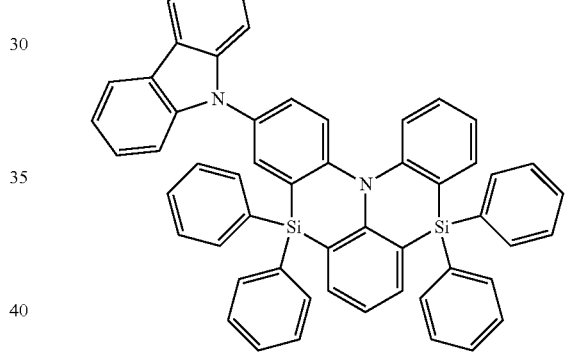
14
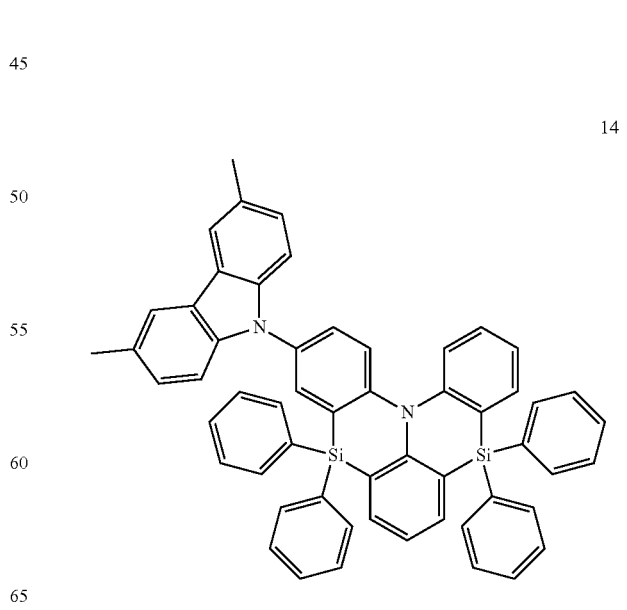

15
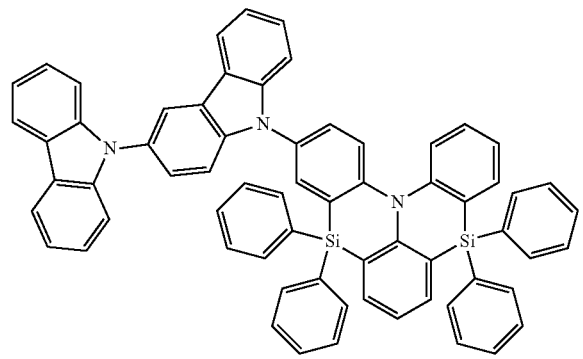
16
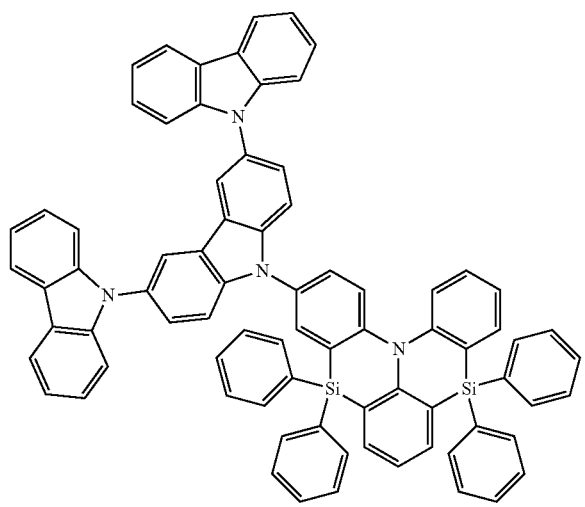
17
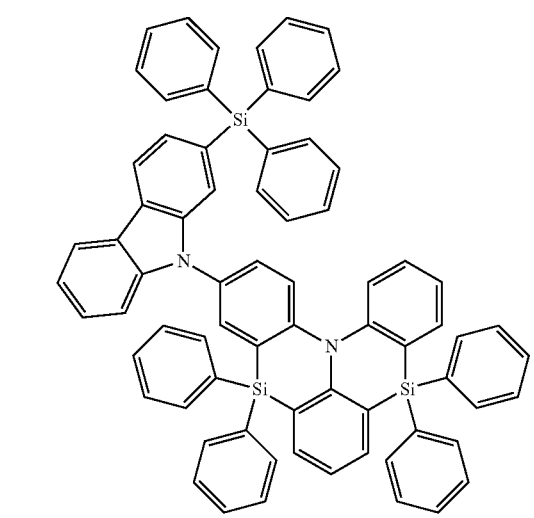
18
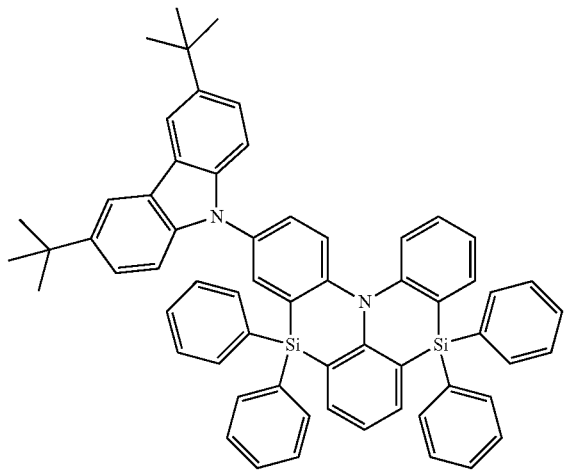
19
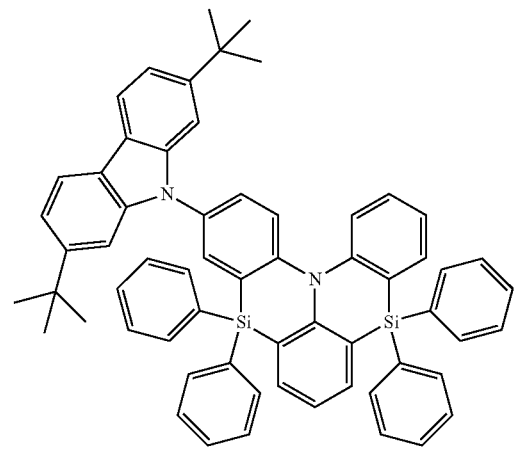
20
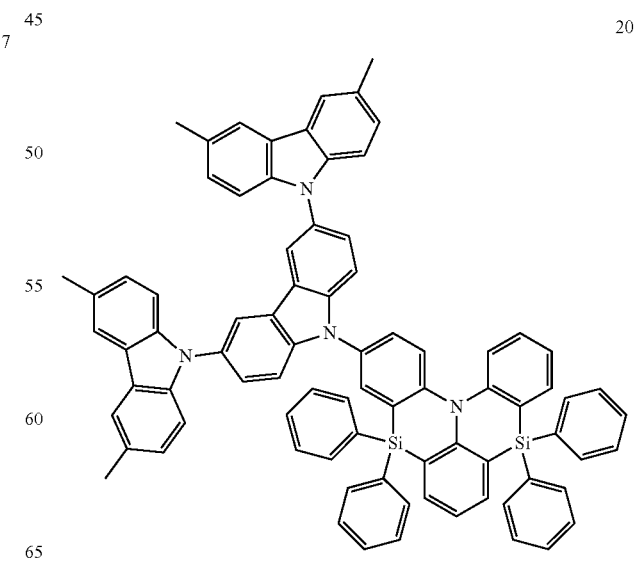

21
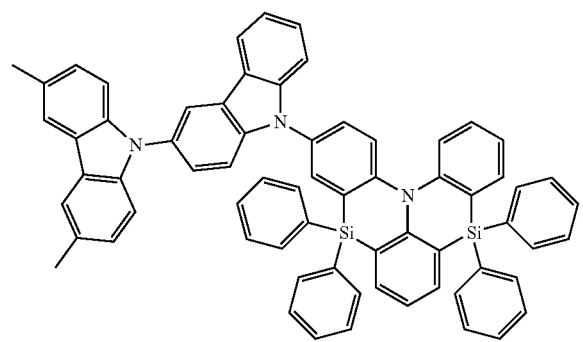
24
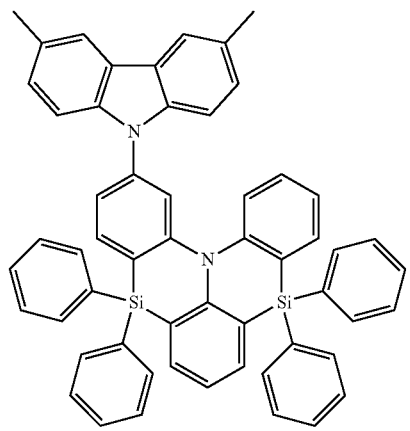
22
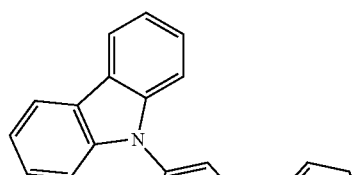
25
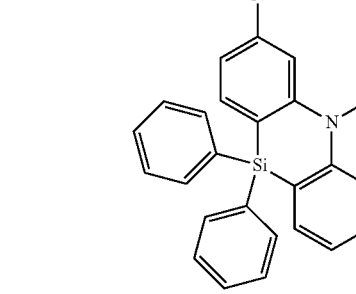
26
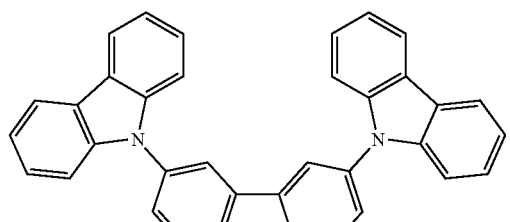
23
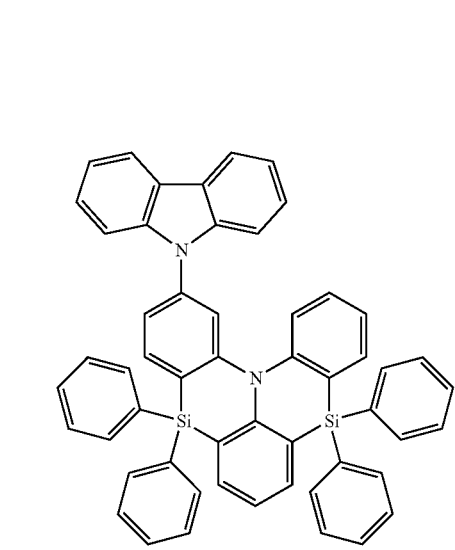

27
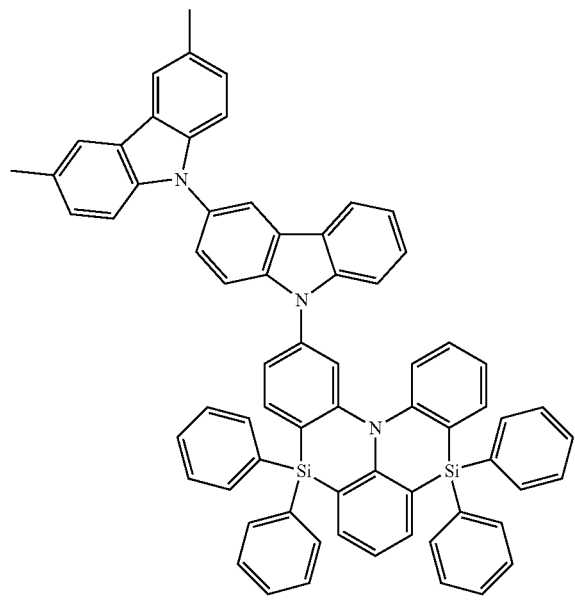
28
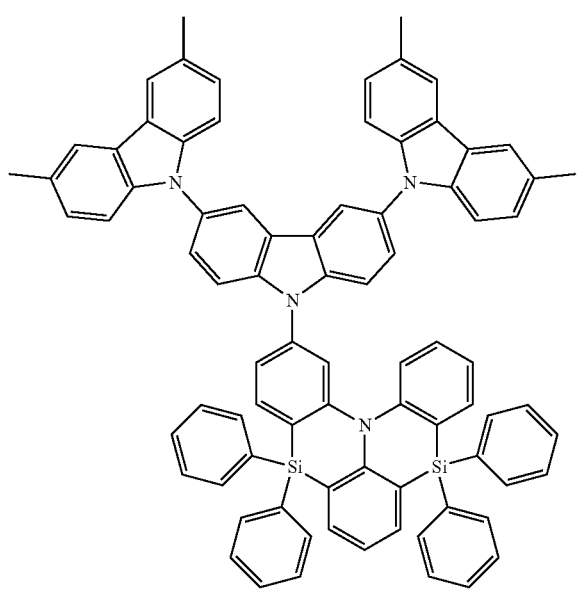
29
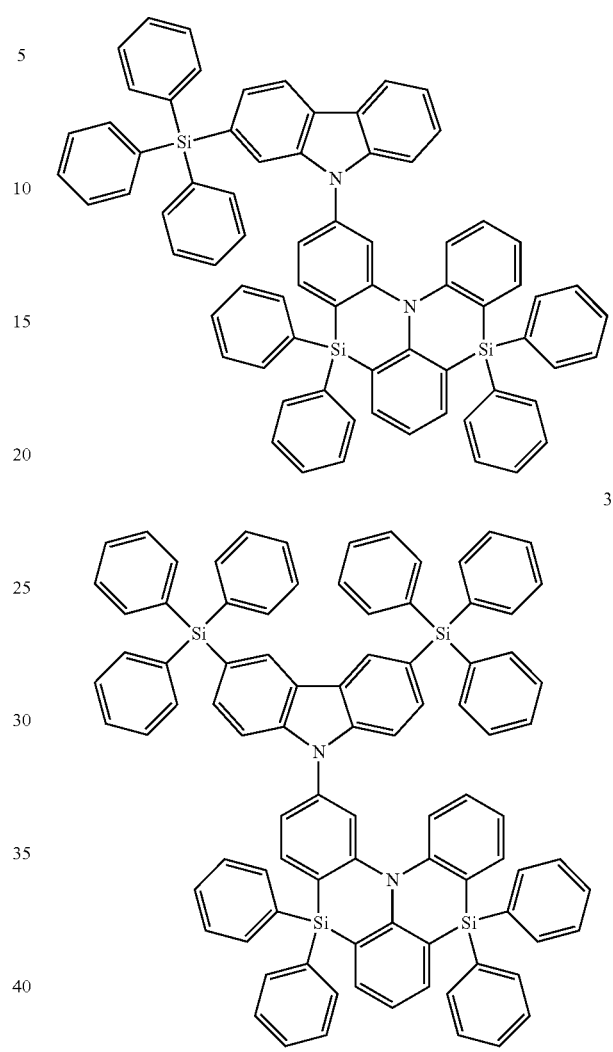
31
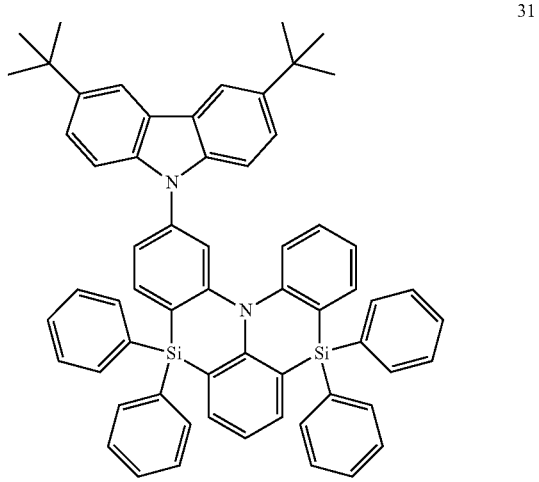

32
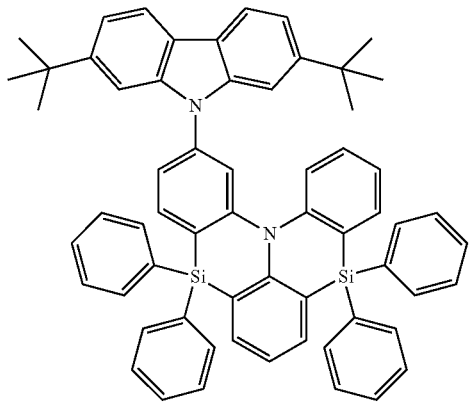
33
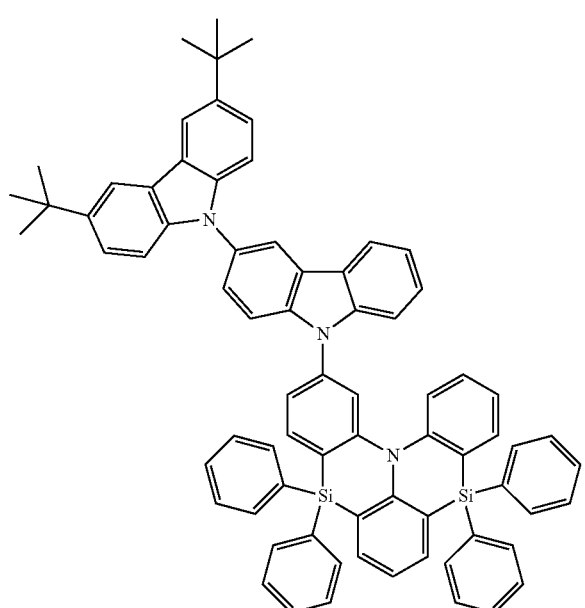
34
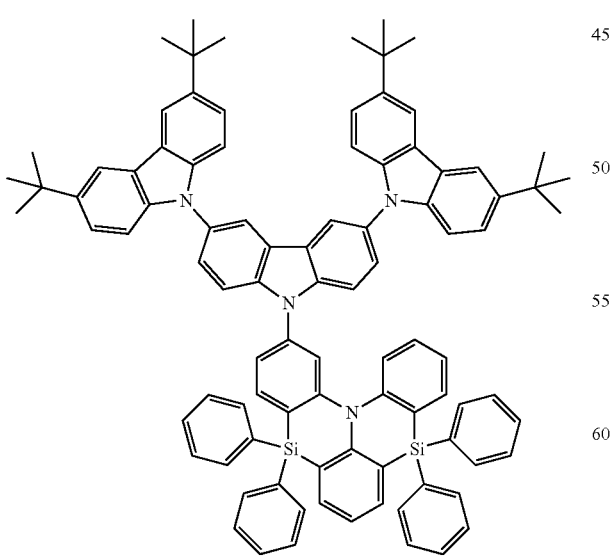
35
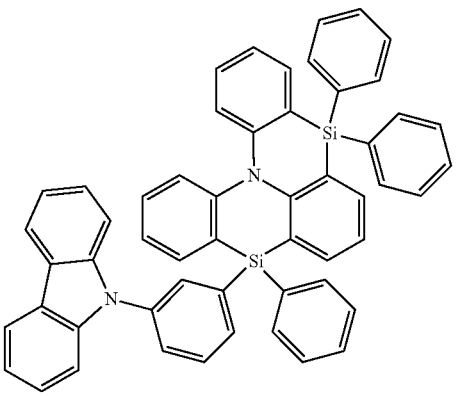
36
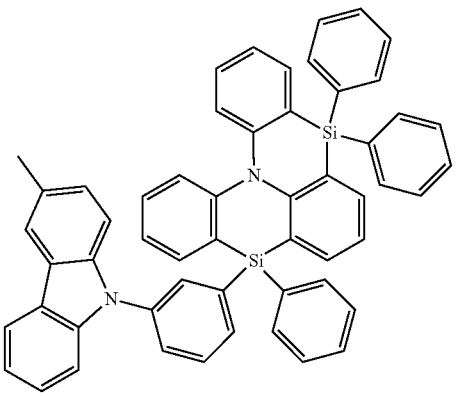
37
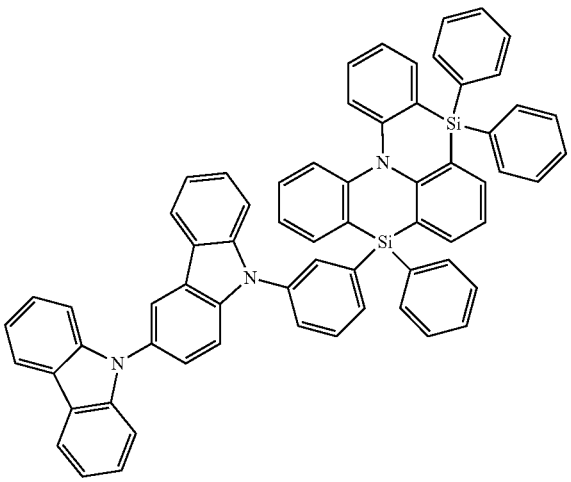

38
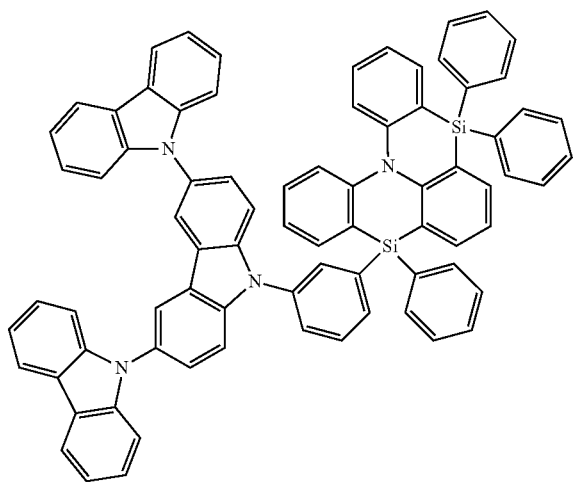
39
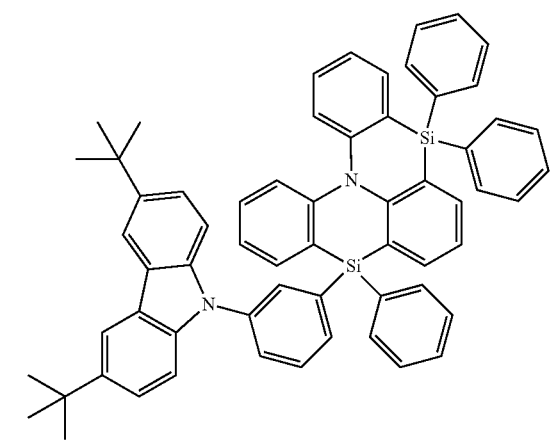
40
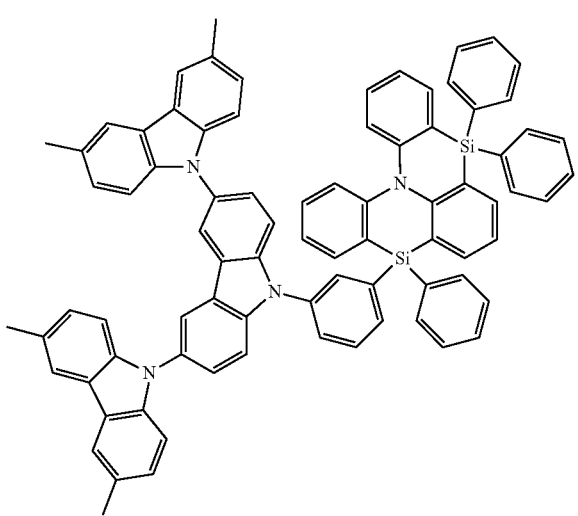
41
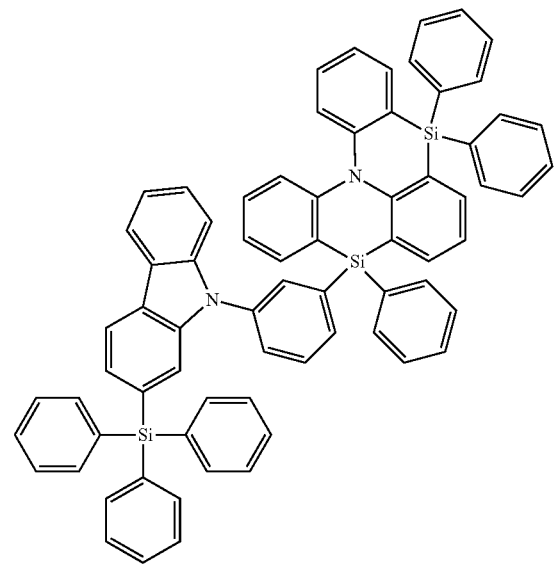
42
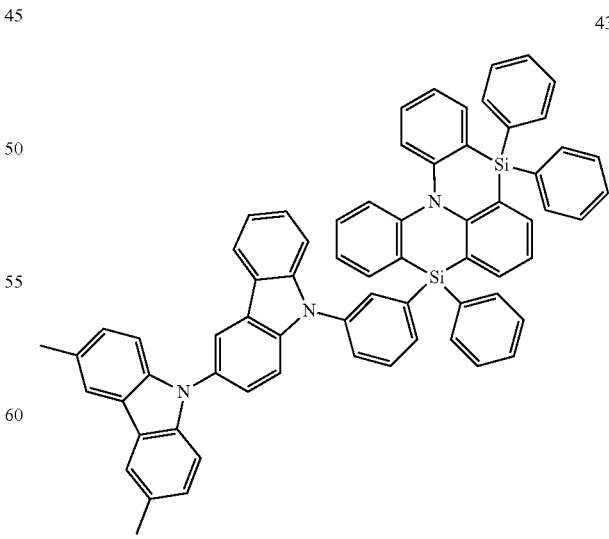
43

44
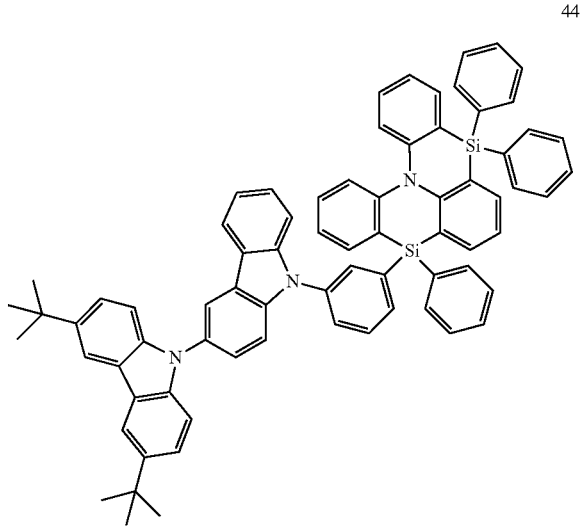
45
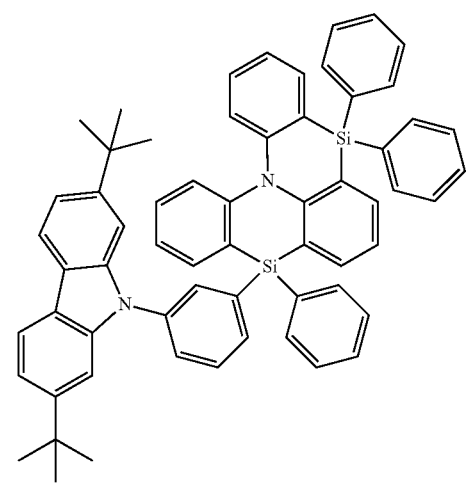
46
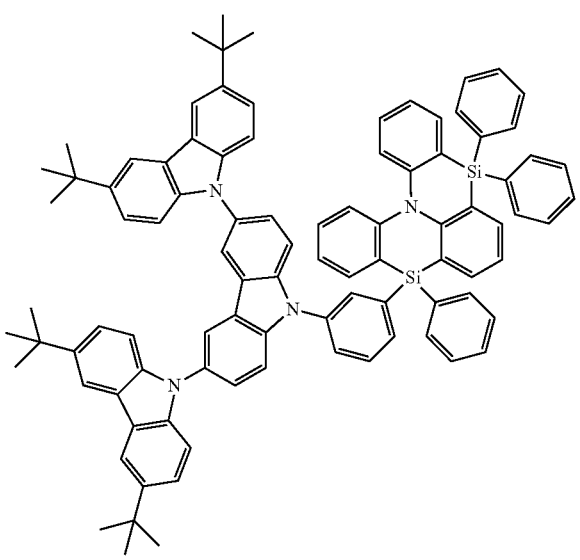
47
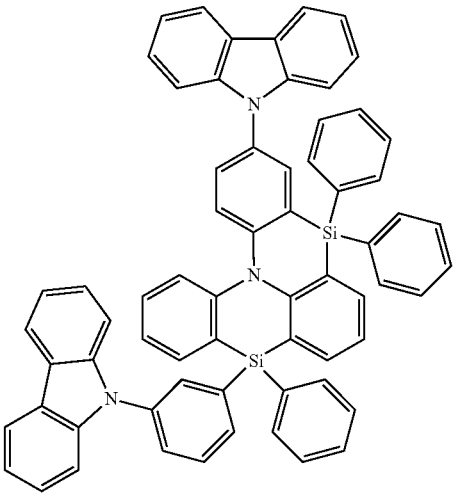
48
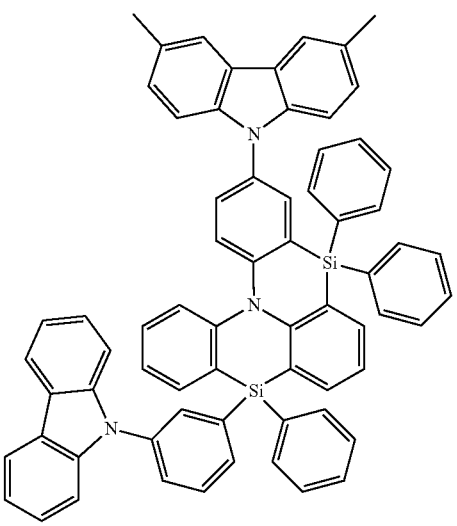
49
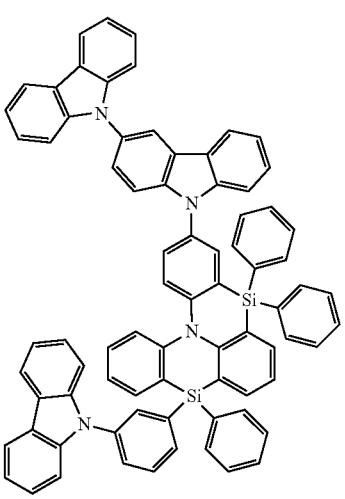

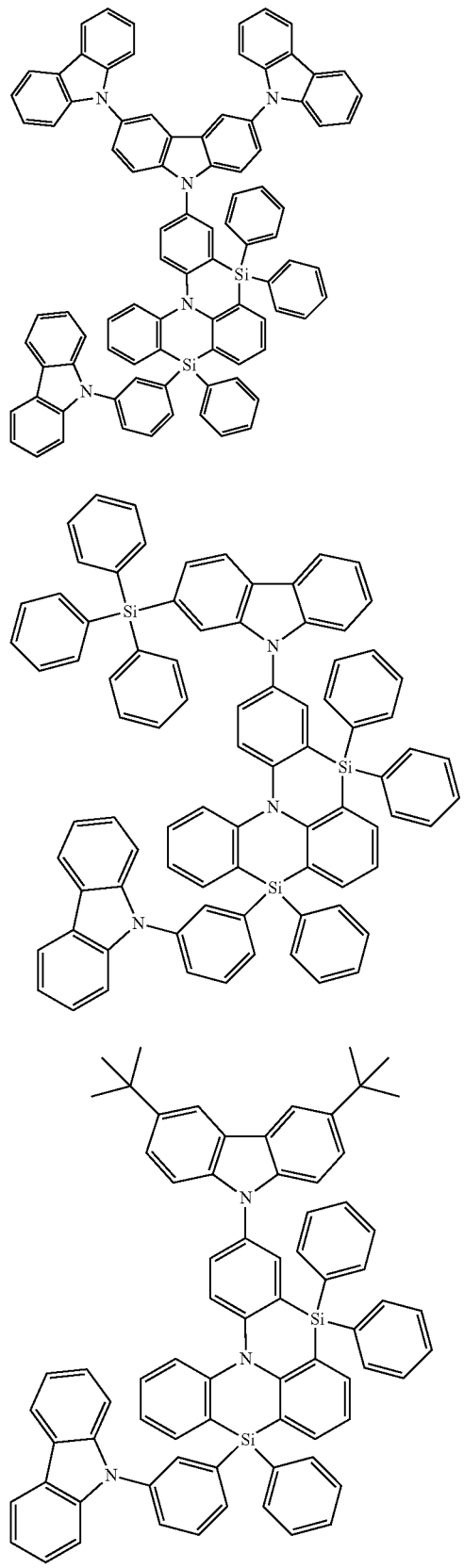
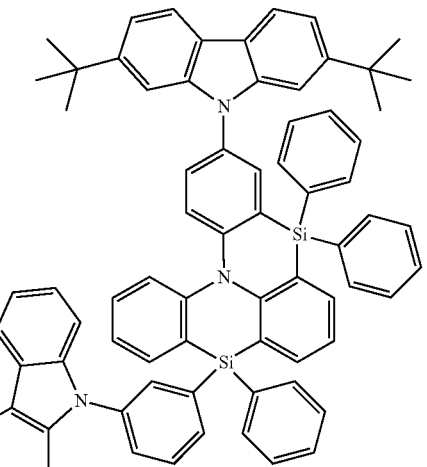
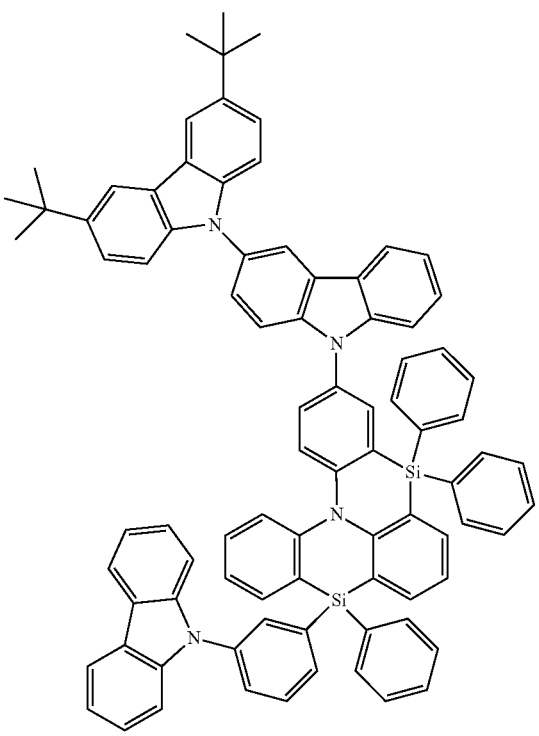

55
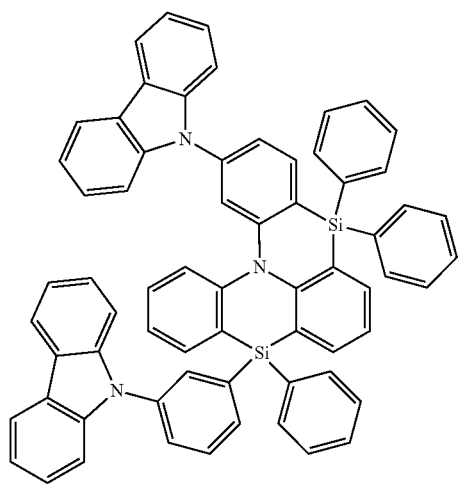
56
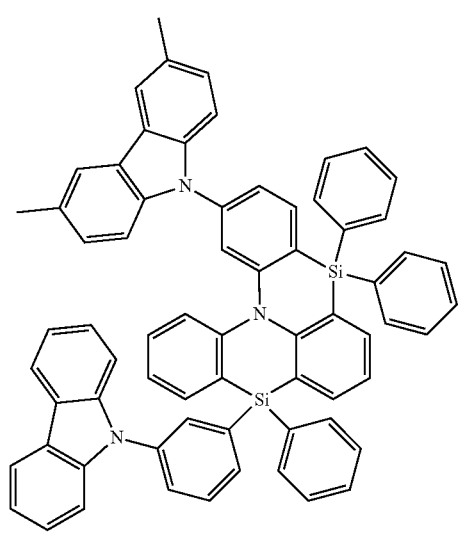
57
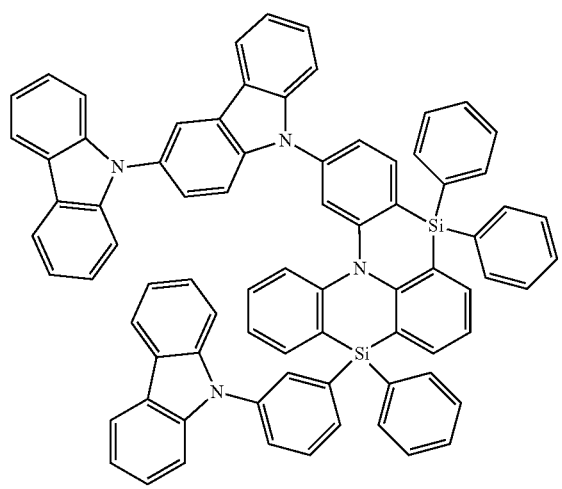
58
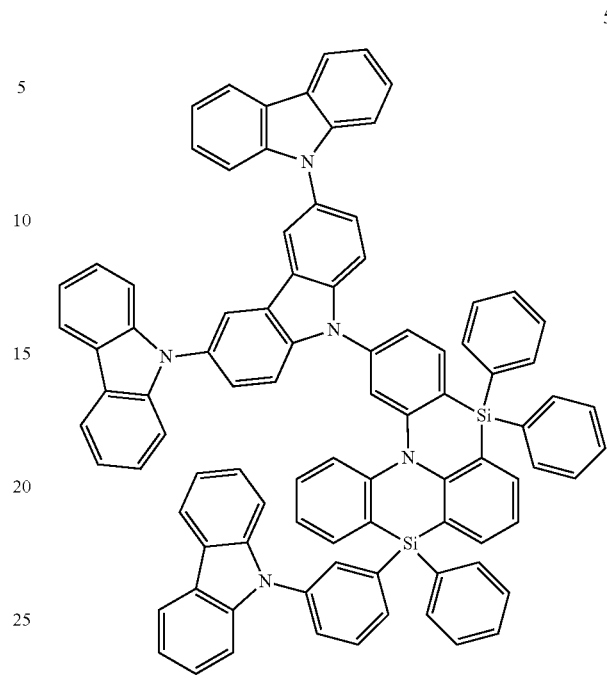
59
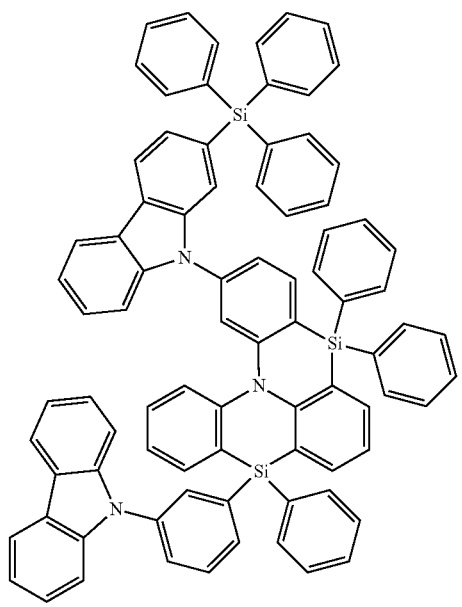

51
-continued
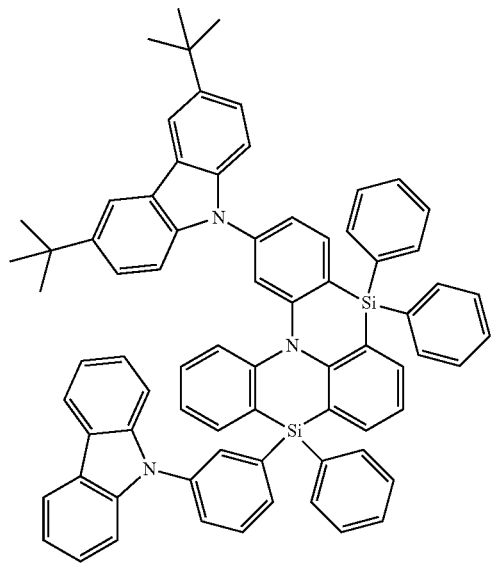
60
52
-continued
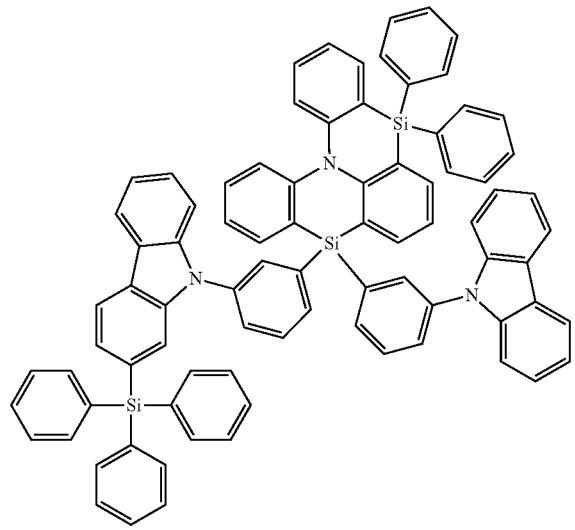
63
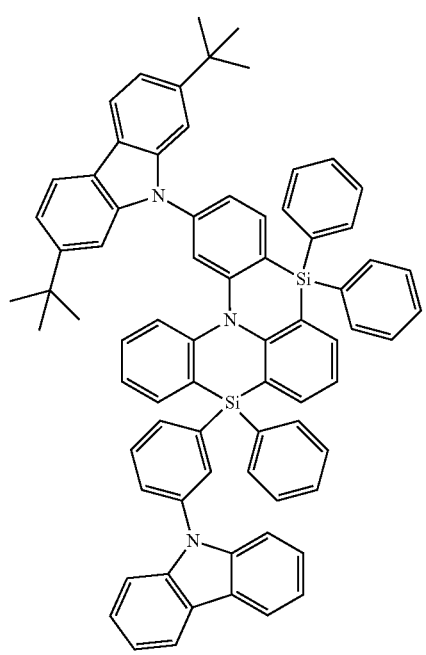
61
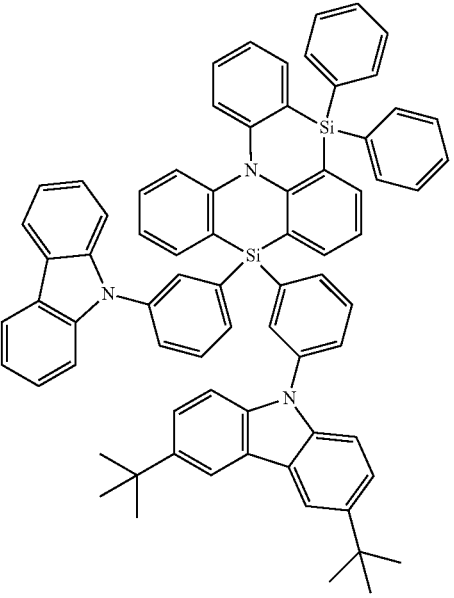
64
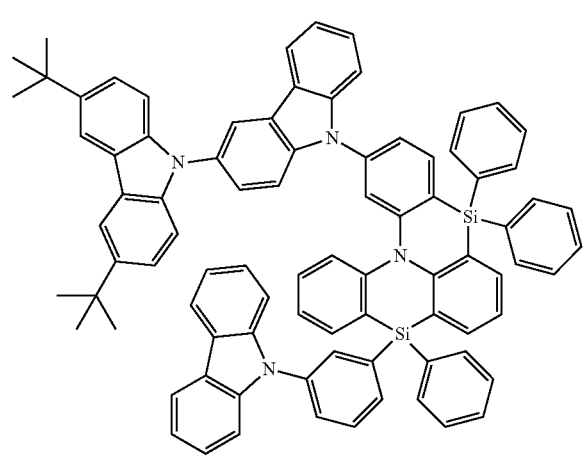
62
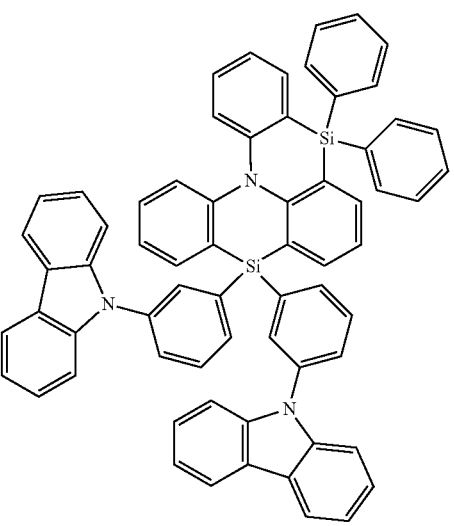
65

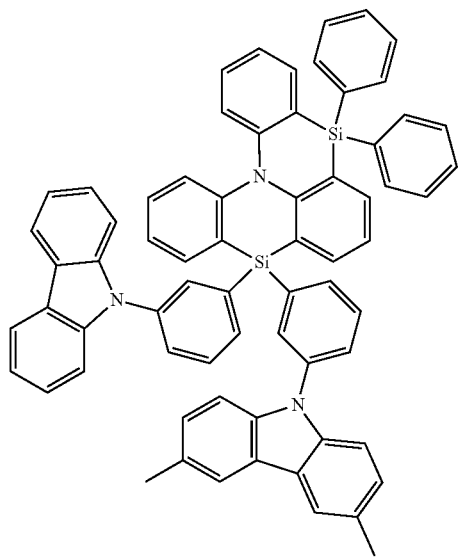
66
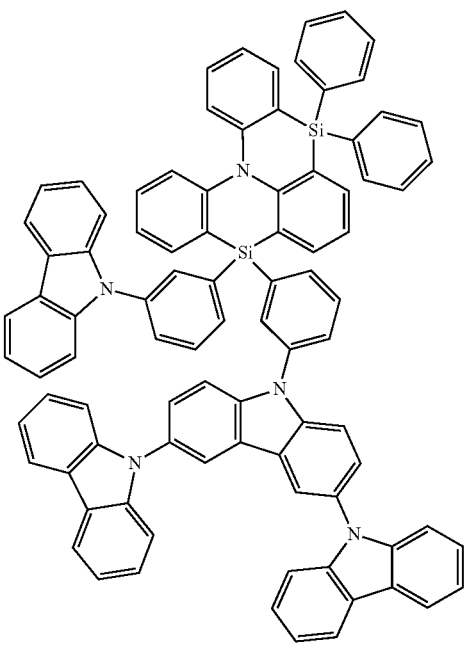
68
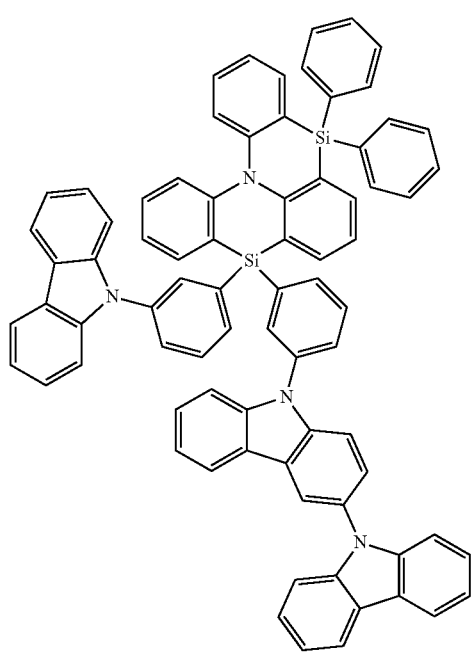
67
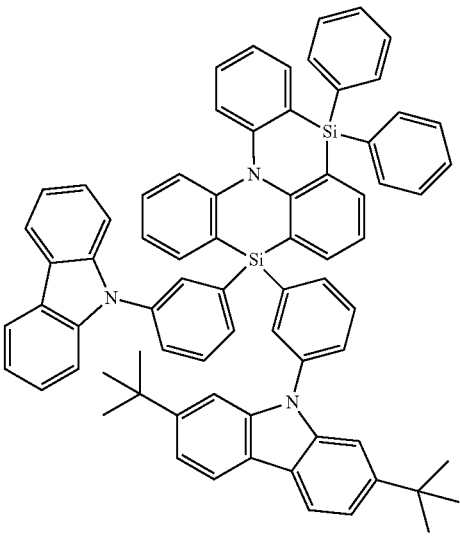
69

70
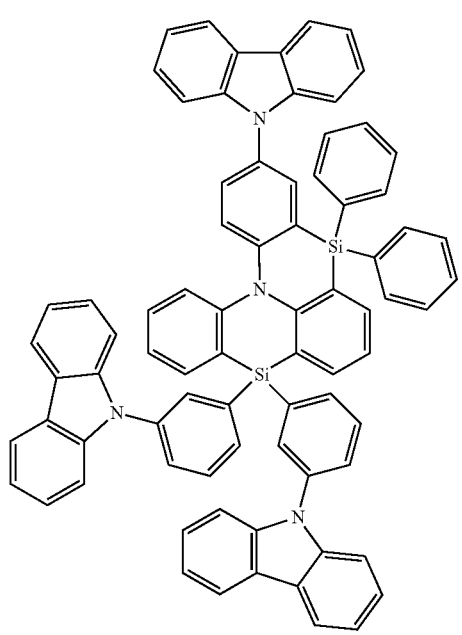
71
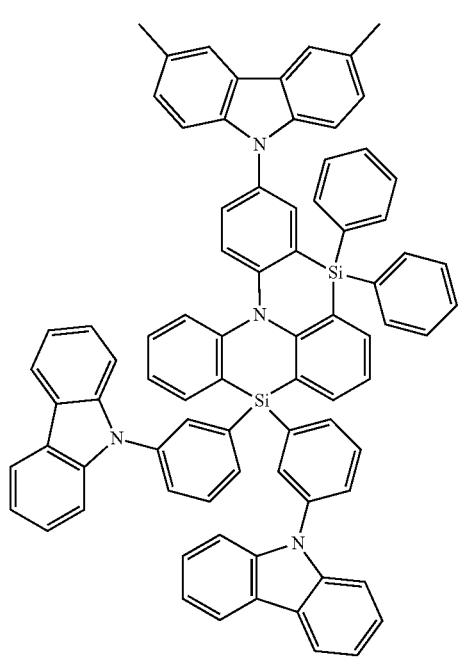
72
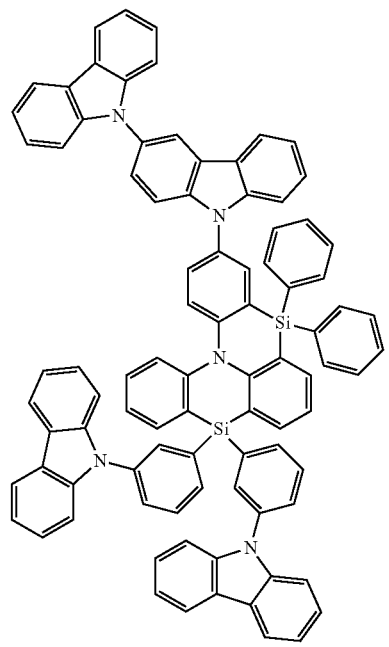
73
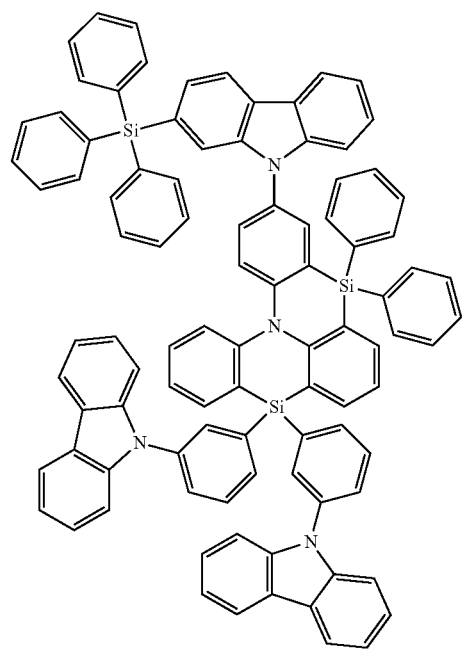

74
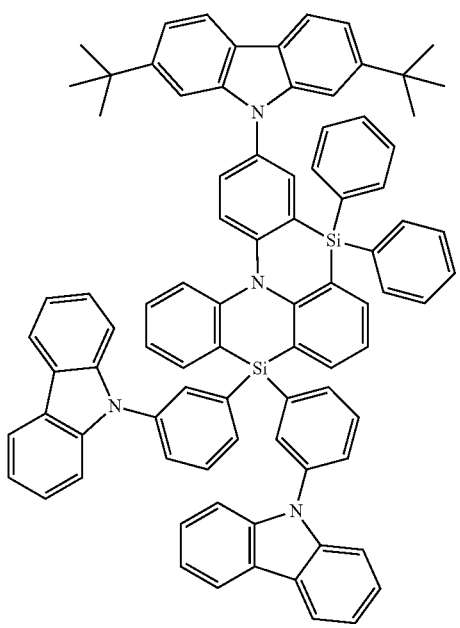
75
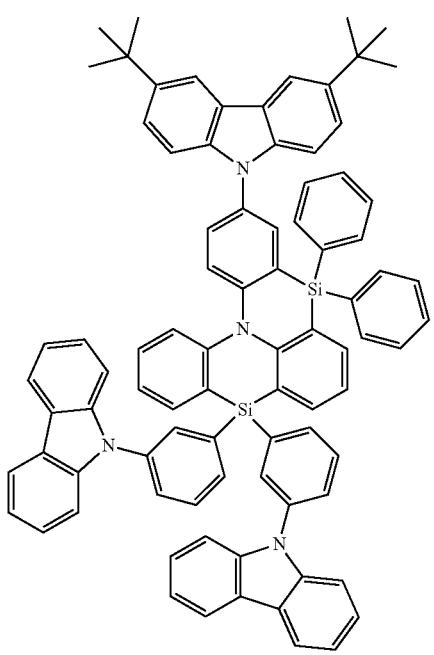
76
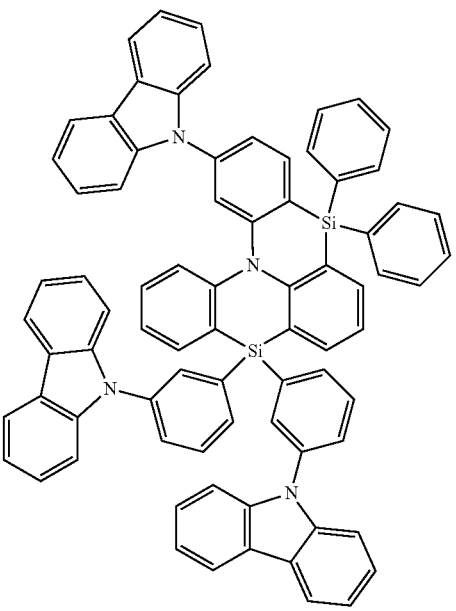
77
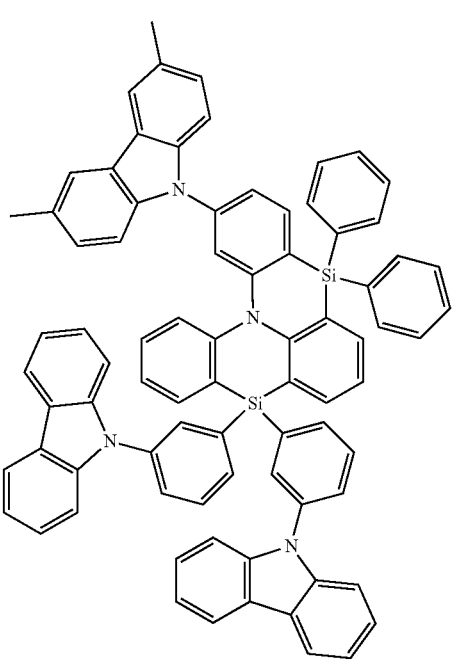

78

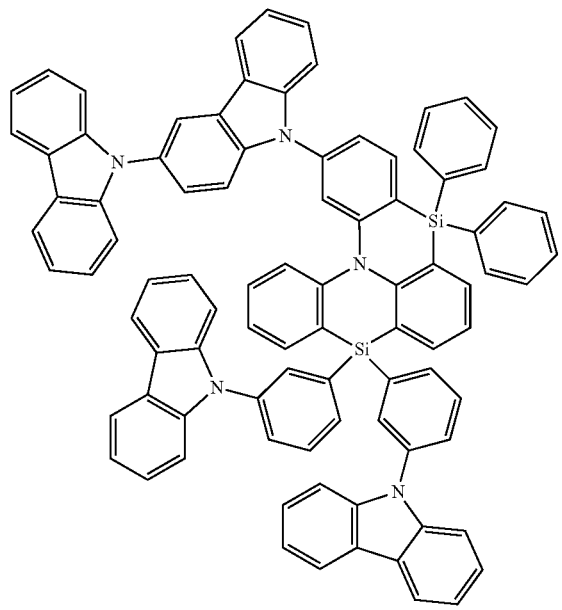

80

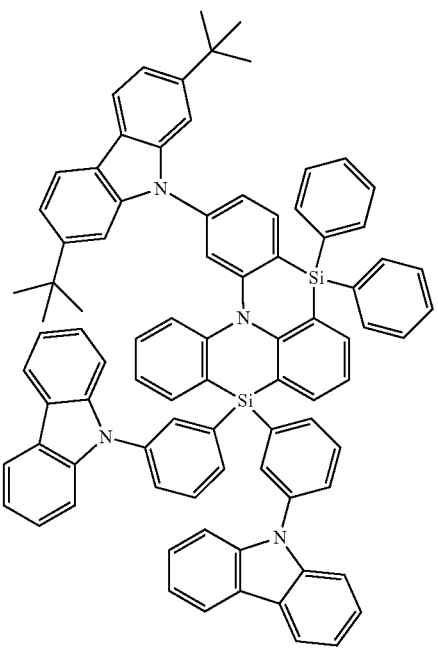

79

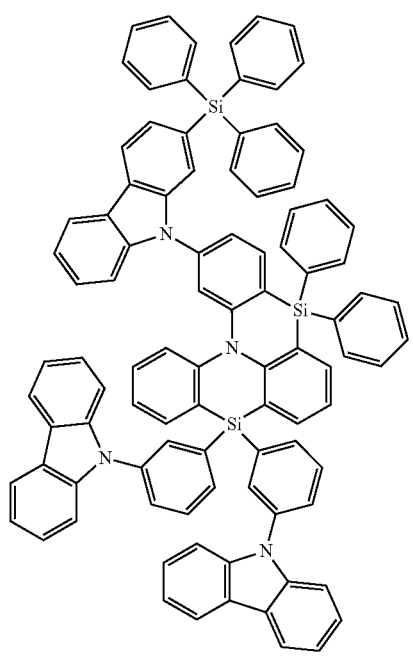

81

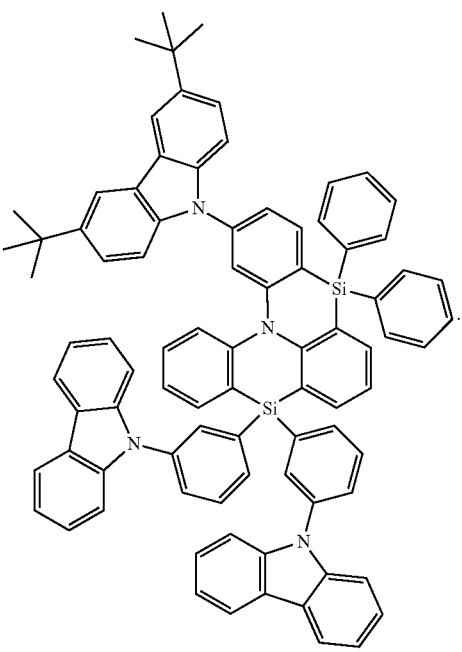

In the organic electroluminescence device ED of an embodiment, the emission layer EML may be to emit phosphorescence or delayed fluorescence. For example, the emission layer EML may be to emit thermally activated delayed fluorescence (TADF).

In the organic electroluminescence device ED of an embodiment, the emission layer EML may be to emit blue light. For example, the emission layer EML may be to emit light having a central wavelength of about 420 nm to about 470 nm.

In light-emitting devices ED of embodiments, shown in FIG. 3 to FIG. 6, an emission layer EML may include a host and a dopant.

In an embodiment, the emission layer EML may include the fused polycyclic compound of an embodiment as a host.

For example, in the organic electroluminescence device ED of an embodiment, the emission layer EML may include a host for emitting phosphorescence and a dopant for emitting phosphorescence, and may include the fused polycyclic compound of an embodiment as a host for emitting phosphorescence. In some embodiments, in the organic electroluminescence device ED of an embodiment, the emission layer EML may include a host to emit delayed fluorescence and a dopant to emit delayed fluorescence, and may include the fused polycyclic compound of an embodiment as a host to emit delayed fluorescence.

In the light-emitting device ED of an embodiment, the emission layer EML may further include any suitable host material. For example, the emission layer EML may include anthracene derivatives, pyrene derivatives, fluoranthene derivatives, chrysene derivatives, dihydrobenzanthracene derivatives, and/or triphenylene derivatives. For example, the emission layer EML may include anthracene derivatives and/or pyrene derivatives.

The emission layer EML may include a compound represented by Formula E-1. The compound represented by Formula E-1 may be used as a fluorescence host material.

Formula E-1

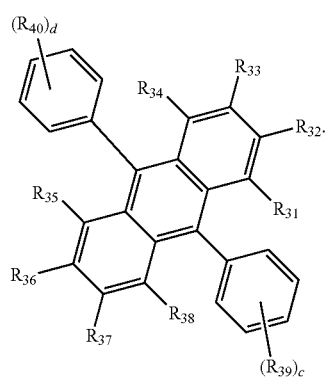

In Formula E-1, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In some embodiments, $R_{31}$ to $R_{40}$ may be combined with an adjacent group to form a saturated hydrocarbon ring or unsaturated hydrocarbon ring.

In Formula E-1, "c" and "d" may each independently be an integer of 0 to 5.

The compound represented by Formula E-1 may be any one represented by Compound E1 to Compound E16:

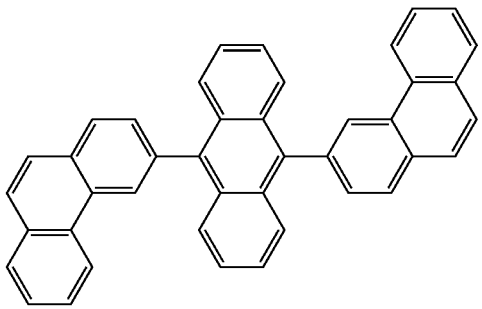

E1

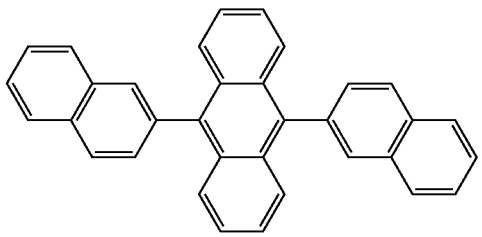

E2

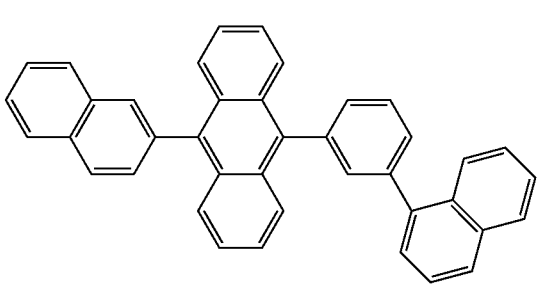

E3

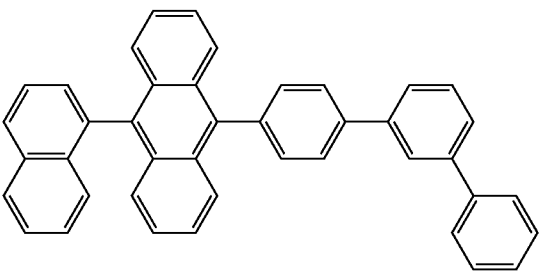

E4

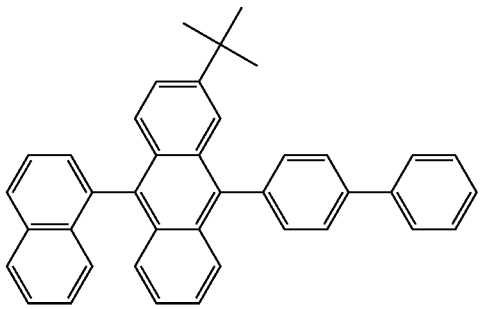

E5

E6
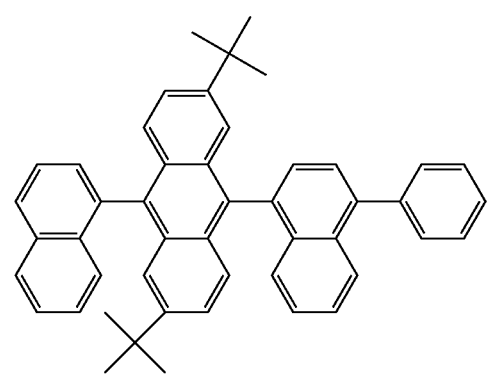
E7
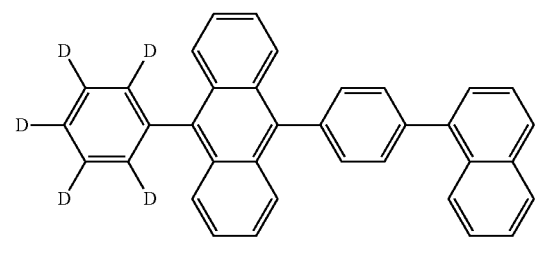
E8
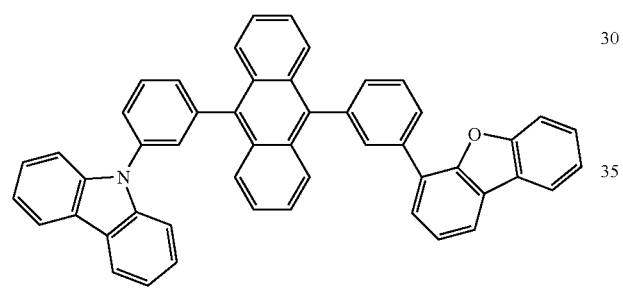
E9
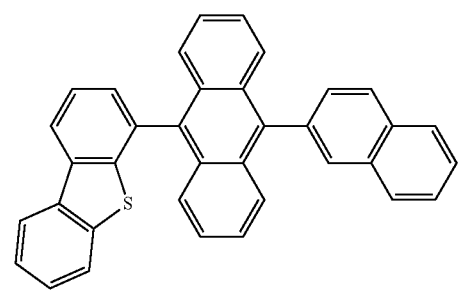
E10
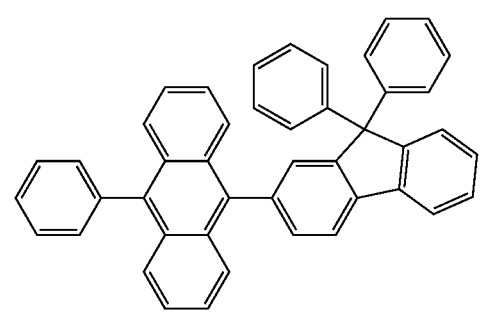
E11
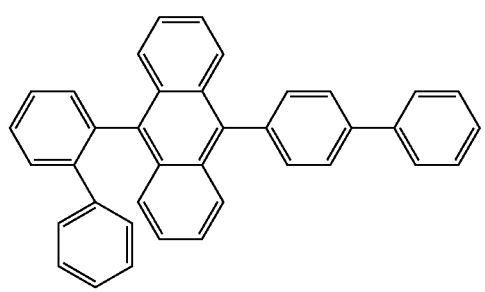
E12
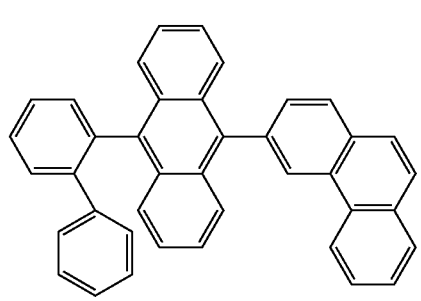
E13
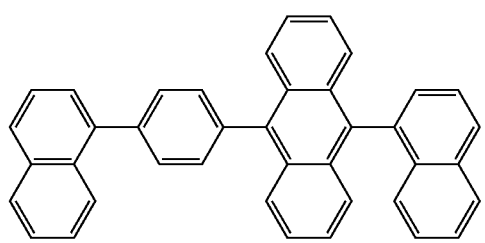
E14
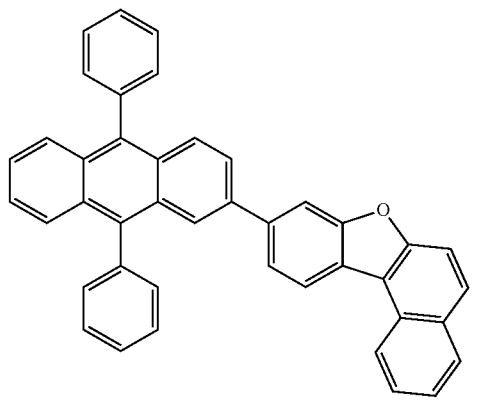

E15

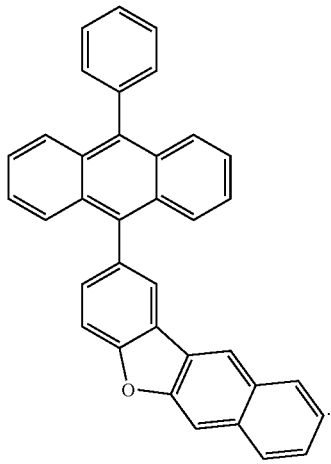

E16

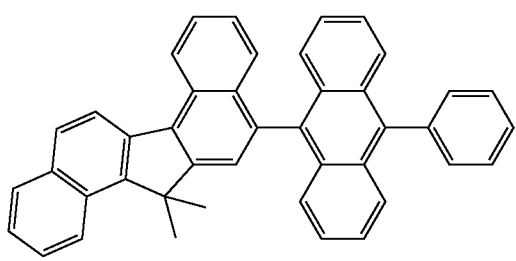

E17

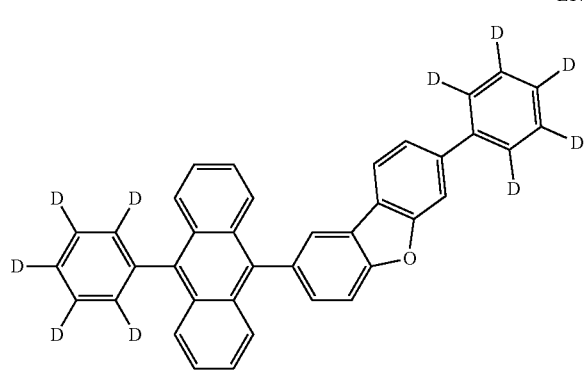

E18

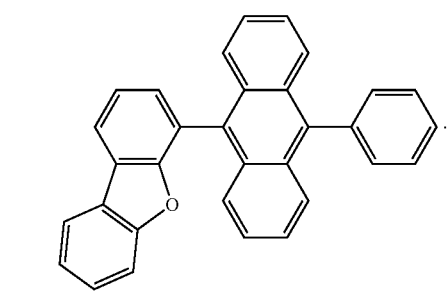

Formula E-2a

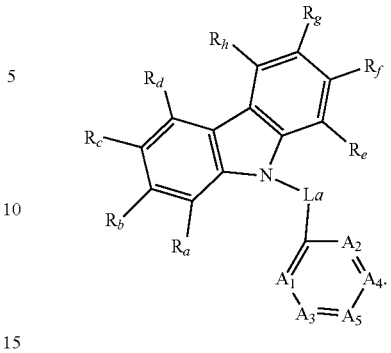

In Formula E-2a, $L_a$ may be a direct linkage, or a substituted or unsubstituted arylene group of 6 to 30 ring-forming carbon atoms. In some embodiments, in Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $R_a$ to $R_i$ may be combined with an adjacent group to form a hydrocarbon ring or a heterocycle including nitrogen (N), oxygen (O), sulfur (S), etc., as a ring-forming element.

In some embodiments, in Formula E-2a, two or three selected from $A_1$ to $A_5$ may be N, and the remainder may be $CR_i$.

(Cbz1)–$L_b$–(Cbz2).  Formula E-2b

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, or a substituted or unsubstituted arylene group of 6 to 30 ring-forming carbon atoms.

The compound represented by Formula E-2a or Formula E-2b may be represented by any one selected from the compounds in Compound Group E-2. However, the compound represented by Formula E-2a or Formula E-2b is not limited to the example compounds represented in Compound Group E-2:

Compound Group E-2

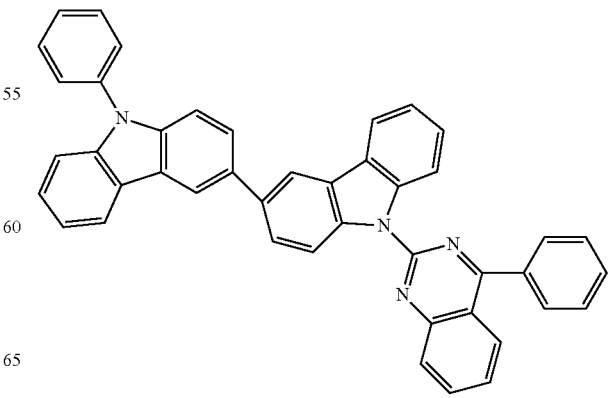

In an embodiment, the emission layer EML may include a compound represented by Formula E-2a or Formula E-2b. The compound represented by Formula E-2a or Formula E-2b may be used as a phosphorescence host material:

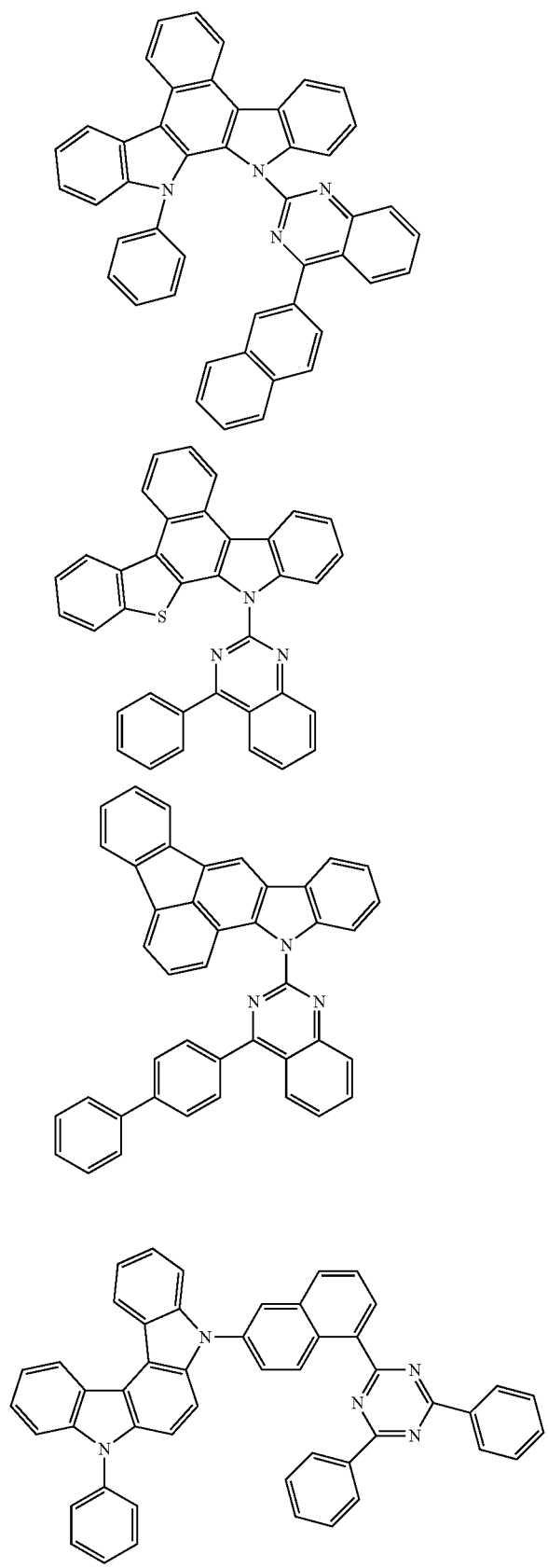
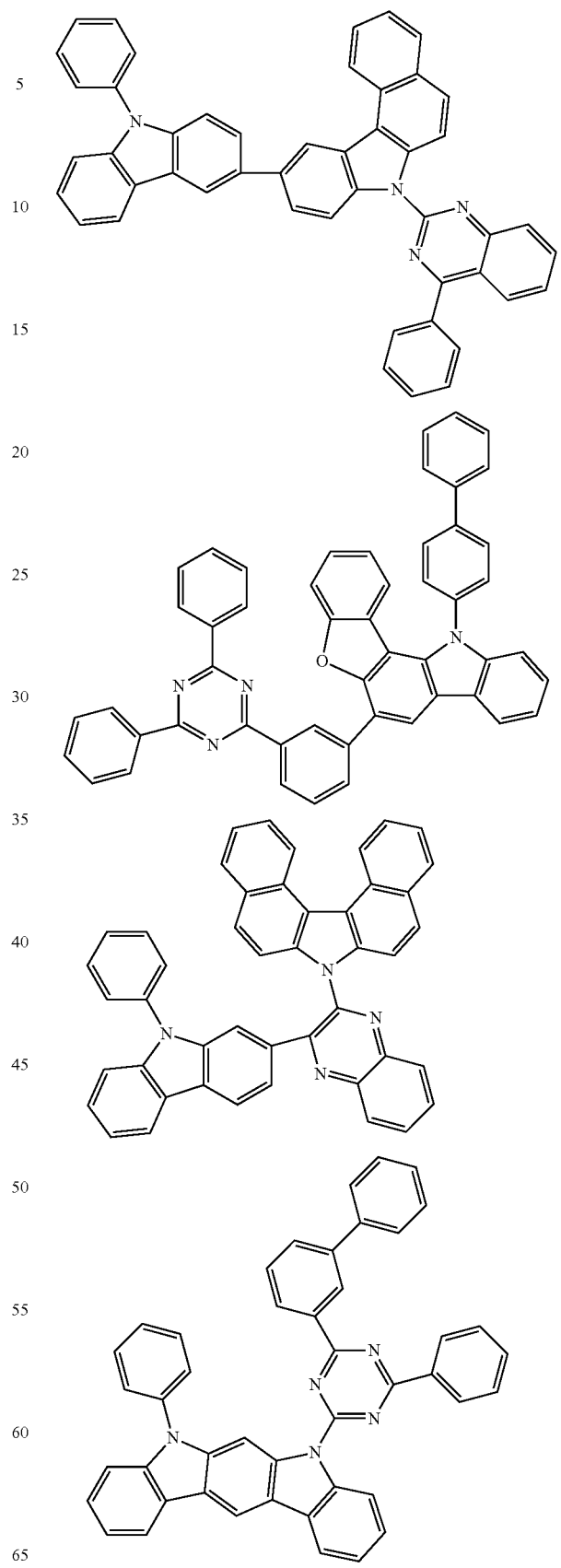

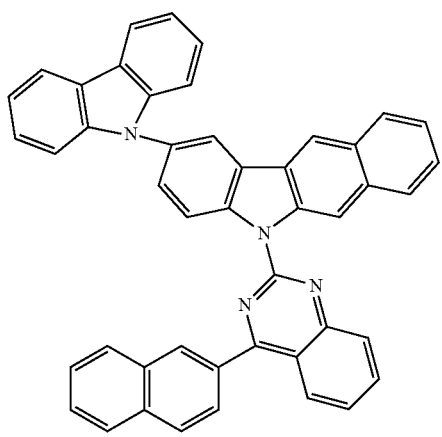
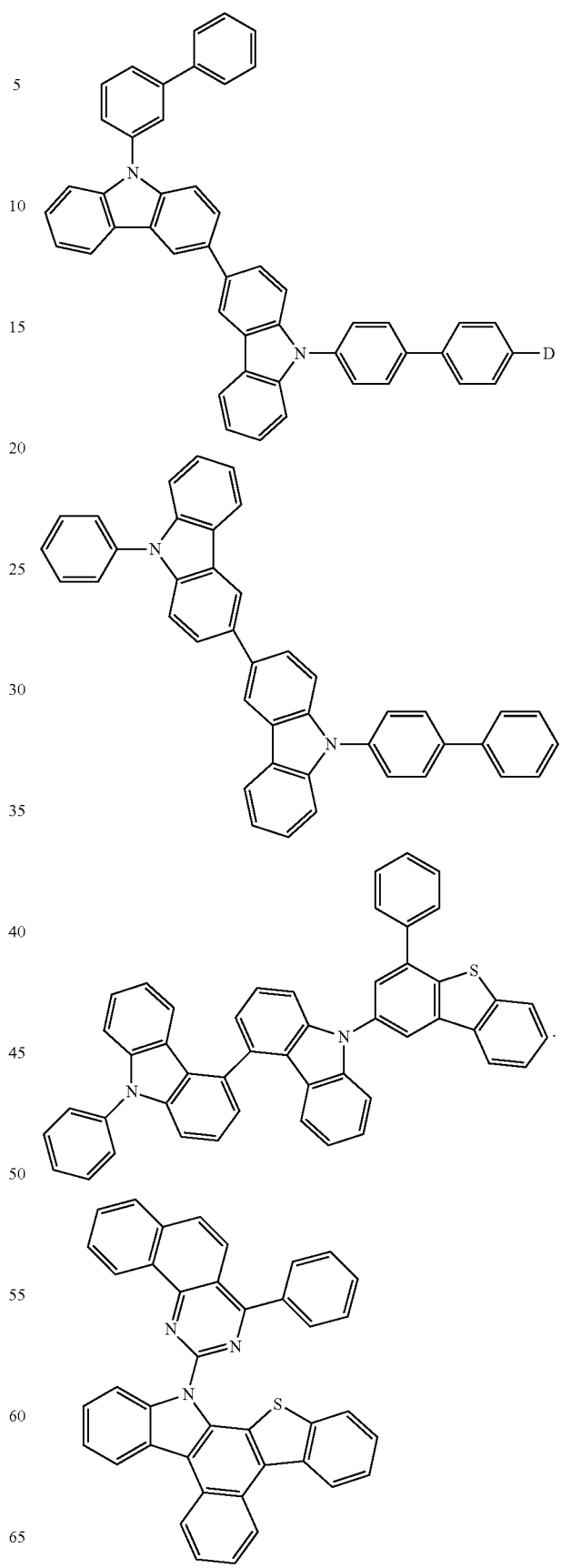

-continued

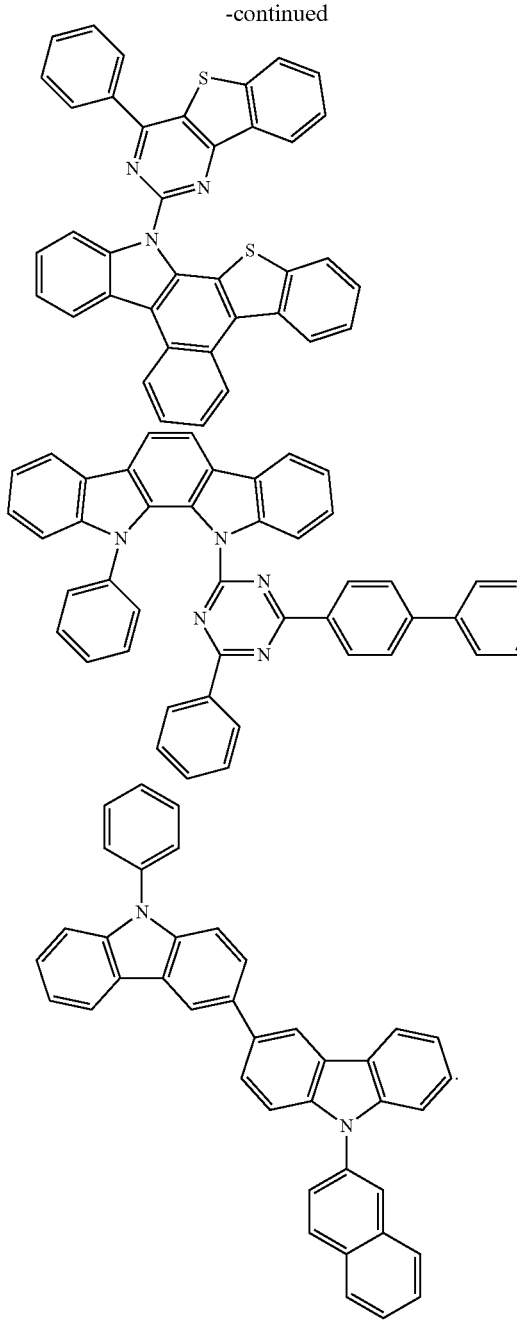

The emission layer EML may further include any suitable host material in the art. For example, the emission layer EML may include, as a host material, at least one of bis[2-(diphenylphosphino)phenyl] ether oxide (DPEPO), 4,4′-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4′,4″-tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto. For example, tris(8-hydroxyquinolino)aluminum ($Alq_3$), 4,4′-bis(N-carbazolyl)-1,1′-biphenyl (CBP), poly(N-vinylcarbazole) (PVK), 9,10-di(naphthalene-2-yl)anthracene (ADN), 4,4′,4″-tris (carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4′-bis(9-carbazolyl)-2,2′-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as the host material.

The emission layer EML may include a compound represented by Formula M-a or Formula M-b. The compound represented by Formula M-a or Formula M-b may be used as a phosphorescence dopant material:

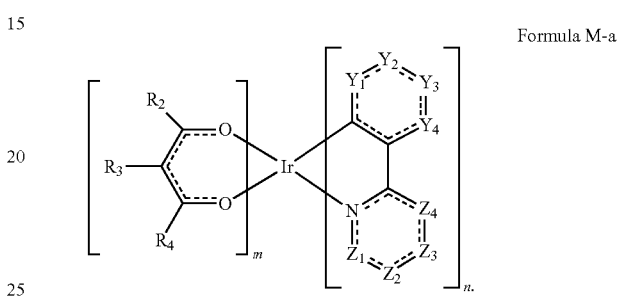

Formula M-a

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, "m" is 0 or 1, and "n" is 2 or 3. In Formula M-a, if "m" is 0, "n" is 3, and if "m" is 1, "n" is 2.

The compound represented by Formula M-a may be used as a red phosphorescence dopant or as a green phosphorescence dopant.

The compound represented by Formula M-a may be represented by any one selected from Formula M-a1 to Formula M-a5. However, the compound represented by Formula M-a is not limited to the example compounds represented by Formula M-a1 to Formula M-a5:

M-a1

M-a2

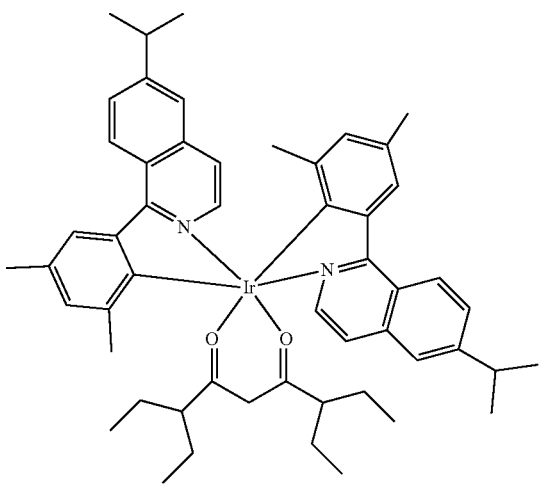

M-a3

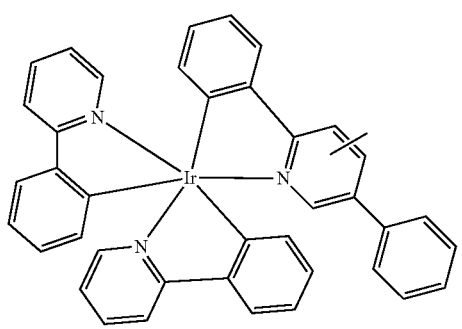

M-a4

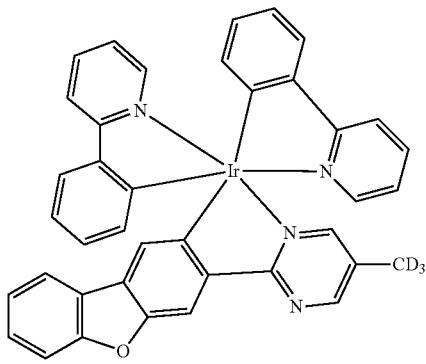

M-a5

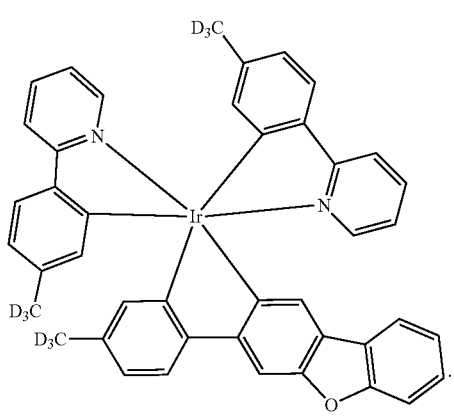

Formula M-a1 and/or Formula M-a2 may be used as red dopant materials, and Formula M-a3 and/or Formula M-a5 may be used as green dopant materials.

Formula M-b

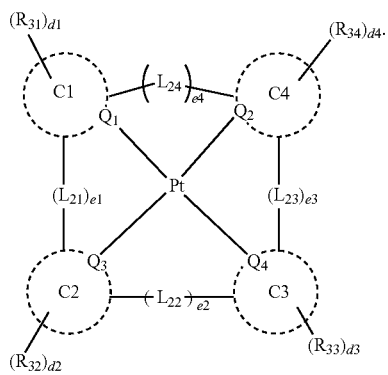

In Formula M-b, Q1 to Q4 may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

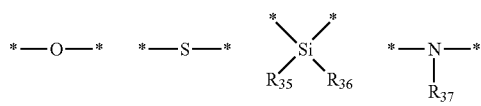

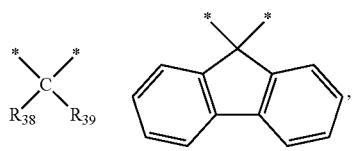

a substituted or unsubstituted alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and d1 to d4 may each independently be an integer of 0 to 4.

The compound represented by Formula M-b may be used as a blue phosphorescence dopant or a green phosphorescence dopant.

The compound represented by Formula M-b may be represented by any one of the compounds below. However, the compounds are examples, and the compound represented by Formula M-b is not limited thereto.

75
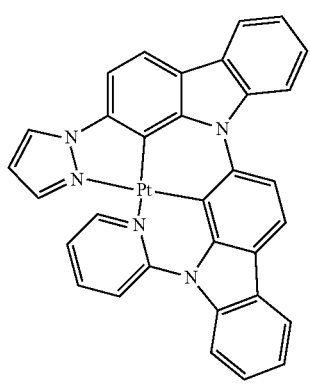
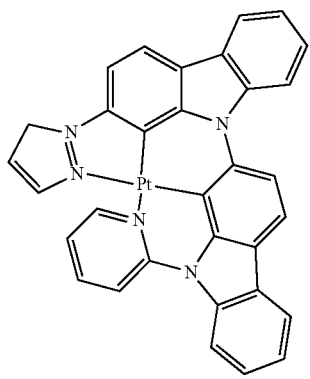
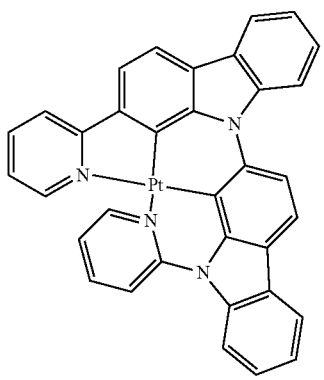
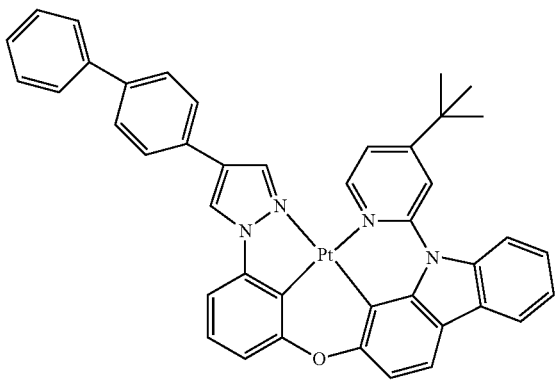
76
-continued
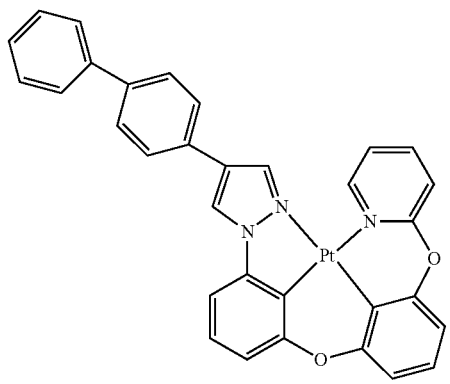
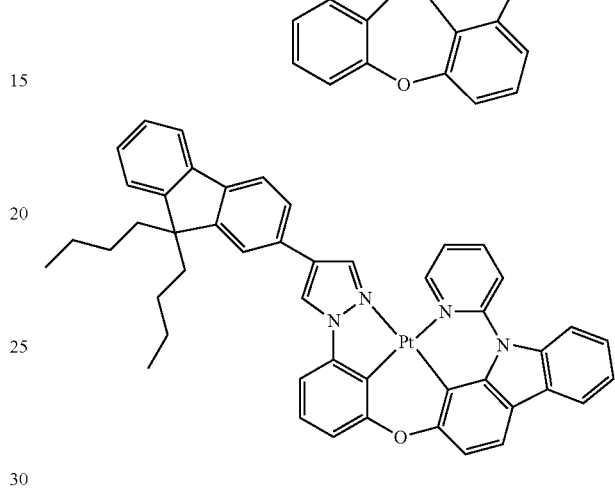
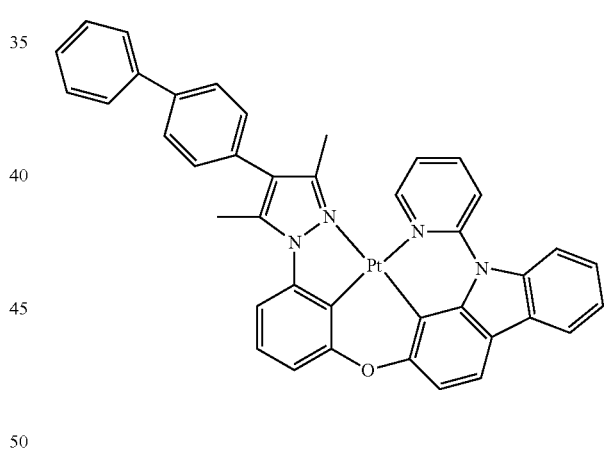
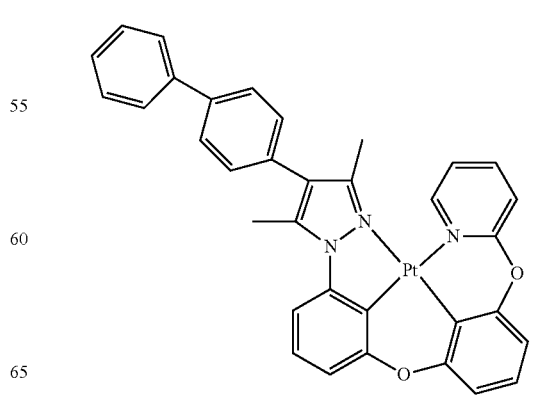

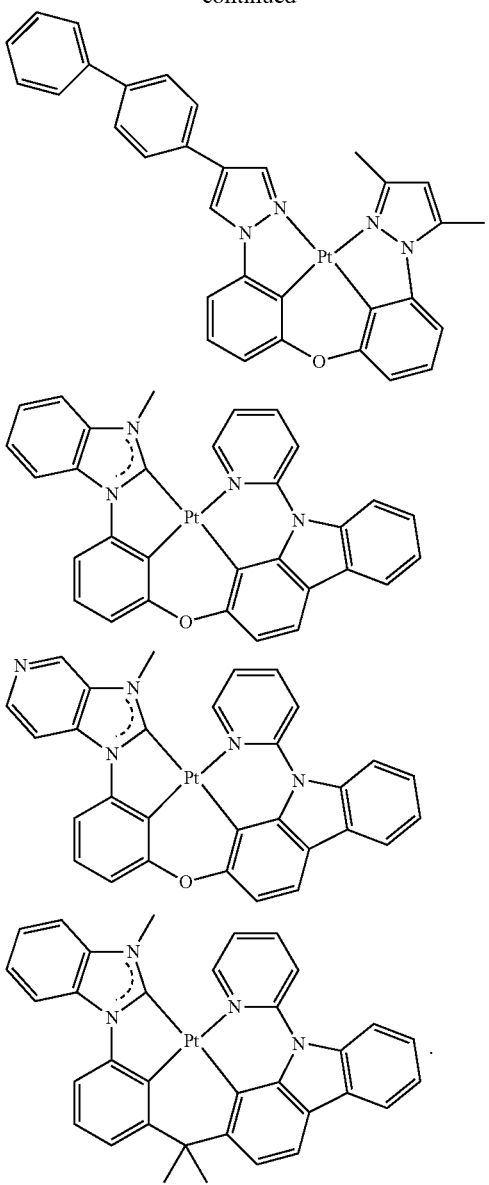

The emission layer EML may include a compound represented by any one of Formula F-a to Formula F-c. The compounds represented by Formula F-a to Formula F-c may be used as fluorescence dopant materials.

Formula F-a

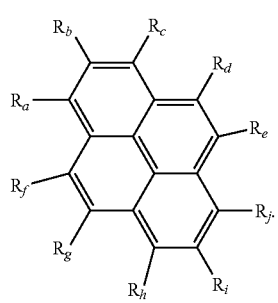

In Formula F-a, Ra to Rj may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. Two selected from Ra to Rj may be represented by Formula F-a-1:

Formula F-a-1

In Formula F-a-1, Ar1 and Ar2 may each independently be a substituted or unsubstituted aryl group of 6 to 30 ring-forming carbon atoms, or a substituted or unsubstituted heteroaryl group of 2 to 30 ring-forming carbon atoms. For example, at least one of Ar1 or Ar2 may be a heteroaryl group including O or S as a ring-forming element.

Formula F-b

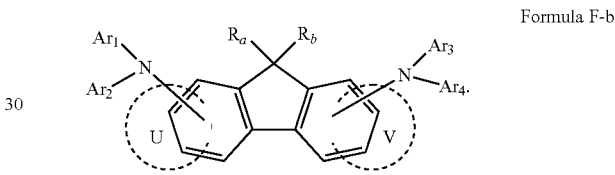

In Formula F-b, Ra and Rb may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be optionally combined with an adjacent group to form a ring.

In Formula F-b, U and V may each independently be 0 or 1. In Formula F-b, U refers to the number of additional fused rings (as shown in dotted lines around U), and V means the number of additional fused rings (as shown in dotted lines around V). For example, if U or V is 1, the ring marked with U or V constitutes a fused ring, and if U or V is 0, it means that no additional fused ring (e.g., additional to the benzene group) marked with U or V is present. For example, if U is 0, and V is 1, or if U is 1, and V is 0, the fused ring having a fluorine core of Formula F-b may be a ring compound having four fused rings. In some embodiments, if both (e.g., simultaneously) U and V are 0, the fused ring of Formula F-b may be a ring compound having three rings. In some embodiments, if both (e.g., simultaneously) U and V are 1, the fused ring having a fluorine core of Formula F-b may be a ring compound having five rings.

In Formula F-b, when U or V is 1, U and V may each independently be a substituted or unsubstituted hydrocarbon ring of 5 to 30 ring-forming carbon atoms, or a substituted or unsubstituted heterocycle of 2 to 30 ring-forming carbon atoms.

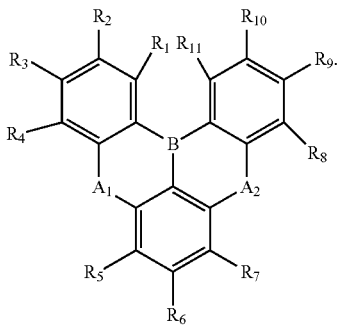

Formula F-c

In Formula F-c, $A_1$ and A2 may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-c, $A_1$ and $A_2$ may each independently be combined with the substituents of an adjacent ring to form a fused ring. For example, when $A_1$ and $A_2$ are each independently $NR_m$, $A_1$ may be combined with $R_4$ or $R_5$ to form a ring. In some embodiments, $A_2$ may be combined with $R_7$ or $R_8$ to form a ring.

In an embodiment, the emission layer EML may include any suitable dopant material, for example, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), 4,4'-bis[2-(4-(N,N-diphenylamino)phenyl)vinyl]biphenyl (DPAVBi), and N-(4-((E)-2-(6-((E)-4-(diphenylamino)styryl)naphthalen-2-yl)vinyl)phenyl)-N-phenylbenzenamine (N-BDAVBi)), perylene and/or derivatives thereof (for example, 2,5,8,11-tetra-t-butylperylene (TBP)), pyrene and/or derivatives thereof (for example, 1,1-dipyrene, 1,4-dipyrenylbenzene, 1,4-bis(N,N-diphenylamino)pyrene), etc.

The emission layer EML may include any suitable phosphorescence dopant material. For example, the phosphorescent dopant may utilize a metal complex including iridium (Ir), platinum (Pt), osmium (Os), gold (Au), titanium (Ti), zirconium (Zr), hafnium (Hf), europium (Eu), terbium (Tb), and/or thulium (Tm). For example, iridium(III) bis(4,6-difluorophenylpyridinato-N,C2'(Flrpic), bis(2,4-difluorophenylpyridinato)-tetrakis(1-pyrazolyl)borate iridium (III) (Fir6), and/or platinum octaethyl porphyrin (PtOEP) may be used as the phosphorescence dopant. However, embodiments of the present disclosure are not limited thereto.

The emission layer EML may include a quantum dot material. The core of the quantum dot may be selected from II-VI group compounds, III-V group compounds, IV-VI group compounds, IV group elements, IV group compounds, and combinations thereof.

The II-VI group compound may be selected from the group consisting of a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound (such as $In_2S_3$ and/or $In_2Se_3$), a ternary compound (such as $InGaS_3$ and/or $InGaSe_3$), or any combination thereof.

The group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof; and a quaternary compound (such as $AgInGaS_2$ and/or $CuInGaS_2$).

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InAsP, ZnTeSe, ZnSeS, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the III-V group compound may further include a Group II metal. For example, InZnP, etc., may be selected as the III-II-V group compound.

The IV-VI group compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The IV group element may be selected from the group consisting of Si, Ge, and mixtures thereof. The IV group compound may be a binary compound selected from the group consisting of SiC, SiGe, and mixtures thereof.

In this case, the binary compound, the ternary compound or the quaternary compound may be present at a substantially uniform concentration in the particle, or may be present at a partially different concentration distribution state (e.g., including one or more gradients or one or more regions of differing concentration) within the same particle. In some embodiments, a core/shell structure in which one quantum dot wraps another quantum dot may be possible. The core/shell structure may have a concentration gradient in which the concentration of an element present in the shell decreases toward a center.

In some embodiments, the quantum dot may have a core-shell structure including a core including a nanocrystal and a shell wrapping the core. The shell of the quantum dot may play the role of a protection layer for preventing or reducing the chemical deformation (degradation) of the core to maintain semiconductor properties, and/or a charging layer for imparting the quantum dot with electrophoretic properties. The shell may have a single layer or a multilayer structure. Non-limiting examples of the shell of the quantum dot include a metal or non-metal oxide, and/or a semiconductor compound.

For example, the metal or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), or a ternary compound (such as $MgAl_2O_4$, $CoFe_2O_4$, $NiFe_2O_4$ and/or $CoMn_2O_4$), but embodiments of the present disclosure are not limited thereto.

In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have an emission wavelength spectrum full width of half maximum (FWHM) of about 45 nm or less, about 40 nm or less, or for example, about 30 nm or less. Within this range, color purity or color reproducibility may be improved. In some embodiments, the quantum dot may be to emit in all directions, and the viewing angle of a device may be improved.

The quantum dot may have any suitable shape in the art, without specific limitation. For example, the quantum dot may be a spherical, pyramidal, multi-arm, or cubic nanoparticle, nanotube, nanowire, nanofiber, nanoplate particle, etc.

The quantum dot may control the color of emitted light according to the particle size, and accordingly, the quantum dots may have one or more suitable emission colors (such as blue, red and/or green).

In the light-emitting devices ED of embodiments, as shown in FIG. 3 to FIG. 6, the electron transport region ETR is provided on the emission layer EML. The electron transport region ETR may include at least one of an electron blocking layer HBL, an electron transport layer ETL, or an electron injection layer EIL. However, embodiments of the present disclosure are not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure having multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes the electron transport layer ETL, the electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), 8-hydroxyl-lithium quinolate (LiQ), or one or more mixtures thereof, without limitation.

For example, the electron transport layer ETL may include a compound represented by Formula ET-1:

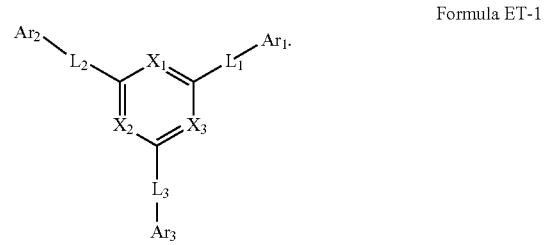

Formula ET-1

In Formula ET-1, at least one selected from $X_1$ to $X_3$ may be N, and the remainder may be $CR_a$. $R_a$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. Ar1 to Ara may be each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms.

The thickness of the electron transport layer ETL may be about 100 Å to about 1,000 Å, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may include a metal halide (such as LiF, NaCl, CsF, RbCl, RbI, CuI and/or KI), a lanthanide metal (such as Yb), or a co-deposited combination thereof. For example, the electron transport region ETR may include KI:Yb, RbI:Yb, etc., as the co-depositing material. In some embodiments, the electron transport region ETR may utilize a metal oxide (such as $Li_2O$ and/or BaO), and/or 8-hydroxy-lithium quinolate (LiQ). However, embodiments of the present disclosure are not limited thereto. The electron injection layer EIL may also be formed by utilizing a mixture of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates. The thickness of the electron injection layer EIL may be about 1 Å to about 100 Å, or about 3 Å to about 90 Å. When the thickness of the electron injection layer EIL satisfies the above described range, satisfactory electron injection properties may be obtained without inducing a substantial increase in driving voltage.

The electron transport region ETR may include a hole blocking layer HBL as described. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, In, Sn, An, Yb, a compound thereof, a mixture thereof (for example, AgMg, AgYb, or MgAg), or an oxide thereof. The second electrode EL2 may have a multilayered structure, for example including a reflective layer or a transflective layer formed utilizing the above-described materials, and a transparent conductive layer formed utilizing ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, on the second electrode EL2 in the light-emitting device ED of an embodiment, a capping layer CPL may be further disposed. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound (such as LiF), an alkaline earth metal compound (such as $MgF_2$, SiON, $SiN_x$, and/or $SiO_y$), etc.

For example, when the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4''-tris(carbazol-9-yl) triphenylamine (TCTA), etc., or may include an epoxy resin and/or acrylate (such as methacrylate). In some embodiments, Compounds P1 to P5 may be included, but embodiments of the present disclosure are not limited thereto.

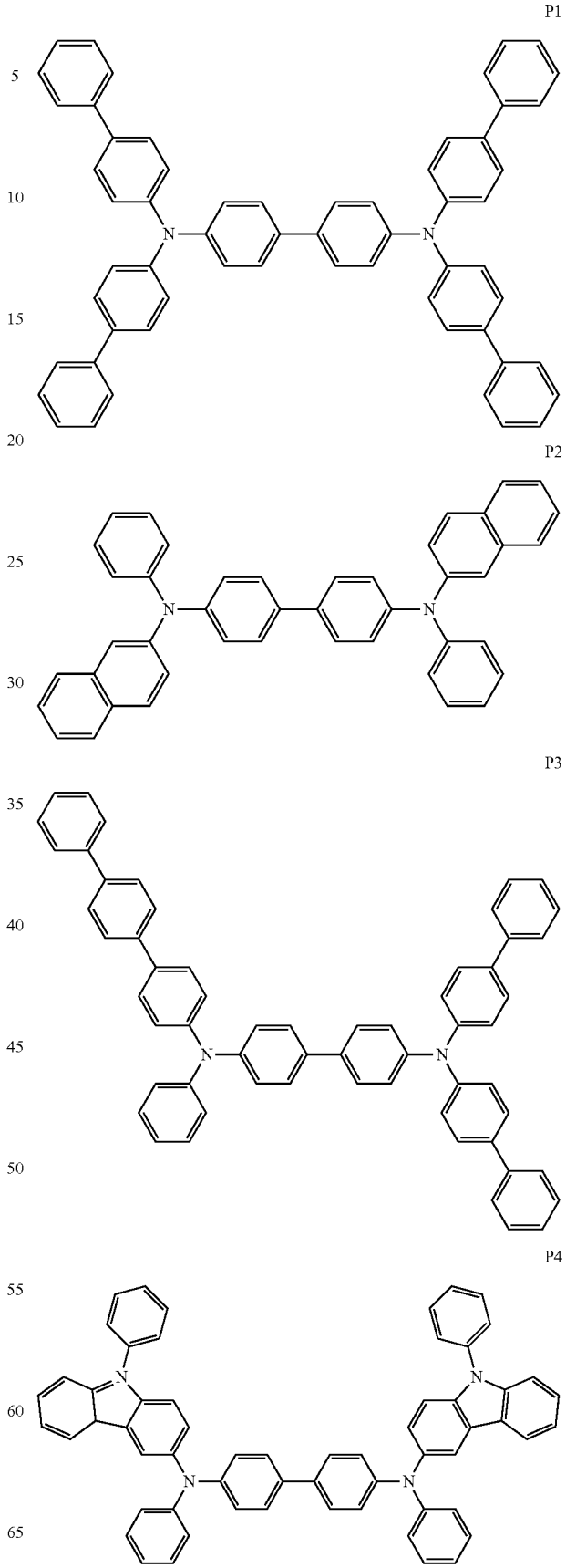

-continued

P5

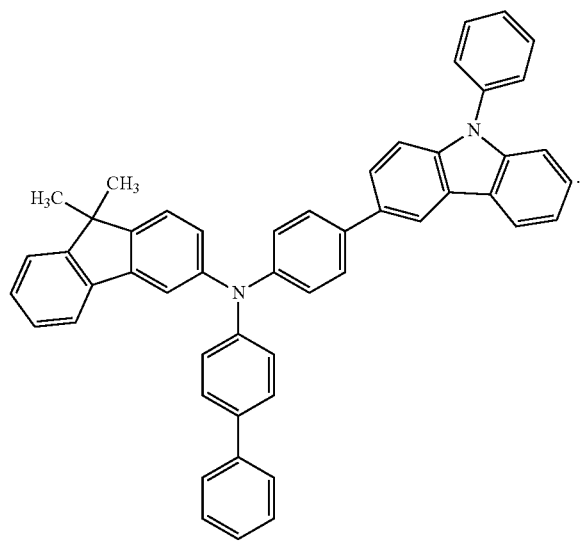

In some embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
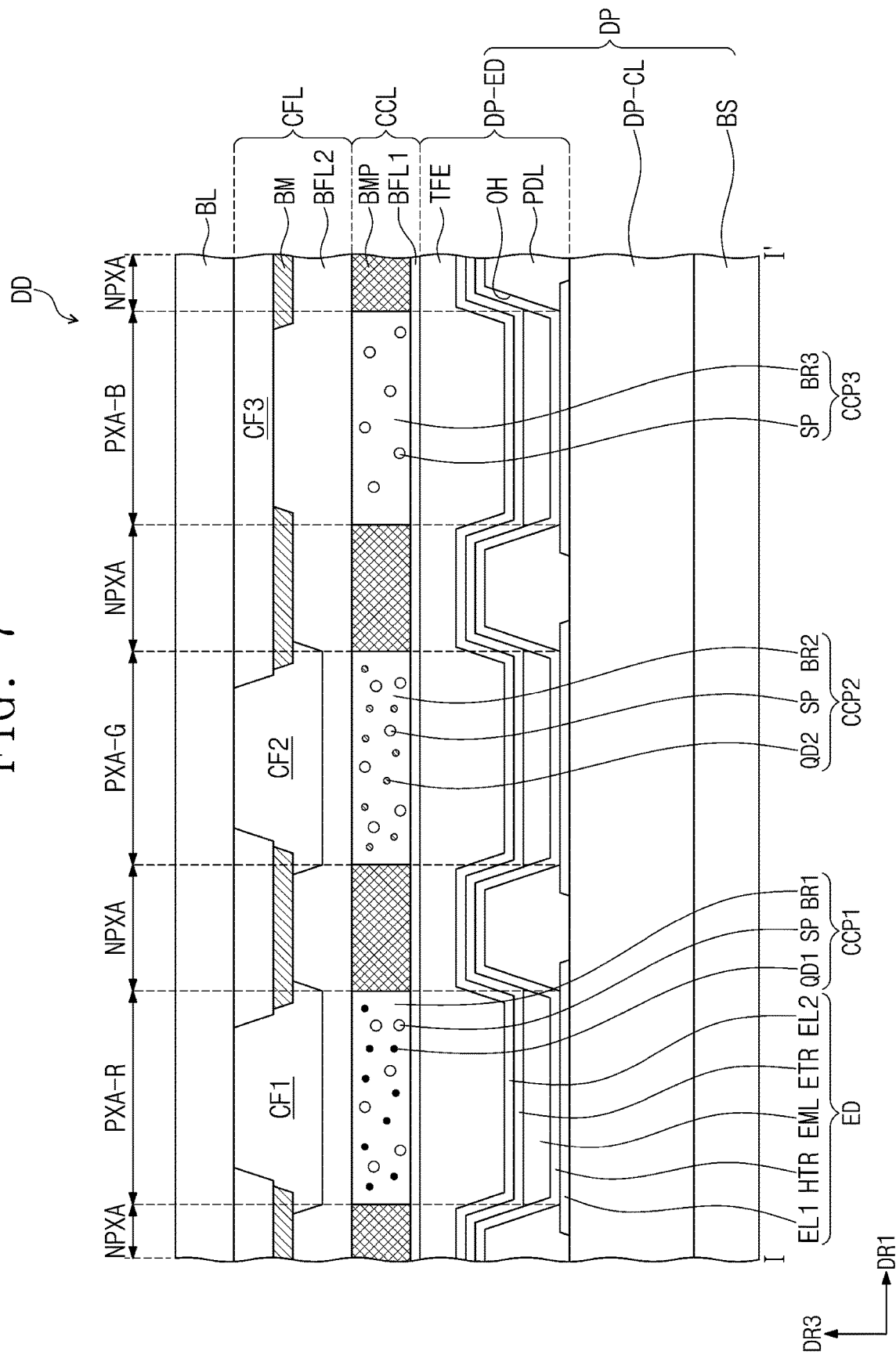
FIG. 7 and FIG. 8 are cross-sectional views of display apparatuses according to embodiments.
Figure 8:
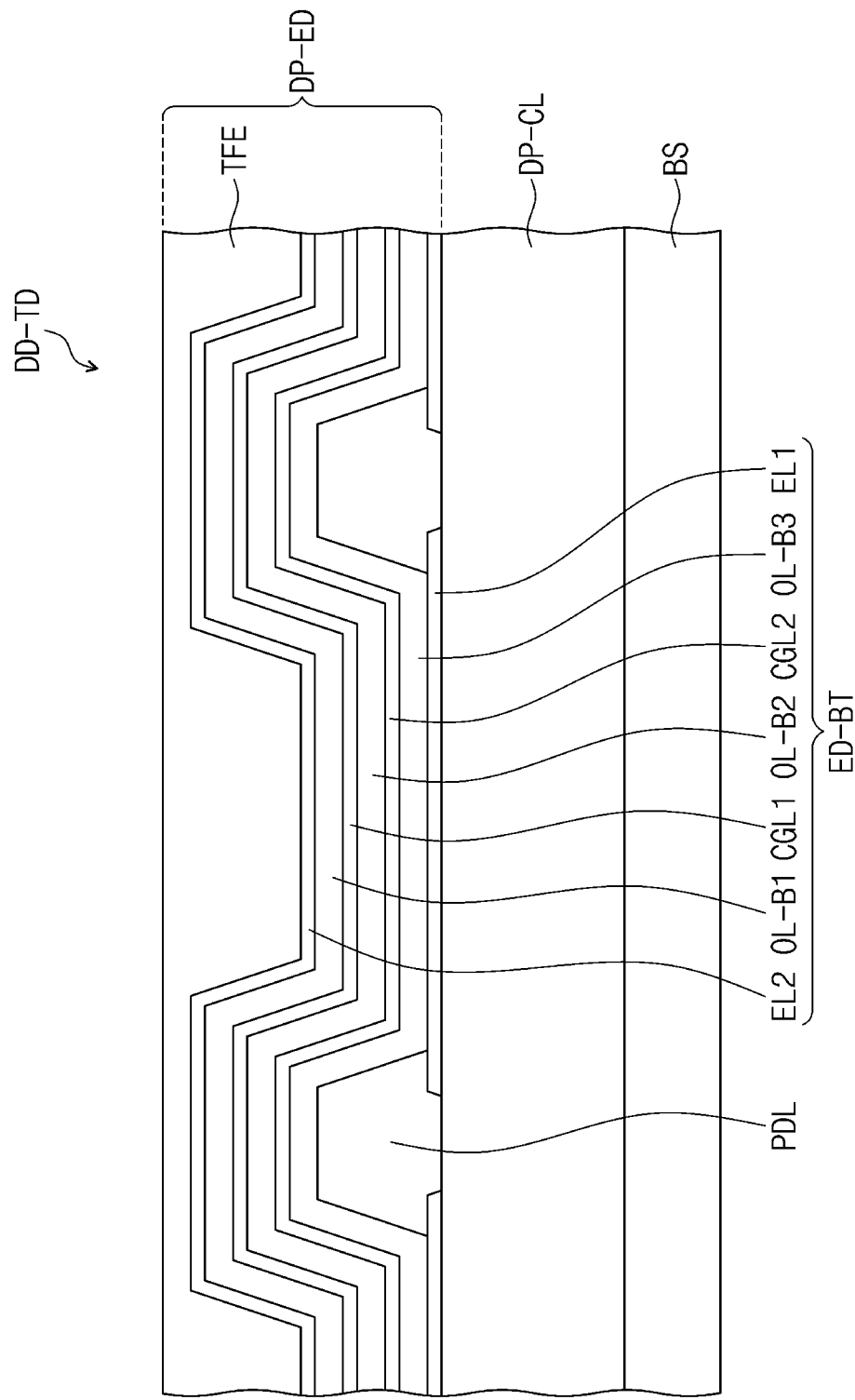

FIG. 7 and FIG. 8 are cross-sectional views of example display apparatuses. In the explanation embodiments referring to FIG. 7 and FIG. 8, features similar to those in FIG. 1 to FIG. 6 will not be explained again, and distinguishing features will be described in detail.

Referring to FIG. 7, the display apparatus DD according to an embodiment may include a display panel DP including a display device layer DP-ED, a light controlling layer CCL disposed on the display panel D, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light-emitting device ED.

The light-emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. Any suitable structure of the light-emitting devices ED of FIG. 4 to FIG. 6 may be applied to the structure of the light-emitting device ED shown in FIG. 7.

Referring to FIG. 7, the emission layer EML may be disposed in an opening part OH defined in a pixel definition layer PDL. In some embodiments, the emission layer EML divided by the pixel definition layer PDL and correspondingly provided to each of light-emitting areas PXA-R, PXA-G, and PXA-B may be to emit light in the same wavelength region. In the display apparatus DD of an embodiment, the emission layer EML may be to emit blue light. In some embodiments, the emission layer EML may be provided as a common layer for all light-emitting areas PXA-R, PXA-G and PXA-B.

The light controlling layer CCL may be disposed on the display panel DP. The light controlling layer CCL may include a light converter. The light converter may be a quantum dot and/or a phosphor. The light converter may be to transform and re-emit the wavelength of light incident thereon. For example, the light controlling layer CCL may be a layer including quantum dots or a layer including phosphors.

The light controlling layer CCL may include multiple light controlling parts CCP1, CCP2, and CCP3. The light controlling parts CCP1, CCP2, and CCP3 may be separated from one another.

Referring to FIG. 7, partition pattern BMP may be disposed between the separated light controlling parts CCP1, CCP2, and CCP3, but embodiments of the present disclosure are not limited thereto. In FIG. 7, the partition pattern BMP is shown as not being overlapped with the light controlling parts CCP1, CCP2 and CCP3, but in some embodiments, at least a portion of the edge of the light controlling parts CCP1, CCP2 and CCP3 may be overlapped with the partition pattern BMP.

The light controlling layer CCL may include a first light controlling part CCP1 including a first quantum dot QD1 to convert a first color light provided from the light-emitting device ED into a second color light, a second light controlling part CCP2 including a second quantum dot QD2 to convert the first color light into a third color light, and a third light controlling part CCP3 to transmit the first color light.

In an embodiment, the first light controlling part CCP1 may provide red light (as the second color light), and the second light controlling part CCP2 may provide green light (as the third color light). The third color controlling part CCP3 may be to transmit and provide blue light (as the first color light) provided from the light-emitting device ED. For example, the first quantum dot QD1 may be a red quantum dot, and the second quantum dot QD2 may be a green quantum dot. The quantum dots QD1 and QD2, may be the same as described herein.

In some embodiments, the light controlling layer CCL may further include a scatterer SP. The first light controlling part CCP1 may include the first quantum dot QD1 and the scatterer SP, second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one selected from $TiO_2$, ZnO, $Al_2O_3$, $SiO_2$, and hollow silica. The scatterer SP may include at least one selected from $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Each of the first light controlling part CCP1, the second light controlling part CCP2, and the third light controlling part CCP3 may respectively include base resins BR1, BR2, and BR3, in which the quantum dots QD1 and QD2 and the scatterer SP may be dispersed. In an embodiment, the first light controlling part CCP1 may include the first quantum dot QD1 and the scatterer SP dispersed in the first base resin BR1; the second light controlling part CCP2 may include the second quantum dot QD2 and the scatterer SP dispersed in the second base resin BR2; and the third light controlling part CCP3 may include the scatterer particle SP dispersed in the third base resin BR3. The base resins BR1, BR2, and BR3 are mediums in which the quantum dots QD1 and QD2 and the scatterer SP are dispersed, and may be composed of one or more suitable resin compositions which may be generally referred to as a binder. For example, the base resins BR1, BR2, and BR3 may each independently be acrylic resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same or different from each other.

The light controlling layer CCL may include a barrier layer BFL1. The barrier layer BFL1 may block or reduce the penetration of moisture and/or oxygen (hereinafter, will be referred to as "humidity/oxygen") into the device. The barrier layer BFL1 may be disposed on the light controlling parts CCP1, CCP2, and CCP3 to block or reduce exposure of the light controlling parts CCP1, CCP2, and CCP3 to humidity/oxygen. In some embodiments, the barrier layer BFL1 may cover the light controlling parts CCP1, CCP2, and CCP3. In some embodiments, the barrier layer BFL2 may be provided between the light controlling parts CCP1, CCP2, and CCP3 and a color filter layer CFL.

The barrier layers BFL1 and BFL2 may each independently include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride, and/or a metal thin film to secure light transmittance. In some embodiments, the barrier layers BFL1 and BFL2 may each independently further include an organic layer. The barrier layers BFL1 and BFL2 may each independently be composed of a single layer of multiple layers.

In the display apparatus DD of an embodiment, the color filter layer CFL may be disposed on the light controlling layer CCL. For example, the color filter layer CFL may be disposed directly on the light controlling layer CCL. In this case, the barrier layer BFL2 may not be provided.

The color filter layer CFL may include a light blocking part BM and/or filters CF-B, CF-G, and/or CF-R. The color filter layer CFL may include a first filter CF1 to transmit second color light, a second filter CF2 to transmit third color light, and a third filter CF3 to transmit first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments of the present disclosure are not limited thereto, and in some embodiments, the third filter CF3 may not include the pigment or dye. For example, the third filter CF3 may include a polymer photosensitive resin and not include a pigment or dye. The third filter CF3 may be transparent. The third filter CF3 may be formed utilizing a transparent photosensitive resin.

In some embodiments, the first filter CF1 and/or the second filter CF2 may be yellow filters. In some embodiments, he first filter CF1 and the second filter CF2 may be provided as one (e.g., integrated) body without distinction.

The light blocking part BM may be a black matrix. The light blocking part BM may be formed by including an organic light blocking material and/or an inorganic light blocking material including a black pigment and/or black dye. The light blocking part BM may prevent or reduce light leakage phenomenon and form boundaries between adjacent filters CF1, CF2 and CF3. In some embodiments, the light blocking part BM may be formed as a blue filter.

Each of the first to third filters CF1, CF2, and CF3 may be respectively disposed to correspond to each of a red light-emitting area PXA-R, a green light-emitting area PXA-G, and a blue light-emitting area PXA-B. For example, each of the first to third filters CF1, CF2, and CF3 may be disposed to filter/cover a corresponding one of the red light-emitting area PXA-R, the green light-emitting area PXA-G, or the blue light-emitting area PXA-B.

In some embodiments, a base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments of the present disclosure are not limited thereto, and the base substrate BL may be an inorganic layer, an organic layer or a composite material layer. In some embodiments, the base substrate BL of an embodiment may be omitted.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, a light-emitting device ED-BT may include multiple light-emitting structures OL-B1, OL-B2, and OL-B3. The light-emitting device ED-BT may include oppositely disposed first electrode EL1 and second electrode EL2, and the multiple light-emitting structures OL-B1, OL-B2, and OL-B3 stacked in order in a thickness direction between the first electrode EL1 and the second electrode EL2. Each of the light-emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the light-emitting device ED-BT included in the display apparatus DD-TD of an embodiment may be a light-emitting device having a tandem structure including multiple emission layers.

In an embodiment shown in FIG. 8, light emitted from the light-emitting structures OL-B1, OL-B2, and OL-B3 may be all blue light. However, embodiments of the present disclosure are not limited thereto, and in some embodiments, the wavelength regions of light emitted from the light-emitting structures OL-B1, OL-B2, and OL-B3 may be different from each other. For example, the light-emitting device ED-BT including the multiple light-emitting structures OL-B1, OL-B2, and OL-B3 may emit light in different wavelength regions to emit white light.

One or more charge generating layer(s) CGL1 and CGL2 may be disposed between neighboring light-emitting structures OL-B1, OL-B2 and OL-B3. The charge generating layer(s) CGL1 and CGL2 may each include a p-type (p-doped) charge generating layer and/or an n-type (n-doped) charge generating layer.

The organic electroluminescence device ED according to an embodiment of the present disclosure includes the fused polycyclic compound of an embodiment in an emission layer EML disposed between a first electrode EU and a second electrode EL2, and may show excellent emission efficiency. In some embodiments, the fused polycyclic compound according to an embodiment may be a thermally activated delayed fluorescence host, and the emission layer EML may include the fused polycyclic compound of an embodiment to emit thermally activated delayed fluorescence, and may show excellent emission efficiency properties.

In some embodiments, the compound of an embodiment may be included in an organic layer other than the emission layer EML as a material for an organic electroluminescence device ED. For example, the organic electroluminescence device ED according to an embodiment of the present disclosure may include the fused polycyclic compound in at least one functional layer disposed between the first electrode EL1 and the second electrode EL2, and/or in a capping layer CPL disposed on the second electrode EL2.

The fused polycyclic compound of an embodiment includes two silicon atoms fused with a central nitrogen atom via multiple aromatic rings, and a (e.g., multiple) C—Si bond(s), which may contribute to stability of its molecular structure.

In some embodiments, due to the structure, the fused polycyclic compound of an embodiment has improved electron mobility and may have a relatively high lowest triplet excitation energy (Ti) level.

The organic electroluminescence device of an embodiment, including the fused polycyclic compound of an embodiment in an emission layer, may be to emit blue light and show high efficiency properties.

Hereinafter, the fused polycyclic compound according to an embodiment and the organic electroluminescence device of an embodiment including the same will be explained in more detail by referring to embodiments and comparative embodiments. Such embodiments are provided as illustrations to assist the understanding of the present disclosure, and the scope of the present disclosure is not limited thereto.

1. Synthetic Examples

The fused polycyclic compound according to an embodiment may be synthesized, for example, as follows. However, the synthetic methods of the fused polycyclic compound explained are only embodiments, and synthetic methods of the fused polycyclic compound according to an embodiment of the present disclosure are not limited to the following examples.

(1) Synthesis of Compound 3

Compound 3 of an embodiment may be synthesized by Reaction 1:

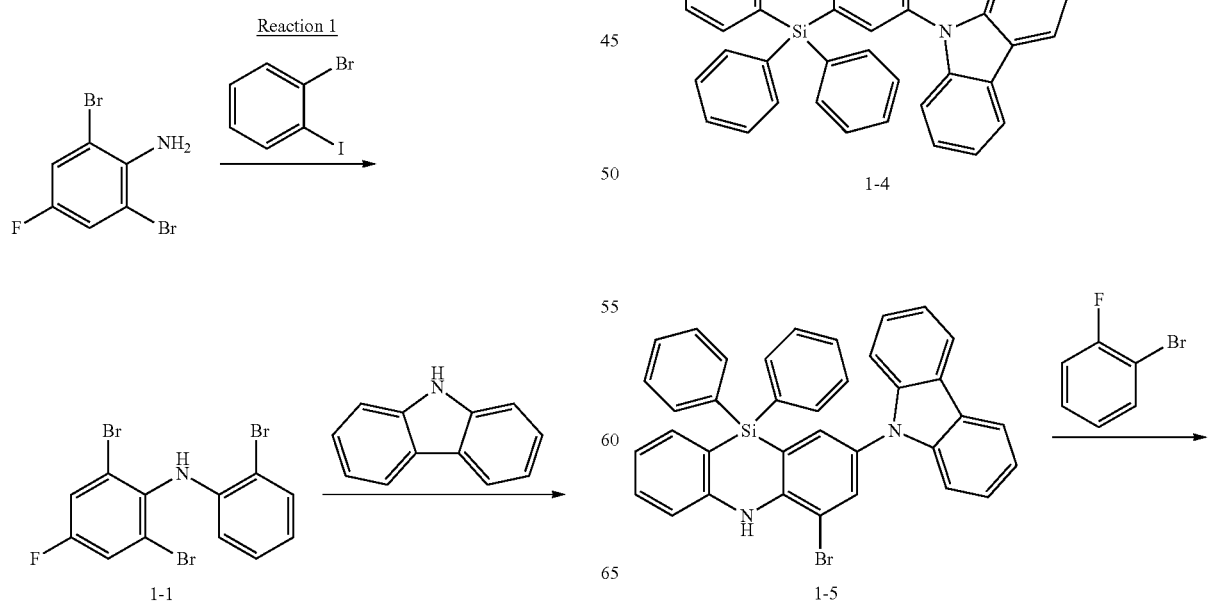

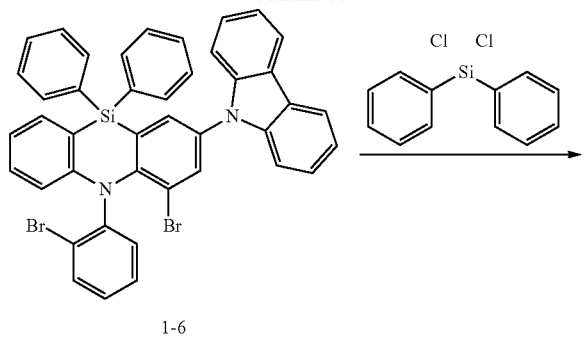

1-6

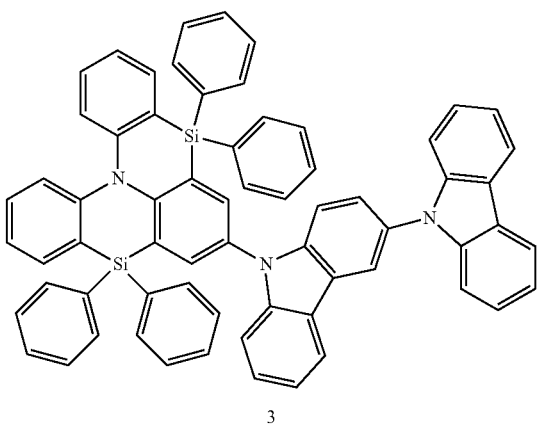

3

1) Synthesis of Intermediate 1-1

Intermediate 1-1 was obtained by reacting 2,6-dibromo-4-fluoroaniline (CAS: 344-18-3) and 1-bromo-2-iodobenzene (CAS: 583-55-1) under Pd catalyst conditions. Intermediate 1-1 was identified by LC/MS, and M+1: 421.14 was obtained.

2) Synthesis of Intermediate 1-2

Intermediate 1-2 was obtained by reacting Intermediate 1-1 with 9H-carbazole (CAS: 86-74-8) under NaH conditions. Intermediate 1-2 was identified by LC/MS, and M+1: 569.11 was obtained.

3) Synthesis of Intermediate 1-3

Intermediate 1-3 was obtained by reacting Intermediate 1-2 with 4-methylbenzene sulfonyl chloride (CAS: 98-59-9) under NaH conditions. Intermediate 1-3 was identified by LC/MS, and M+1: 722.95 was obtained.

4) Synthesis of Intermediate 1-4

Intermediate 1-4 was obtained by reacting Intermediate 1-3 with dichlorodiphenylsilane (CAS: 80-10-4) under n-BuLi conditions. Intermediate 1-4 was identified by LC/MS, and M+1: 747.30 was obtained.

5) Synthesis of Intermediate 1-5

Intermediate 1-5 was obtained by reacting Intermediate 1-4 under KOH conditions. Intermediate 1-5 was identified by LC/MS, and M+1: 593.27 was obtained.

6) Synthesis of Intermediate 1-6

Intermediate 1-6 was obtained by reacting Intermediate 1-5 with 1-bromo-2-fluorobenzene (CAS: 1072-85-1) under NaH conditions. Intermediate 1-6 was identified by LC/MS, and M+1: 747.43 was obtained.

7) Synthesis of Compound 3

After stirring 3.0 g of Intermediate 1-6 under THF at about −78° C. for about 1 hour, 1.6 mL of n-BuLi was slowly added dropwisely. After about 1 hour, 1.01 g of dichlorodiphenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.16 g (yield: 70%) of Compound 3.

(2) Synthesis of Compound 15

Compound 15 of an embodiment may be synthesized by Reaction 2:

Reaction 2

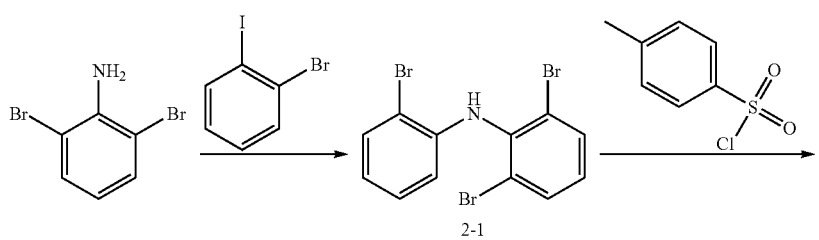

2-1

-continued
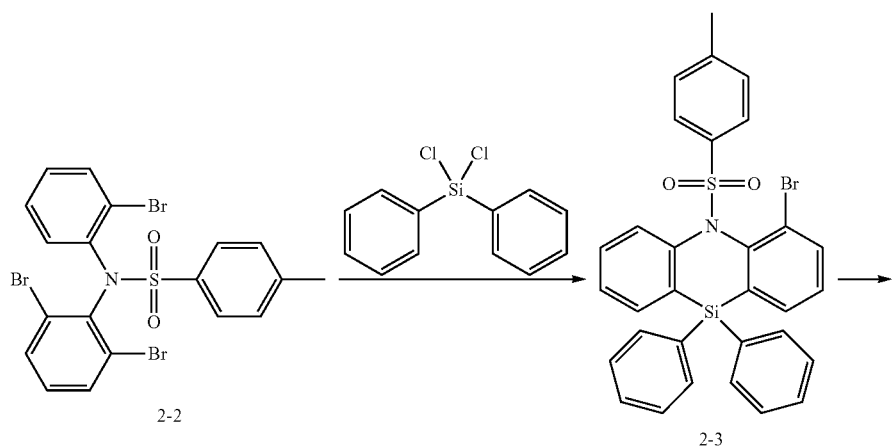
2-2     2-3
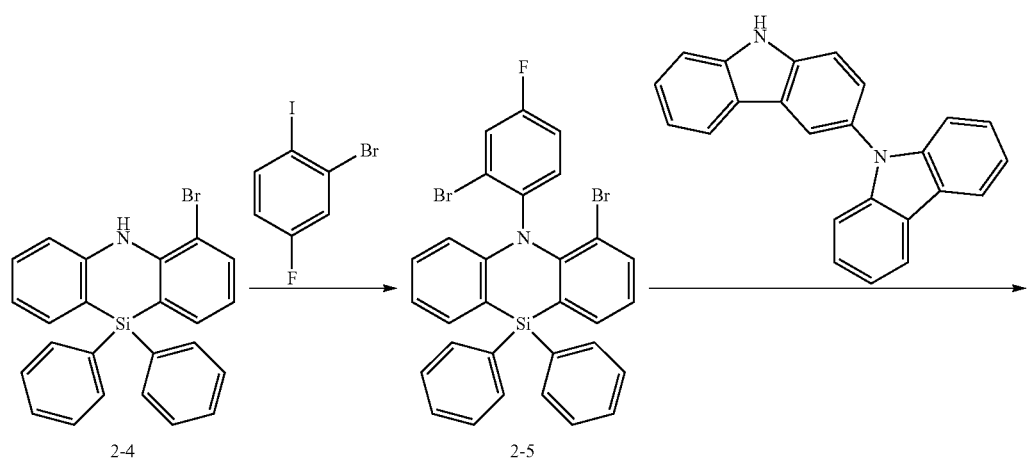
2-4     2-5
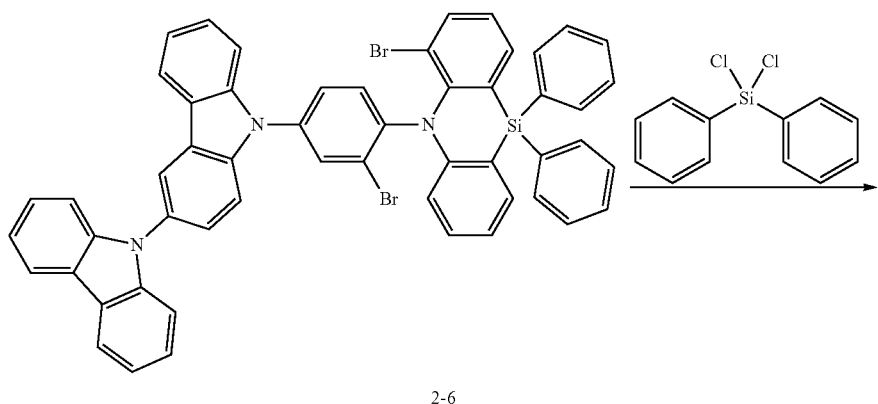
2-6

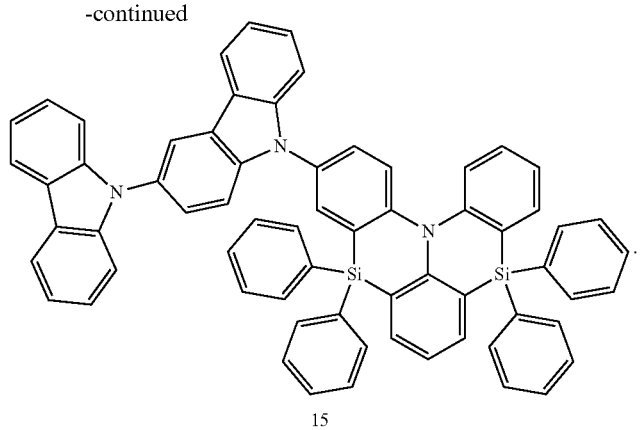

15

1) Synthesis of Intermediate 2-1

Intermediate 2-1 was obtained by reacting 2,6-dibromoaniline (CAS: 608-30-0) and 1-bromo-2-iodobenzene (CAS: 583-55-1) under Pd catalyst conditions. Intermediate 2-1 was identified by LC/MS, and M+1: 403.43 was obtained.

2) Synthesis of Intermediate 2-2

Intermediate 2-2 was obtained by reacting Intermediate 2-1 with 4-methylbenzene sulfonyl chloride (CAS: 98-59-9) under NaH conditions. Intermediate 2-2 was identified by LC/MS, and M+1: 557.91 was obtained.

3) Synthesis of Intermediate 2-3

Intermediate 2-3 was obtained by reacting Intermediate 2-2 with dichlorodiphenylsilane (CAS: 80-10-4) under n-BuLi conditions. Intermediate 2-3 was identified by LC/MS, and M+1: 582.22 was obtained.

4) Synthesis of Intermediate 2-4

Intermediate 2-4 was obtained by reacting Intermediate 2-3 under KOH conditions. Intermediate 2-4 was identified by LC/MS, and M+1: 428.27 was obtained.

5) Synthesis of Intermediate 2-5

Intermediate 2-5 was obtained by reacting 2-bromo-4-fluoro-1-iodobenzene (CAS: 202865-73-4) with Intermediate 2-4 under Pd catalyst conditions. Intermediate 2-5 was identified by LC/MS, and M+1: 599.43 was obtained.

6) Synthesis of Intermediate 2-6

Intermediate 2-6 was obtained by reacting 9H-3,9'-bicarbazole (CAS: 18628-07-4) with Intermediate 2-5 under NaH conditions. Intermediate 2-6 was identified by LC/MS, and M+1: 912.43 was obtained.

7) Synthesis of Compound 15

After stirring 3.92 g of Intermediate 2-6 under THF at about −78° C. for about 1 hour, 1.72 mL of n-BuLi was slowly added dropwisely. After about 1 hour, 1.09 g of dichlorodiphenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.65 g (yield: 66%) of Compound 15.

(3) Synthesis of Compound 23

Compound 23 of an embodiment may be synthesized by Reaction 3:

Reaction 3

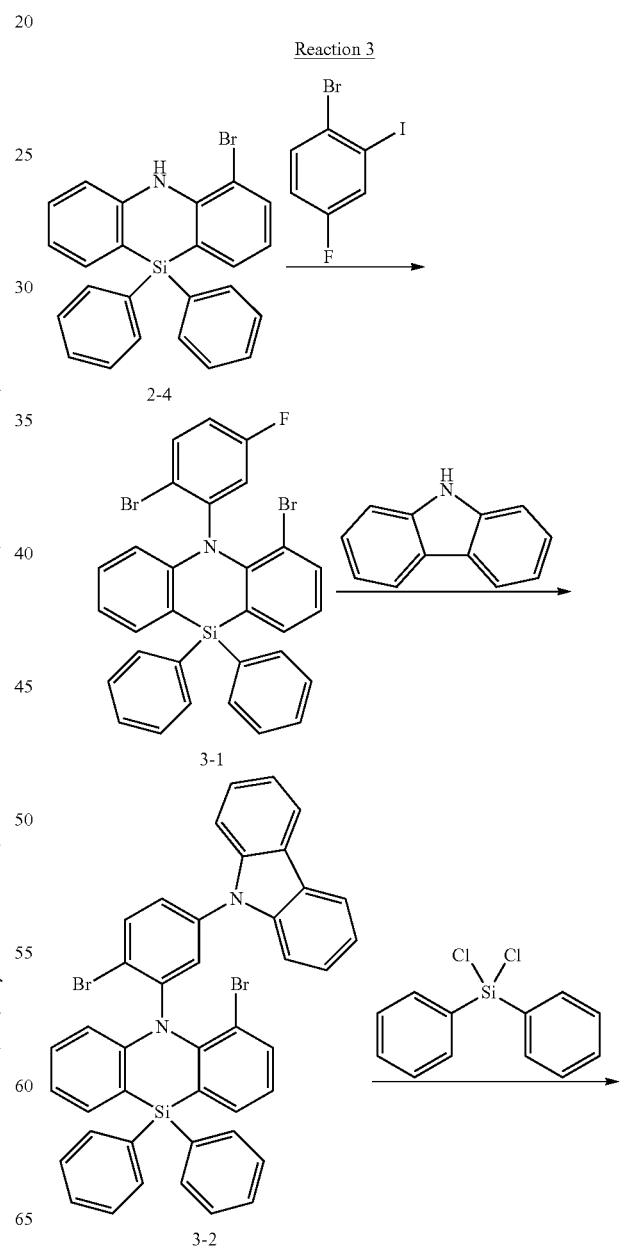

97

-continued

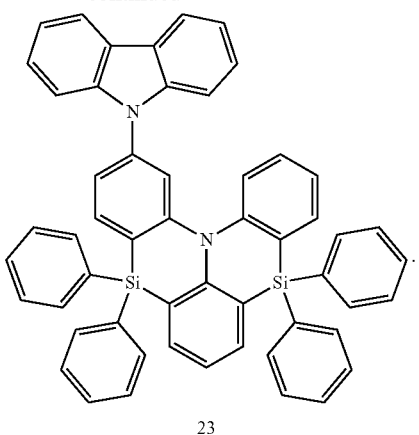

23

1) Synthesis of Intermediate 3-1

Intermediate 3-1 was obtained by reacting Intermediate 1-4 and 1-bromo-4-fluoro-2-iodobenzene (CAS: 202865-72-3) under Pd catalyst conditions. Intermediate 3-1 was identified by LC/MS, and M+1: 600.43 was obtained.

2) Synthesis of Intermediate 3-2

Intermediate 3-2 was obtained by reacting Intermediate 3-1 with 9H-carbazole (CAS: 86-74-8) under NaH conditions. Intermediate 3-2 was identified by LC/MS, and M+1: 747.43 was obtained.

3) Synthesis of Compound 37

After stirring 3.51 g of Intermediate 3-2 under THF at about −78° C. for about 1 hour, 1.88 mL of n-BuLi was slowly added dropwisely. After about 1 hour, 1.19 g of dichlorodiphenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.42 g (yield: 67%) of Compound 23.

(4) Synthesis of Compound 37

Compound 37 of an embodiment may be synthesized by Reaction 4:

Reaction 4

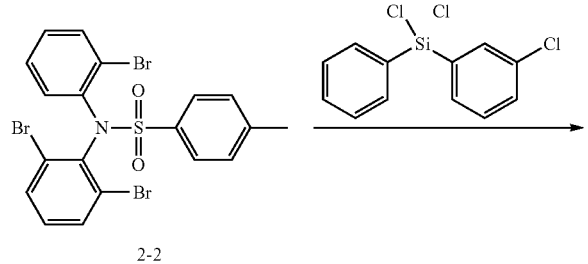

2-2

98

-continued

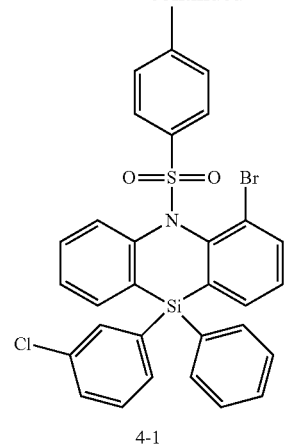

4-1

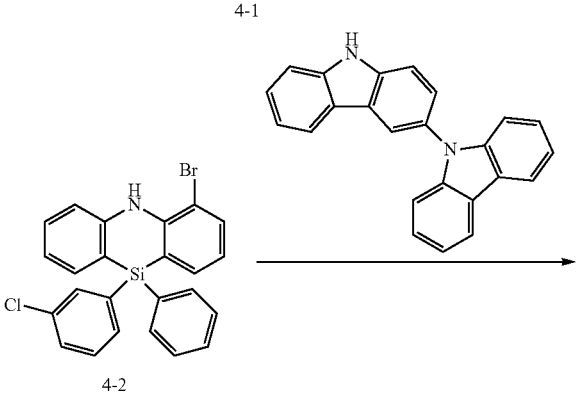

4-2

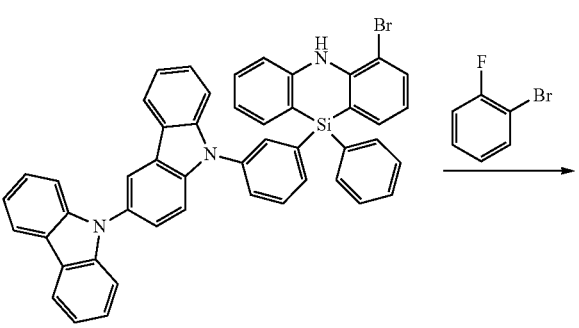

4-3

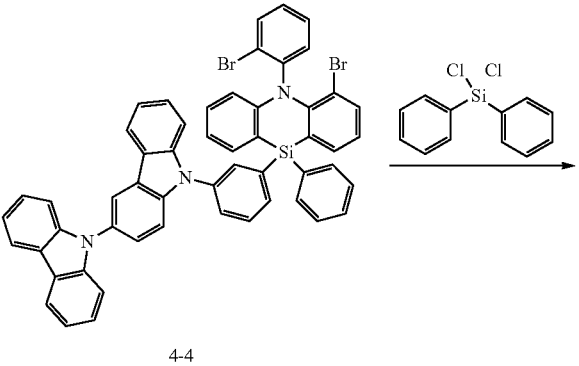

4-4

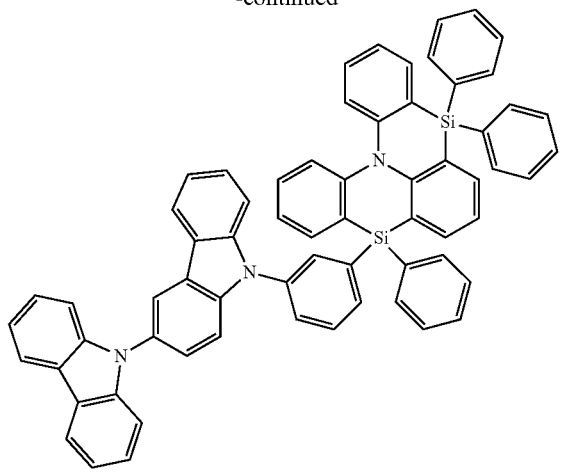

37

1) Synthesis of Intermediate 4-1

Intermediate 4-1 was obtained by reacting Intermediate 2-2 and dichloro(3-chlorophenyl)(phenyl)silane (CAS: 36964-84-8) under n-BuLi conditions. Intermediate 4-1 was identified by LC/MS, and M+1: 707.99 was obtained.

2) Synthesis of Intermediate 4-2

Intermediate 4-2 was obtained by reacting Intermediate 4-1 under KOH conditions. Intermediate 4-2 was identified by LC/MS, and M+1: 553.27 was obtained.

3) Synthesis of Intermediate 4-3

Intermediate 4-3 was obtained by reacting 9H-3,9'-bicarbazole (CAS: 18628-07-4) with Intermediate 4-2 under NaH conditions. Intermediate 4-3 was identified by LC/MS, and M+1: 758.25 was obtained.

4) Synthesis of Intermediate 4-4

Intermediate 4-4 was obtained by reacting Intermediate 4-3 with 1-bromo-2-fluorobenzene (CAS: 1072-85-1) under NaH conditions. Intermediate 4-4 was identified by LC/MS, and M+1: 912.31 was obtained.

5) Synthesis of Compound 37

After stirring 4.3 g of Intermediate 4-4 under THF at about −78° C. for about 1 hour, 1.88 mL of n-BuLi was slowly added dropwisely. After about 1 hour, 1.19 g of dichlorodiphenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 3.04 g (yield: 69%) of Compound 37.

(5) Synthesis of Compound 52

Compound 52 of an embodiment may be synthesized by Reaction 5:

Reaction 5

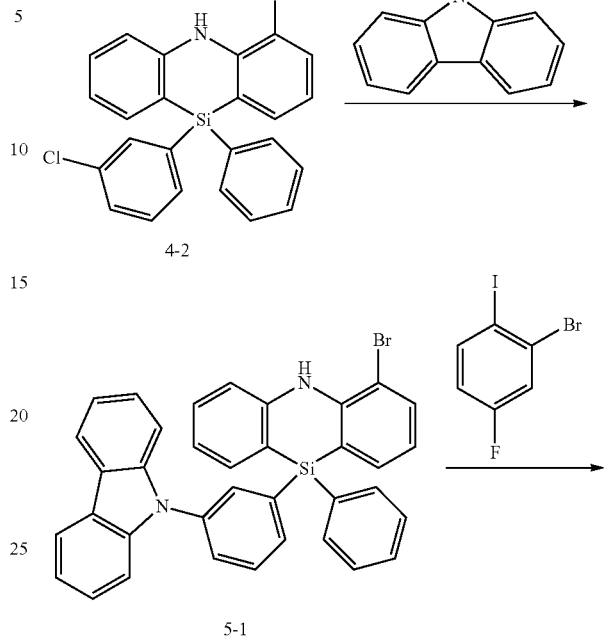

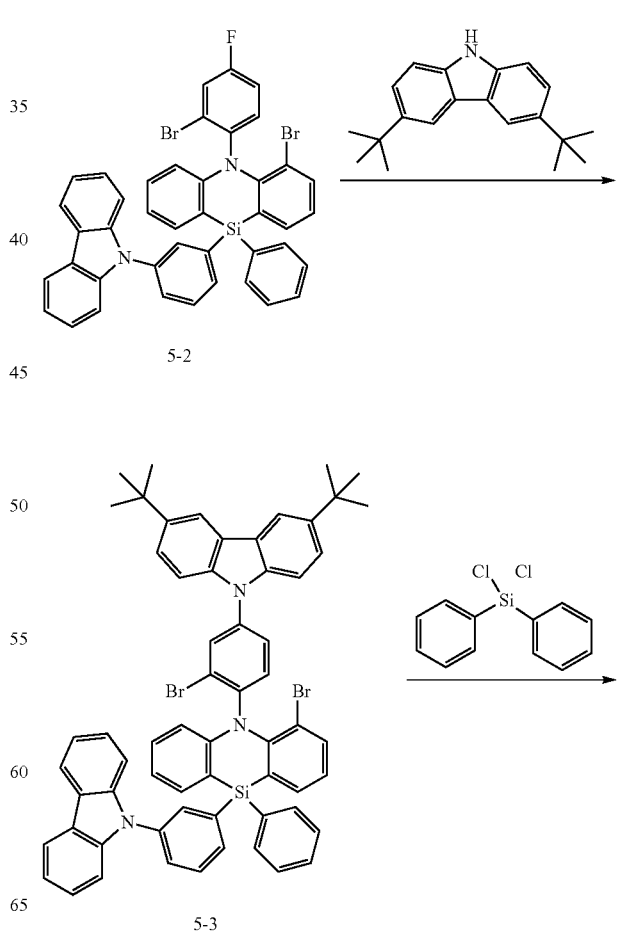

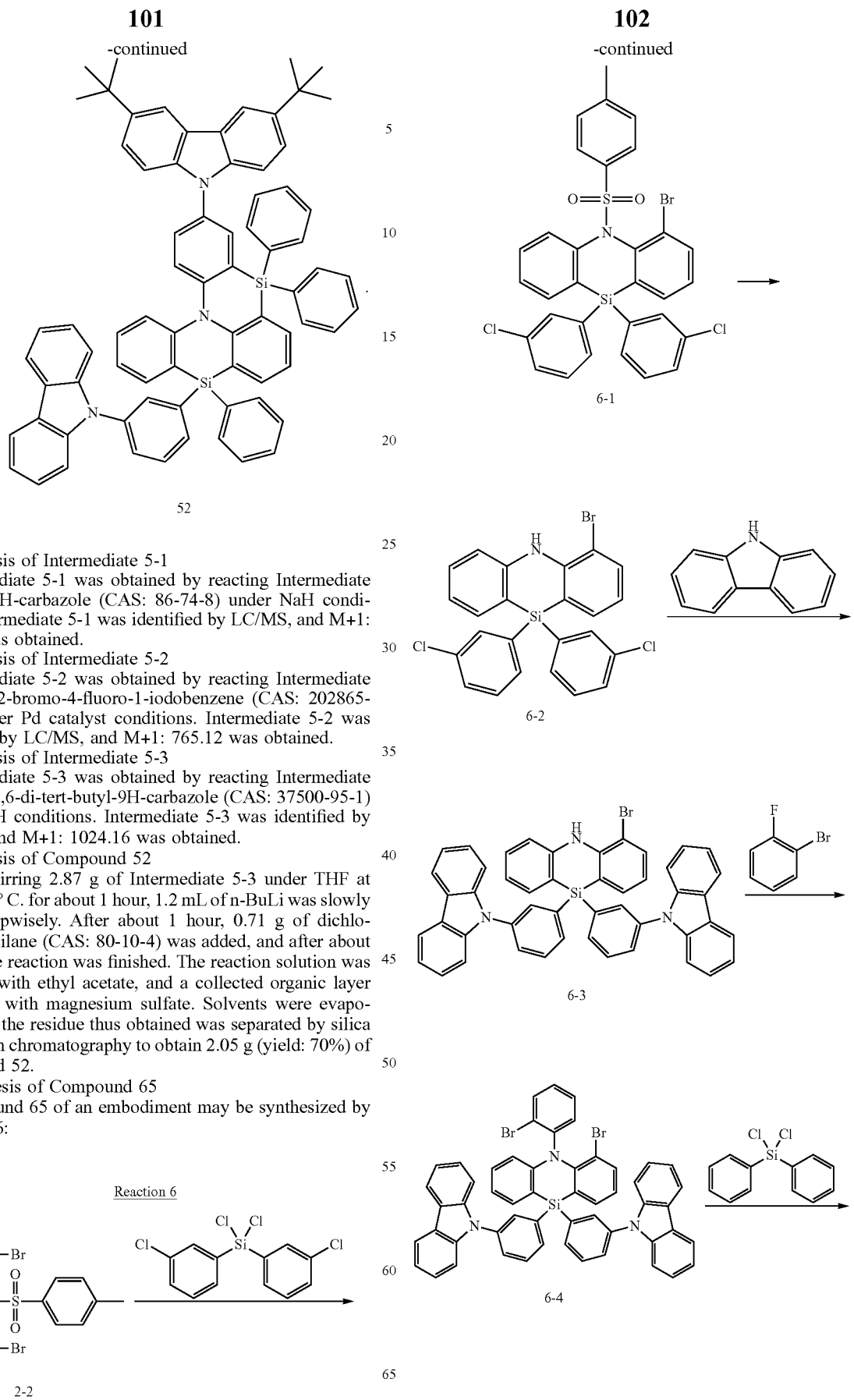

1) Synthesis of Intermediate 5-1
Intermediate 5-1 was obtained by reacting Intermediate 4-2 and 9H-carbazole (CAS: 86-74-8) under NaH conditions. Intermediate 5-1 was identified by LC/MS, and M+1: 593.41 was obtained.

2) Synthesis of Intermediate 5-2
Intermediate 5-2 was obtained by reacting Intermediate 5-1 with 2-bromo-4-fluoro-1-iodobenzene (CAS: 202865-73-4) under Pd catalyst conditions. Intermediate 5-2 was identified by LC/MS, and M+1: 765.12 was obtained.

3) Synthesis of Intermediate 5-3
Intermediate 5-3 was obtained by reacting Intermediate 5-2 with 3,6-di-tert-butyl-9H-carbazole (CAS: 37500-95-1) under NaH conditions. Intermediate 5-3 was identified by LC/MS, and M+1: 1024.16 was obtained.

4) Synthesis of Compound 52
After stirring 2.87 g of Intermediate 5-3 under THF at about −78° C. for about 1 hour, 1.2 mL of n-BuLi was slowly added dropwisely. After about 1 hour, 0.71 g of dichlorodipenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.05 g (yield: 70%) of Compound 52.

(6) Synthesis of Compound 65
Compound 65 of an embodiment may be synthesized by Reaction 6:

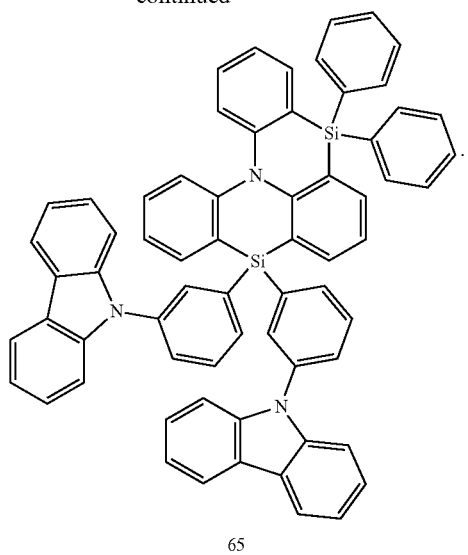

65

1) Synthesis of Intermediate 6-1

Intermediate 6-1 was obtained by reacting Intermediate 2-2 and dichlorobis(3-chlorophenyl)silane (CAS: 21993-27-1) under n-BuLi conditions. Intermediate 6-1 was identified by LC/MS, and M+1: 650.02 was obtained.

2) Synthesis of Intermediate 6-2

Intermediate 6-2 was obtained by reacting Intermediate 6-1 under KOH conditions. Intermediate 6-2 was identified by LC/MS, and M+1: 496.07 was obtained.

3) Synthesis of Intermediate 6-3

Intermediate 6-3 was obtained by reacting Intermediate 6-2 with (e.g., two equivalents of) 9H-carbazole (CAS: 86-74-8) under NaH conditions. Intermediate 6-3 was identified by LC/MS, and M+1: 758.24 was obtained.

4) Synthesis of Intermediate 6-4

Intermediate 6-4 was obtained by reacting Intermediate 6-3 with 1-bromo-2-fluorobenzene (CAS: 1072-85-1) under NaH conditions. Intermediate 6-4 was identified by LC/MS, and M+1: 912.23 was obtained.

5) Synthesis of Compound 65

After stirring 4.22 g of Intermediate 5-3 under THF at about −78° C. for about 1 hour, 1.85 mL of n-BuLi was slowly added dropwisely. After about 1 hour, 1.17 g of dichlorodiphenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.59 g (yield: 60%) of Compound 65.

(7) Synthesis of Compound 70

Compound 70 of an embodiment may be synthesized by Reaction 7:

Reaction 7

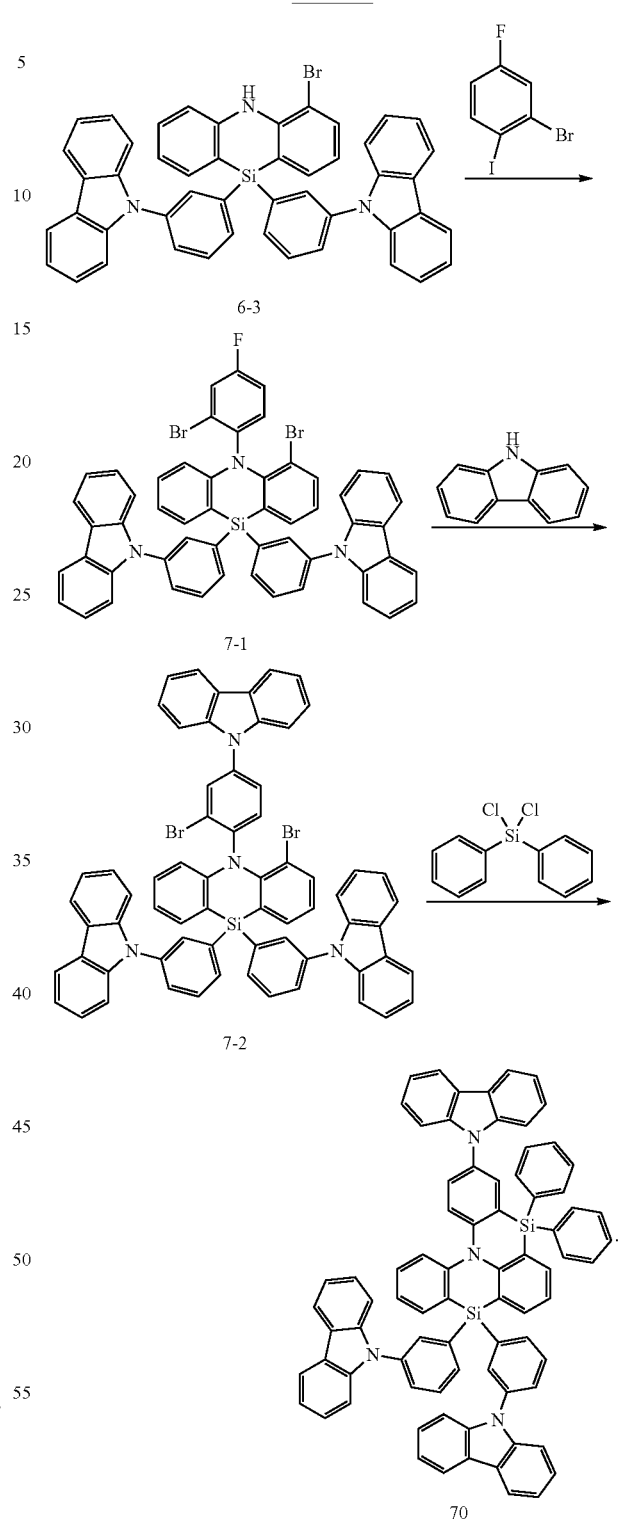

1) Synthesis of Intermediate 7-1

Intermediate 7-1 was obtained by reacting Intermediate 6-3 and 2-bromo-4-fluoro-1-iodobenzene (CAS: 202865-73-4) under Pd catalyst conditions. Intermediate 7-1 was identified by LC/MS, and M+1: 930.30 was obtained.

2) Synthesis of Intermediate 7-2

Intermediate 7-2 was obtained by reacting Intermediate 7-1 with 9H-carbazole (CAS: 86-74-8) under NaH conditions. Intermediate 7-2 was identified by LC/MS, and M+1: 1077.22 was obtained.

3) Synthesis of Compound 70

After stirring 3.10 g of Intermediate 7-2 under THF at about −78° C. for about 1 hour, 1.15 mL of n-BuLi was slowly added dropwisely. After about 1 hour, 0.73 g of dichlorodiphenylsilane (CAS: 80-10-4) was added, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.15 g (yield: 68%) of Compound 70.

(8) Synthesis of Compound 76

Compound 76 of an embodiment may be synthesized by Reaction 8:

Reaction 8

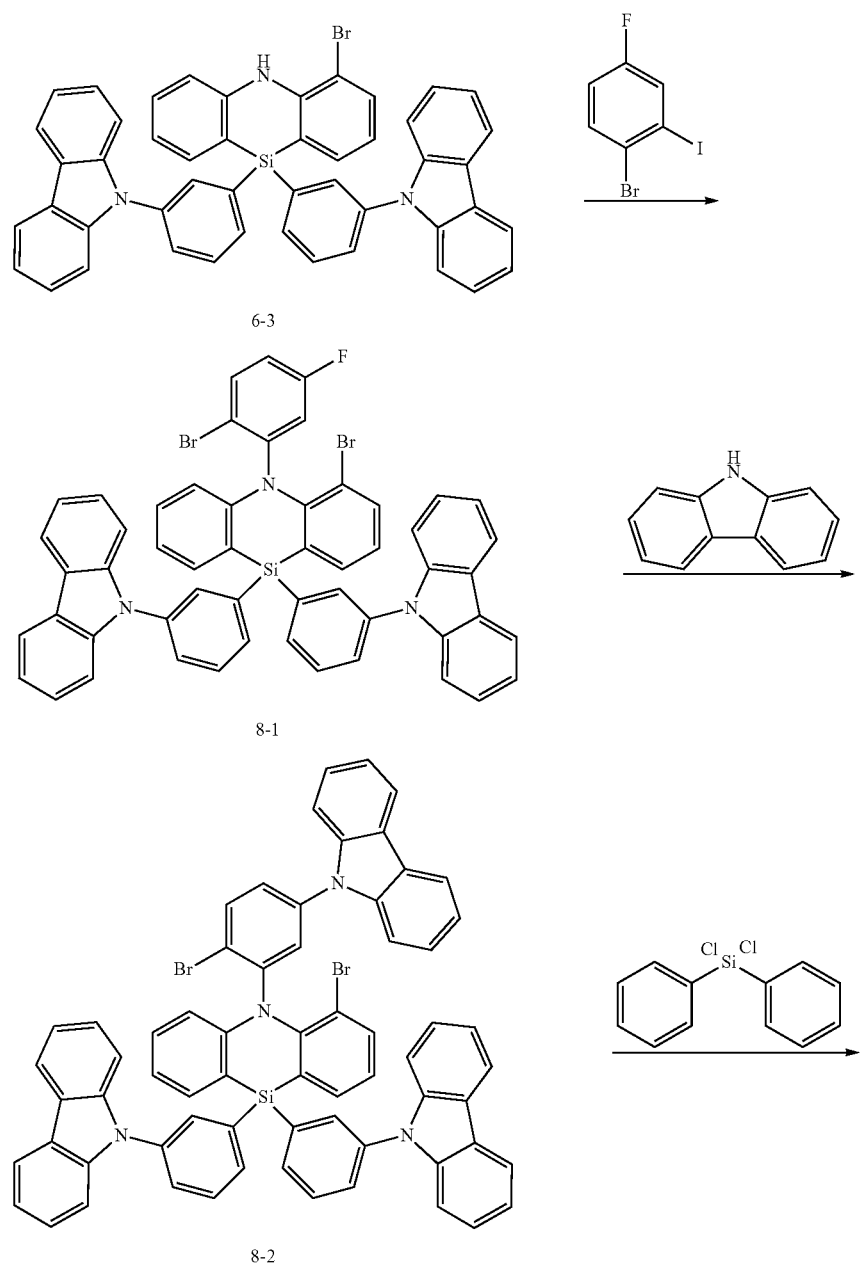

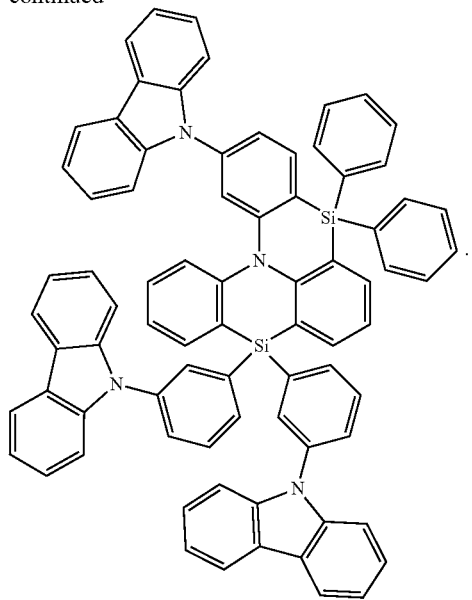

76

1) Synthesis of Intermediate 8-1

Intermediate 8-1 was obtained by reacting Intermediate 6-3 and 1-bromo-4-fluoro-2-iodobenzene (CAS: 202865-72-3) under Pd catalyst conditions. Intermediate 8-1 was identified by LC/MS, and M+1: 930.33 was obtained.

2) Synthesis of Intermediate 8-2

Intermediate 8-2 was obtained by reacting Intermediate 8-1 with 9H-carbazole (CAS: 86-74-8) under NaH conditions. Intermediate 8-2 was identified by LC/MS, and M+1: 1077.27 was obtained.

3) Synthesis of Compound 76

After stirring 3.05 g of Intermediate 7-2 under THF at about −78° C. for about 1 hour, 1.13 mL of n-BuLi was slowly added dropwisely. After about 1 hour, 0.72 g of dichlorodiphenylsilane (CAS: 80-10-4) was put, and after about 1 hour, the reaction was finished. The reaction solution was extracted with ethyl acetate, and a collected organic layer was dried with magnesium sulfate. Solvents were evaporated, and the residue thus obtained was separated by silica gel column chromatography to obtain 2.21 g (yield: 71%) of Compound 76.

$^1$H NMR and MS/FAB of each of Example Compounds 3, 15, 23, 37, 52, 65, 70, and 76, synthesized in the Synthetic Examples, are shown in Table 1:

TABLE 1

| Compound | $^1$H NMR (CDCl$_3$, 400 MHz) | MS/FAB found | MS/FAB calc. |
|---|---|---|---|
| Compound 3 | 8.55 (d, 1H), 8.19(d, 1H), 7.94(d, 1H), 7.72(s, 2H), 7.58(d, 1H), 7.51-7.28(m, 28H), 7.20(t, 2H), 7.03(t, 2H) | 771.11 | 770.26 |
| Compound 15 | 8.55(d, 2H), 8.19(d, 1H), 7.94(d, 2H), 7.79(d, 1H), 7.72-7.69(m, 2H), 7.58-7.16(m, 36H), 7.03(t, 1H) | 936.09 | 935.32 |
| Compound 23 | 8.55(d, 1H), 8.10(d, 1H), 7.94(d, 1H), 7.58-7.16(m, 34H), 7.03(t, 1H) | 771.17 | 770.26 |
| Compound 37 | 8.55(d, 2H), 8.19(d, 1H), 7.94(d, 2H), 7.72-7.67(m, 3H), 7.58(m, 36H), 7.03(t, 1H) | 936.16 | 935.32 |
| Compound 52 | 8.95(s, 1H), 8.55(d, 1H), 8.36(s, 1H), 8.19(, 1H), 7.94(d, 1H), 7.86(d, 1H), 7.79(d, 1H), 7.62-7.11(m, 48H), 1.43(t, 6H) | 1048.34 | 1047.44 |
| Compound 65 | 8.55(d, 1H), 8.19(d, 2H), 7.94(d, 2H), 7.66-7.16(m, 39H), 7.03(t, 1H) | 936.28 | 935.32 |
| Compound 70 | 8.55(d, 3H), 8.19(d, 3H), 7.94(d, 3H), 7.79(d, 1H), 7.60-16(m, 41H), 7.03(t, 1H) | 1101.38 | 1100.37 |
| Compound 76 | 8.55(d, 3H), 8.19(d, 3H), 7.94(d, 3H), 7.60-7.16(m, 42H), 7.03(t, 1H) | 1101.33 | 1100.37 |

2. Evaluation of Energy Levels of Compounds

The light-emitting properties of fused polycyclic compounds of embodiments, and organic electroluminescence devices of embodiments including the fused polycyclic compounds of embodiments in an emission layer were evaluated as follows. The method for manufacturing an organic electroluminescence device for device evaluation is explained below.

Organic electroluminescence devices of Example 1 to Example 8 were manufactured utilizing the fused polycyclic compounds of Example Compounds 3, 15, 23, 37, 52, 65, 70, and 76, respectively, as host materials of an emission layer.

Organic electroluminescence devices of Comparative Example 1 and Comparative Example 2 were manufactured utilizing Comparative Compounds C1 and C2, respectively, as host materials of an emission layer.

Example Compounds

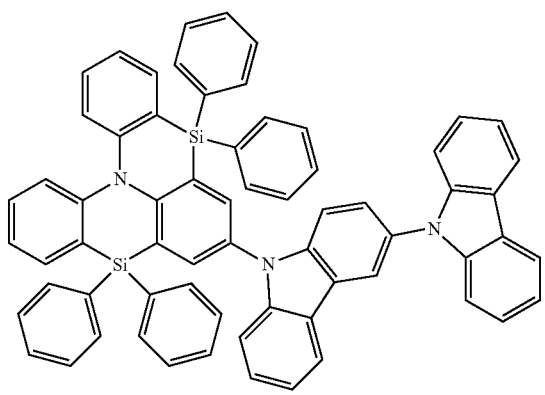

3

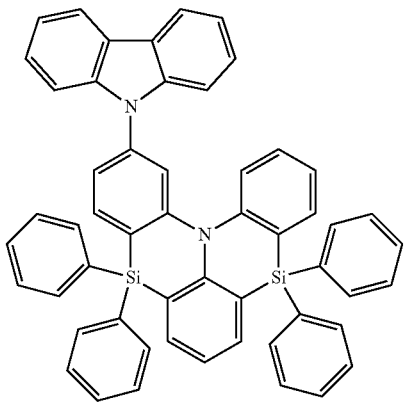

23

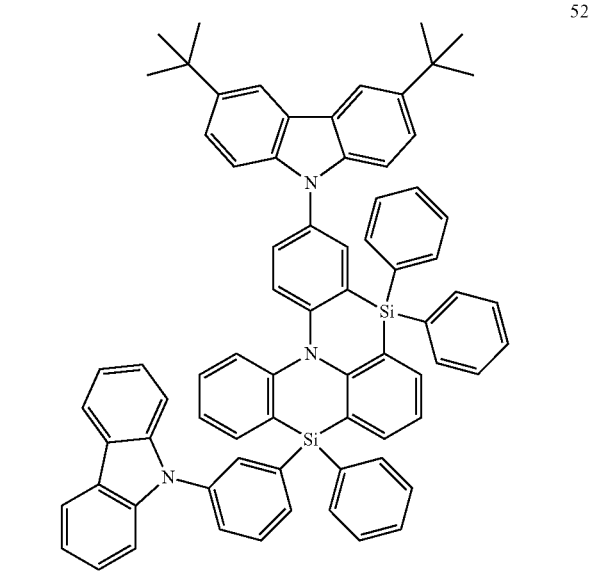

37

52

111
-continued
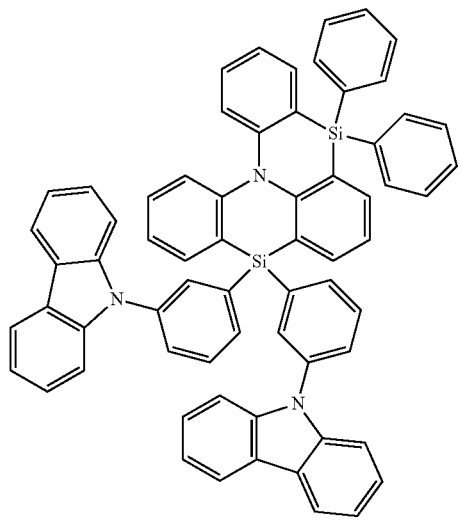
65
112
-continued
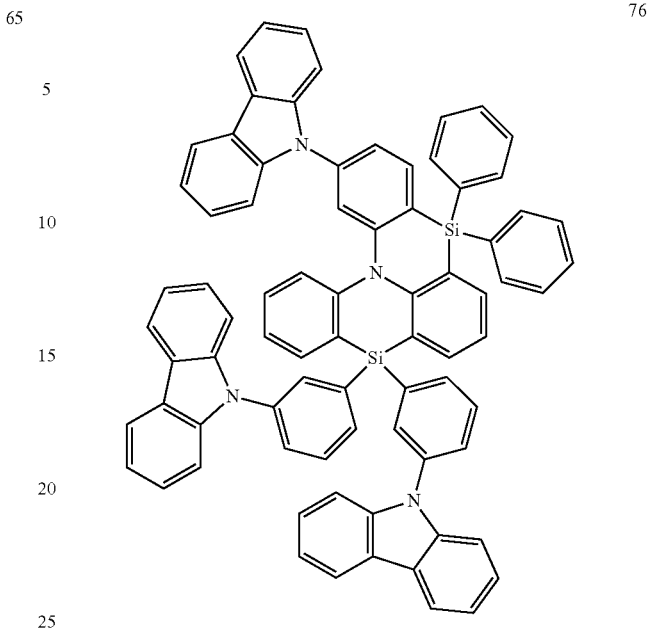
76
Comparative Compounds
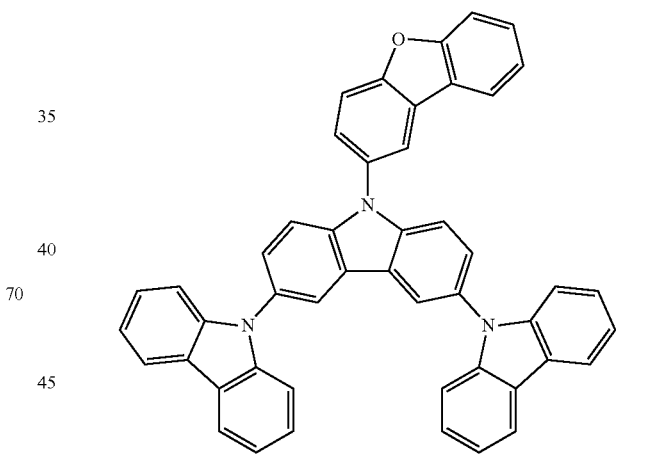
C1
C2
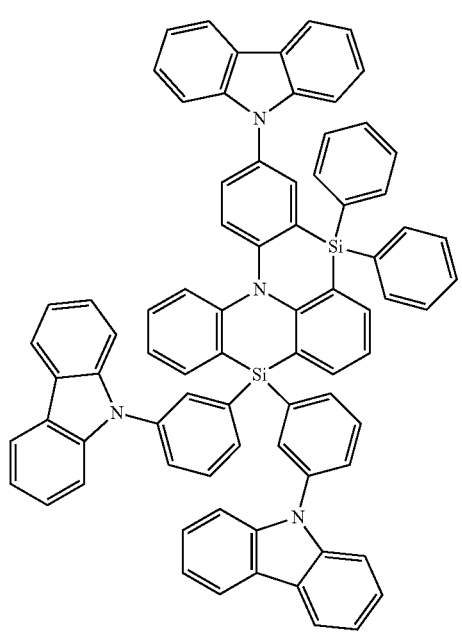
70
3. Manufacture of Organic Electroluminescence Device
An ITO substrate with a thickness of about 1,200 Å was used as a first electrode. The ITO substrate was prepared by washing with ultrasonic waves in isopropyl alcohol and pure water for about 5 minutes each, exposing to ultraviolet rays for about 30 minutes, and washing by exposing to ozone. Then, the ITO substrate thus washed was installed in a vacuum deposition apparatus.

On the ITO substrate thus washed and prepared, N,N'-di(naphthalen-1-yl)-N,N'-diphenyl-benzidine (NPB) was vacuum deposited to form a hole injection layer. The hole injection layer was formed to a thickness of about 300 Å. Then, on the hole injection layer, mCP was vacuum deposited to form a hole transport layer. The hole transport layer was formed to a thickness of about 200 Å.

Then, on the hole transport layer, an emission layer including the fused polycyclic compound of an embodiment was formed. The emission layer was formed by co-depositing the fused polycyclic compound of an embodiment or Comparative Compound with a dopant material of Ir(pmp)$_3$ in a weight ratio of 92:8 to a thickness of about 250 Å. For example, in Example 1 to Example 10, each of Compounds 3, 15, 23, 37, 52, 65, 70, and 76 was mixed with a dopant and deposited, and in Comparative Example 1 and Comparative Example 2, each of Comparative Compounds C1 and C2 was mixed with a dopant and deposited to form the emission layer.

Then, on the emission layer, 3-(4-biphenylyl)-4-phenyl-5-tert-butylphenyl-1,2,4-triazole (TAZ) was deposited to a thickness of about 200 Å as an electron transport layer, and on the electron transport layer, an alkali metal halide of LiF was deposited to a thickness of about 10 Å to form an electron injection layer. Al was vacuum deposited to a thickness of about 100 Å to form a second electrode. By forming a LiF/Al electrode, an organic electroluminescence device was manufactured.

The materials used in the organic electroluminescence device may be represented by the structures below:

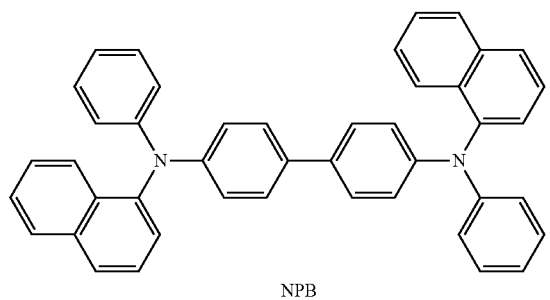

NPB

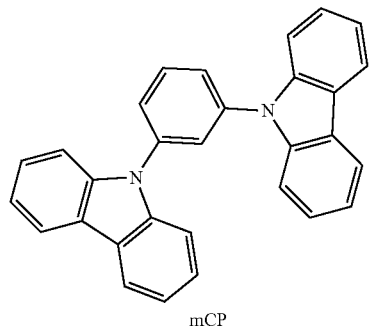

mCP

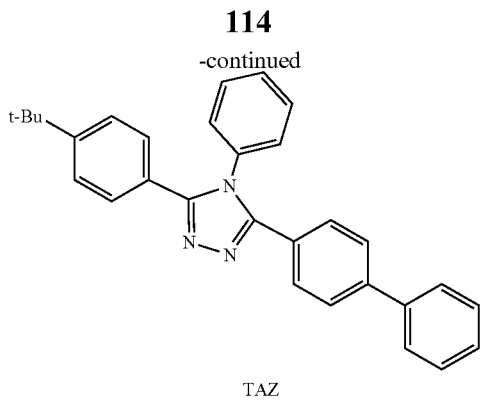

TAZ

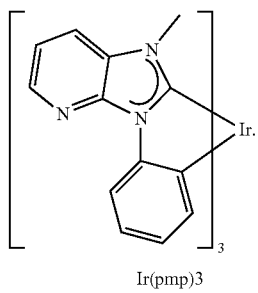

Ir(pmp)3

4. Evaluation of Properties of Organic Electroluminescence Device

In Table 2, the evaluation results of the organic electroluminescence devices of Example 1 to Example 8, Comparative Example 1, and Comparative Example 2 are shown. The driving voltage (V), efficiency (Cd/A), maximum quantum efficiency (%), and luminous color in the light-emitting wavelength region of each of the organic electroluminescence devices thus manufactured are compared and shown in Table 2.

In the property evaluation results on the Examples and Comparative Examples shown in Table 2, the driving voltage, current density and maximum quantum efficiency were measured at a current density of about 10 mA/cm$^2$. The driving voltage and current density were measured utilizing a source meter (Keithley Instrument Co., 2400 series), and the maximum quantum efficiency was measured utilizing an external quantum efficiency measurement apparatus (C9920-12 of Hamamatsu Photonics Co). For the evaluation of the maximum quantum efficiency, luminance/current density was measured utilizing a brightness photometer of which wavelength sensitivity was calibrated, and the maximum quantum efficiency was converted by assuming angular luminance distribution (Lambertian) introducing a perfect diffusion reflecting surface. The evaluation results of the properties of the organic electroluminescence devices are shown in Table 2:

TABLE 2

| Division | Emission layer | Driving voltage (V) | Efficiency (Cd/A) | Maximum quantum efficiency (%) | FWHM (nm) | Luminous color |
|---|---|---|---|---|---|---|
| Example 1 | Compound 3 | 4.4 | 17.2 | 28.3 | 24 | Blue |
| Example 2 | Compound 15 | 4.2 | 16.8 | 27.6 | 24 | Blue |
| Example 3 | Compound 23 | 4.5 | 16.0 | 27.2 | 24 | Blue |
| Example 4 | Compound 37 | 4.7 | 17.0 | 28.0 | 24 | Blue |
| Example 5 | Compound 52 | 4.7 | 16.7 | 27.5 | 24 | Blue |
| Example 6 | Compound 65 | 4.4 | 16.5 | 27.9 | 24 | Blue |
| Example 7 | Compound 70 | 4.7 | 16.7 | 27.5 | 24 | Blue |
| Example 8 | Compound 76 | 4.7 | 16.6 | 27.5 | 24 | Blue |
| Comparative Example 1 | Comparative Compound C1 | 5.7 | 12.8 | 22.4 | 32 | Blue |
| Comparative Example 2 | Comparative Compound C2 | 5.1 | 14.8 | 25.3 | 30 | Blue |

Referring to the results in Table 2, it could be found that the organic electroluminescence devices of Example 1 to Example 8 including the fused polycyclic compounds of embodiments each showed excellent emission efficiency in a blue emission region. For example, the organic electroluminescence devices of Example 1 to Example 8 each showed better emission efficiency at a low driving voltage than the organic electroluminescence devices of Comparative Example 1 and Comparative Example 2. The organic electroluminescence devices of Example 1 to Example 8 each had a maximum quantum efficiency in a range of about 27.2% to about 28.3%, which is higher than the maximum quantum efficiency values of about 22.4% and about 25.3% in Comparative Examples 1 and 2, respectively.

With respect to the full width at half maximum (FWHM), the organic electroluminescence devices of Example 1 to Example 8 each had a value of about 24 nm, which is relatively narrow considering the FWHM value of about 30 nm or more of the devices of Comparative Examples 1 and 2.

The fused polycyclic compound according to an embodiment of the present disclosure includes a skeleton (e.g., structure) in which a silicon atom and multiple aromatic rings are fused at a central nitrogen atom and includes a C—Si bond, and which may be structurally stable. Due to the structure, the fused polycyclic compound of an embodiment may have improved electron mobility and/or a high level of the lowest triplet excitation energy ($T_1$).

The organic electroluminescence device of an embodiment includes the fused polycyclic compound and may show high emission efficiency and/or high maximum quantum efficiency at a low driving voltage, and may be to emit blue light having a narrow full width at half maximum.

The organic electroluminescence device according to an embodiment of the present disclosure has excellent emission efficiency.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments, and one or more suitable changes and modifications can be made by one ordinarily skilled in the art within the spirit and scope of the present disclosure, as set forth in the following claims and equivalents thereof.

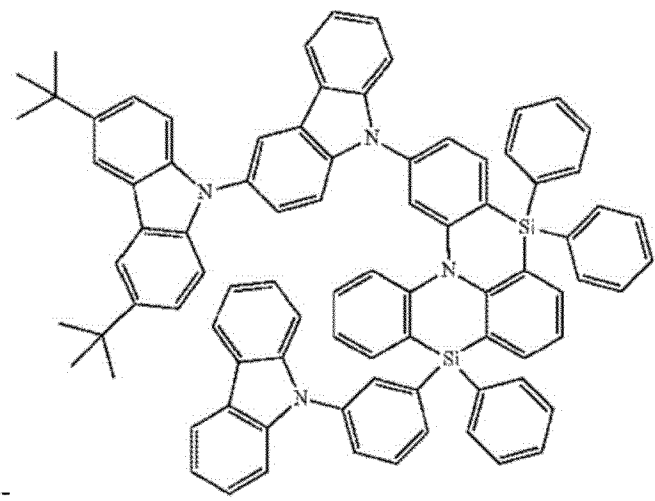

What is claimed is:

1. An organic electroluminescence device, comprising:
   a first electrode;
   a second electrode opposite the first electrode; and
   multiple organic layers between the first electrode and the second electrode,
   wherein at least one organic layer selected from the multiple organic layers comprises a fused polycyclic compound,
   wherein the fused polycyclic compound comprises:
   a nitrogen atom at which a first phenyl group, a second phenyl group, and a third phenyl group are substituted;
   a first silicon atom connecting the first phenyl group and the second phenyl group; and
   a second silicon atom connecting the second phenyl group and the third phenyl group, and
   wherein a fourth phenyl group and a fifth phenyl group are each connected with the first silicon atom,
   a sixth phenyl group and a seventh phenyl group are each connected with the second silicon atom,
   a nitrogen-containing substituent is substituted on at least one selected from the first to seventh phenyl groups, and
   the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn and Yb, a compound of two or more thereof, a mixture of two or more thereof, or an oxide thereof.

2. The organic electroluminescence device of claim 1, wherein the multiple organic layers comprise a hole transport region, an emission layer, and an electron transport region, and
   the fused polycyclic compound is comprised in the emission layer.

3. The organic electroluminescence device of claim 2, wherein the emission layer is to emit thermally activated delayed fluorescence or phosphorescence.

4. The organic electroluminescence device of claim 2, wherein the emission layer is to emit light having a central wavelength of about 420 nm to about 470 nm.

5. The organic electroluminescence device of claim 2, wherein the emission layer comprises a host and a dopant, and
the host comprises the fused polycyclic compound.

6. The organic electroluminescence device of claim 1, wherein the nitrogen-containing substituent is substituted by one, two or three phenyl groups selected from the first to seventh phenyl groups.

7. The organic electroluminescence device of claim 1, wherein at least one phenyl group selected from the first to seventh phenyl groups is an unsubstituted phenyl group.

8. The organic electroluminescence device of claim 1, wherein the nitrogen-containing substituent is a substituted or unsubstituted diphenylamine group, or a substituted or unsubstituted carbazole group.

9. An organic electroluminescence device, comprising:
a first electrode;
a second electrode opposite the first electrode; and
multiple organic layers between the first electrode and the second electrode,
wherein at least one organic layer selected from the multiple organic layers comprises a fused polycyclic compound, and
the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn and Yb, a compound of two or more thereof, a mixture of two or more thereof, or an oxide thereof,
wherein the fused polycyclic compound is represented by Formula 1:

Formula 1

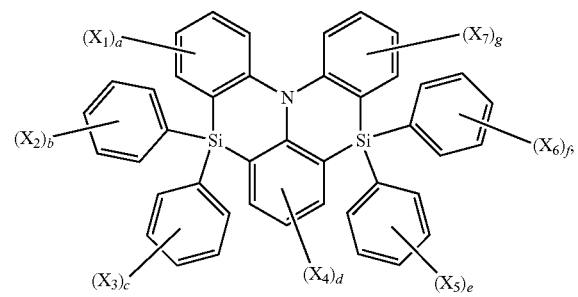

wherein, in Formula 1,
$X_1$ to $X_7$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, a substituted or unsubstituted heteroaryl group of 2 to 30 ring-forming carbon atoms, or represented by Formula 2,
"a" is an integer of 0 to 4,
"b" and "c" are each independently an integer of 0 to 5,
"d" is an integer of 0 to 3,
"e" and "f" are each independently an integer of 0 to 5,
"g" is an integer of 0 to 4, and
at least one selected from $X_1$ to $X_7$ is represented by Formula 2:

Formula 2

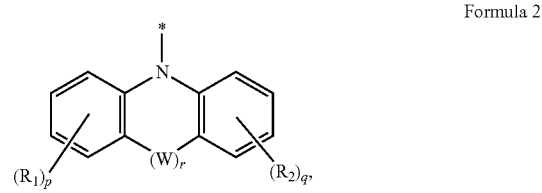

and
wherein, in Formula 2,
$R_1$ and $R_2$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or are optionally combined with an adjacent group to form a ring,
"p" and "q" are each independently an integer of 0 to 4,
"W" is a direct linkage, and
"r" is 0 or 1.

10. The organic electroluminescence device of claim 9, wherein any one selected from $X_1$ to $X_7$ is represented by Formula 2.

11. The organic electroluminescence device of claim 9, wherein any two selected from $X_1$ to $X_7$ are each independently represented by Formula 2.

12. The organic electroluminescence device of claim 9, wherein any three selected from $X_1$ to $X_7$ are each independently represented by Formula 2.

13. The organic electroluminescence device of claim 9, wherein the fused polycyclic compound represented by Formula 1 is represented by any one selected from Formula 1-1a to Formula 1-1c:

Formula 1-1a

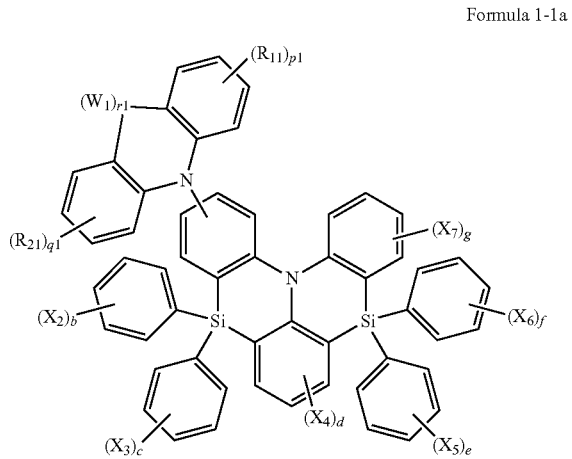

Formula 1-1b

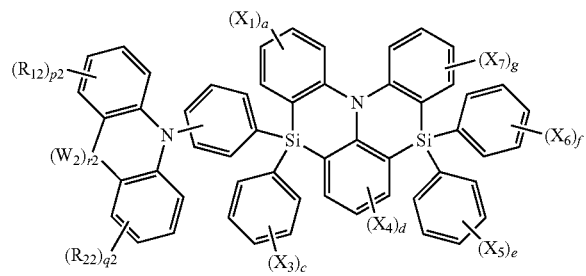

Formula 1-1c

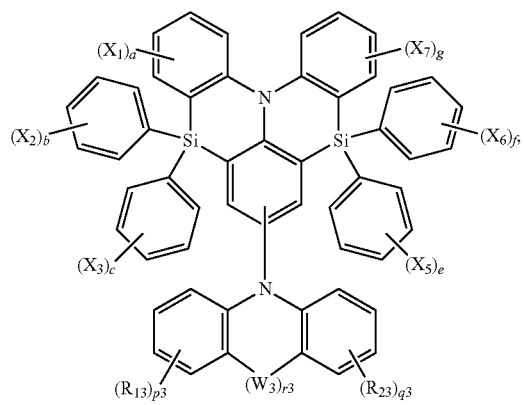

and wherein, in Formula 1-1a to Formula 1-1c, $R_{11}$, $R_{12}$, $R_{13}$, $R_{21}$, $R_{22}$, and $R_{23}$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or are optionally combined with an adjacent group to form a ring, p1, p2, p3, q1, q2, and q3 are each independently an integer of 0 to 5, $W_1$, $W_2$, and $W_3$ are each independently a direct linkage, r1, r2, and r3 are each independently 0 or 1, and $X_1$ to $X_7$, and "a" to "g" are each independently the same as defined in Formula 1 and Formula 2.

14. The organic electroluminescence device of claim 9, wherein the fused polycyclic compound represented by Formula 1 is represented by any one selected from Formula 1-2a and Formula 1-2b:

Formula 1-2a

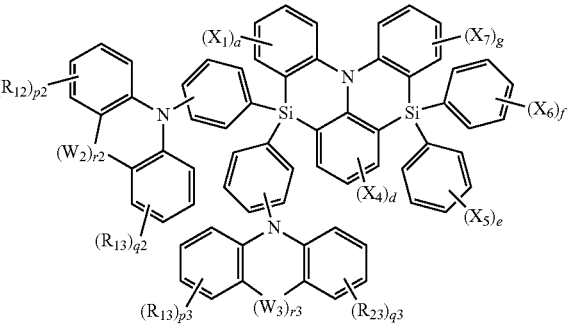

Formula 1-2b

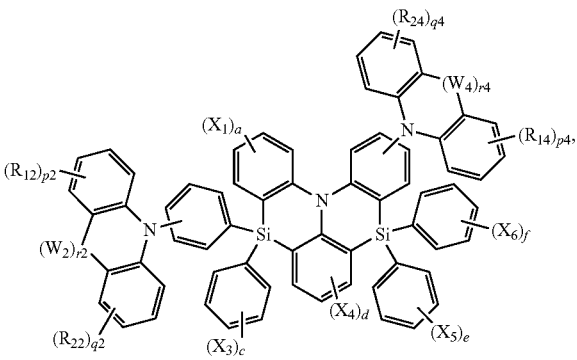

and wherein, in Formula 1-2a and Formula 1-2b, $R_{12}$, $R_{13}$, $R_{14}$, $R_{22}$, $R_{23}$, and $R_{24}$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or are optionally combined with an adjacent group to form a ring, p2, p3, p4, q2, q3, and q4 are each independently an integer of 0 to 5, $W_2$, $W_3$, and $W_4$ are each independently a direct linkage, r2, r3, and r4 are each independently 0 or 1, and $X_1$ to $X_7$, and "a" to "g" are each independently the same as defined in Formula 1 and Formula 2.

15. The organic electroluminescence device of claim 9, wherein the fused polycyclic compound represented by Formula 1 is represented by Formula 1-3:

Formula 1-3

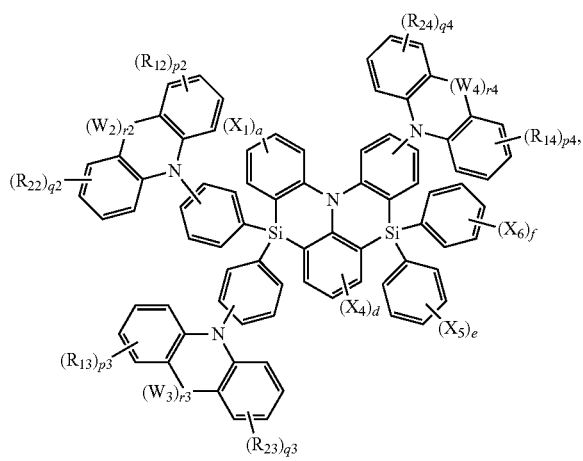

wherein, in Formula 1-3, $R_{12}$, $R_{13}$, $R_{14}$, $R_{22}$, $R_{23}$, and $R_{24}$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or are optionally combined with an adjacent group to form a ring, p2, p3, p4, q2, q3, and q4 are each independently an integer of 0 to 5, $W_2$, $W_3$, and $W_4$ are each independently a direct linkage, r2, r3, and r4 are each independently 0 or 1, and $X_1$ to $X_7$, and "a" to "g" are each independently the same as defined in Formula 1 and Formula 2.

16. The organic electroluminescence device of claim 9, wherein Formula 2 is represented by Formula 2-1 or Formula 2-2:

Formula 2-1

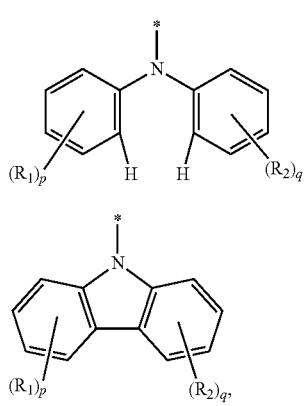

Formula 2-2 and wherein, in Formula 2-1 and Formula 2-2, $R_1$, $R_2$, "p", and "q" are each independently the same as defined in Formula 2.

17. The organic electroluminescence device of claim 9, wherein $R_1$ and $R_2$ are each independently a hydrogen atom, a substituted or unsubstituted silyl group, a substituted or unsubstituted alkyl group of 1 to 30 carbon atoms, or a substituted or unsubstituted heteroaryl group of 2 to 30 ring-forming carbon atoms.

18. The organic electroluminescence device of claim 9, wherein the fused polycyclic compound represented by Formula 1 comprises at least one selected from compounds represented in Compound Group 1:

Compound Group 1

1

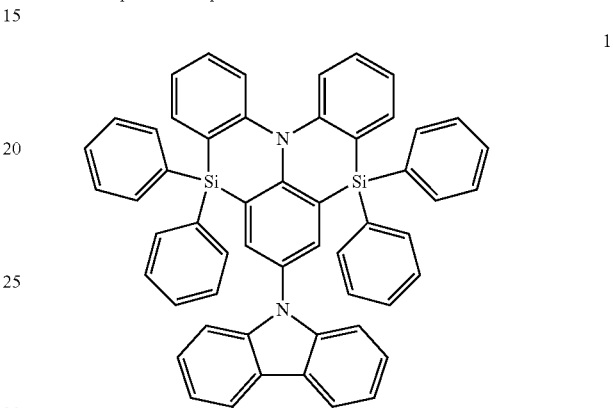

2

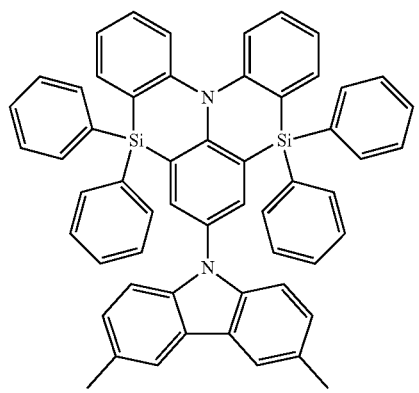

3

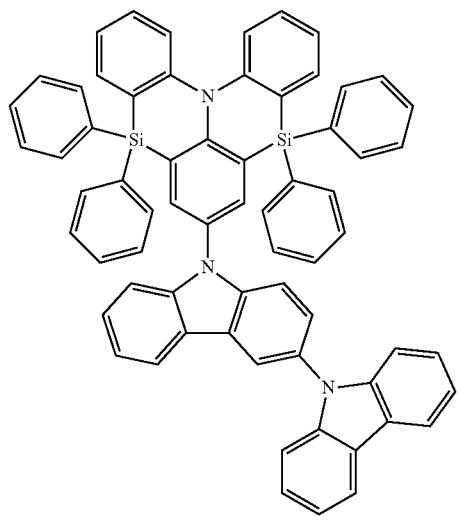

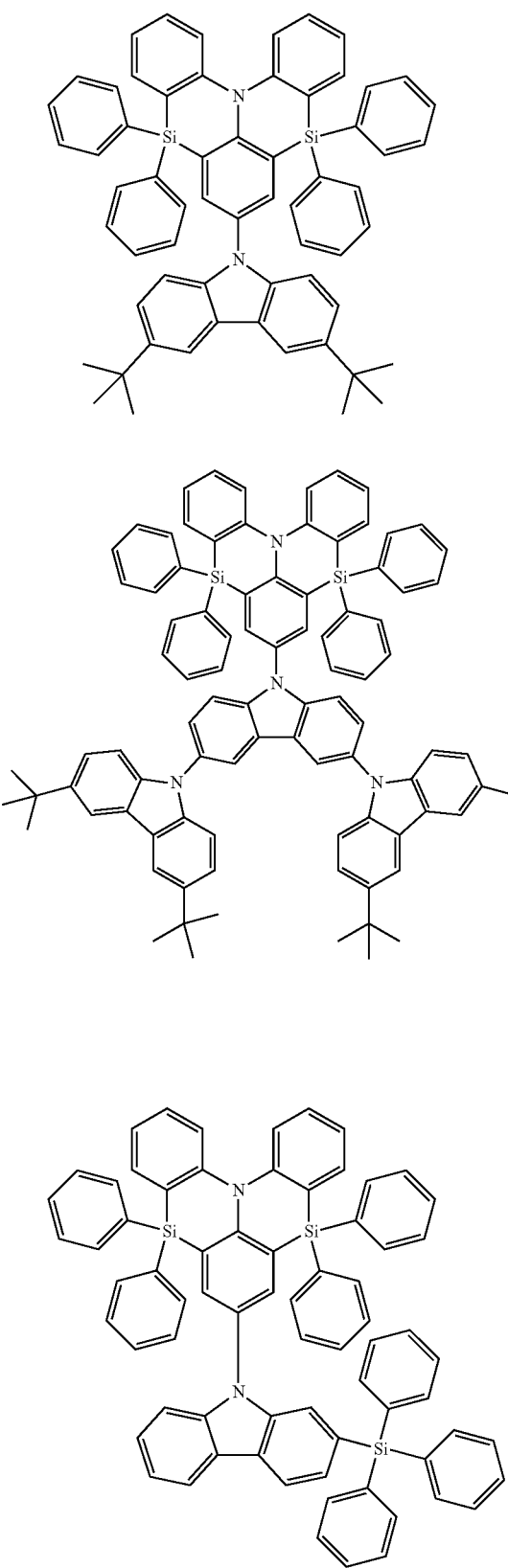

10
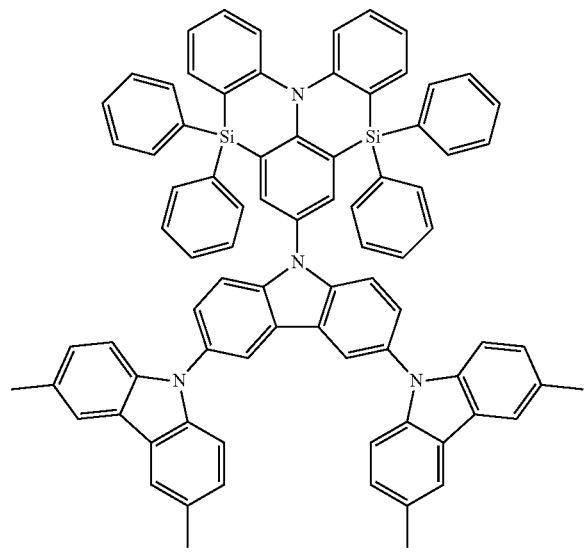
11
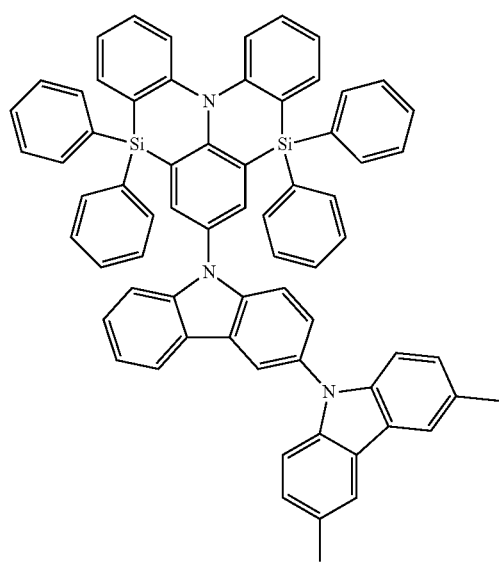
12
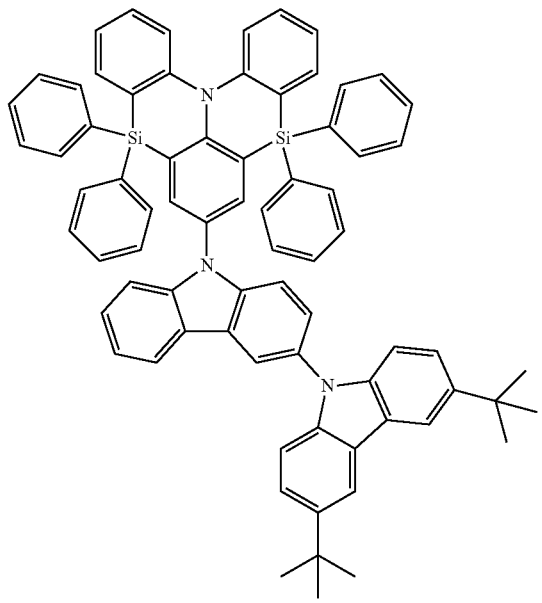
13
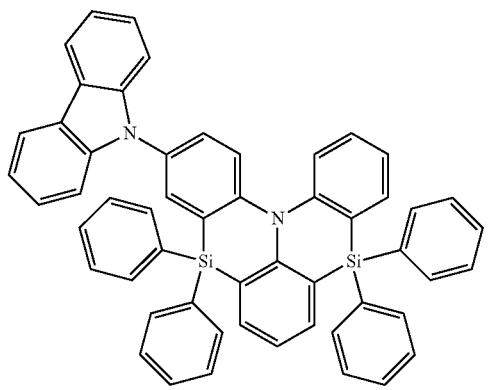
14
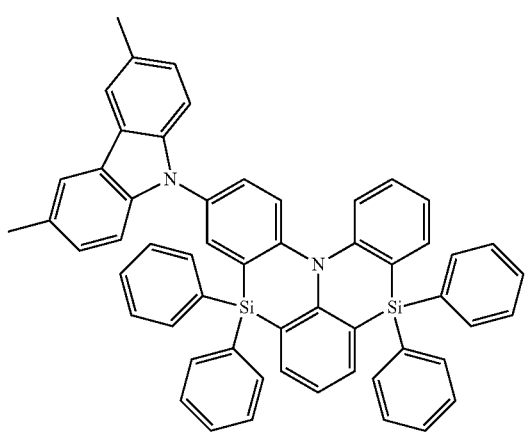

15
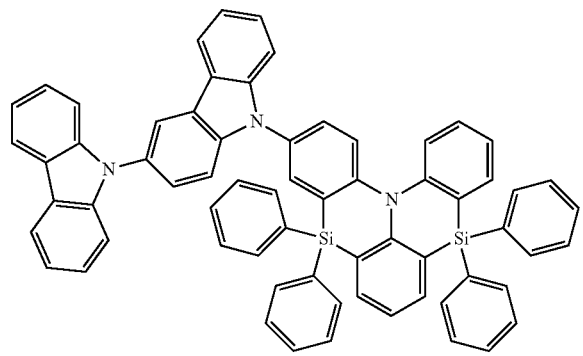
16
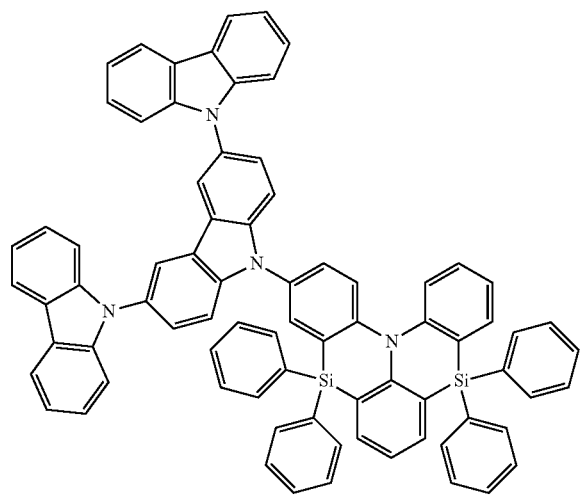
17
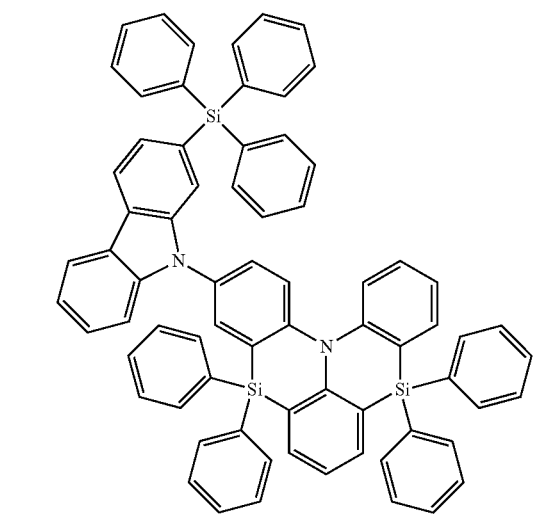
18
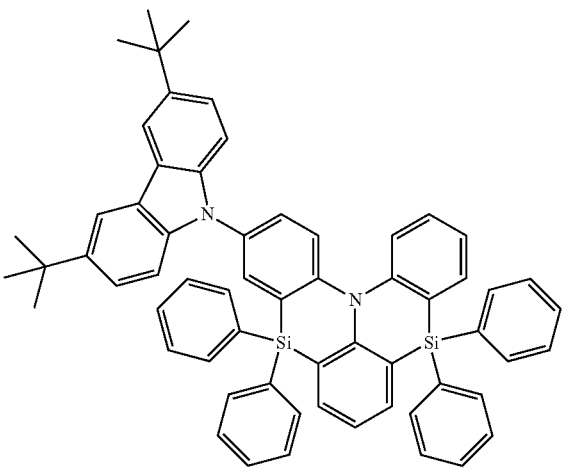
19
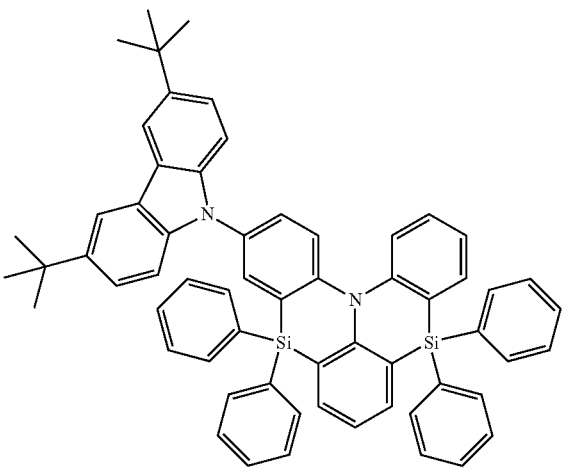
20
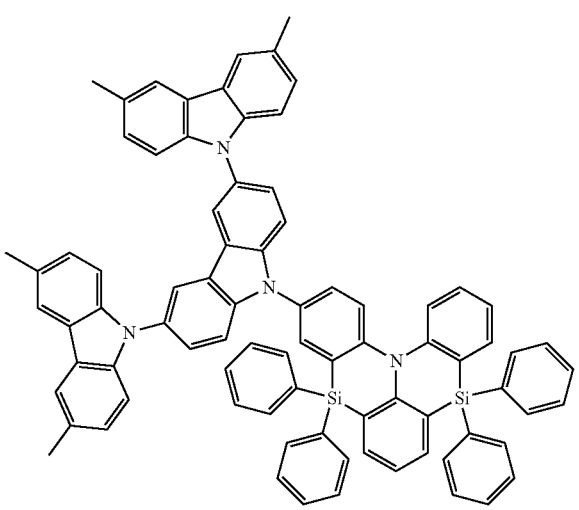

21
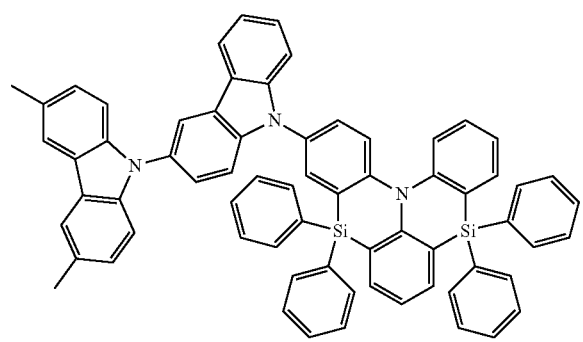
22
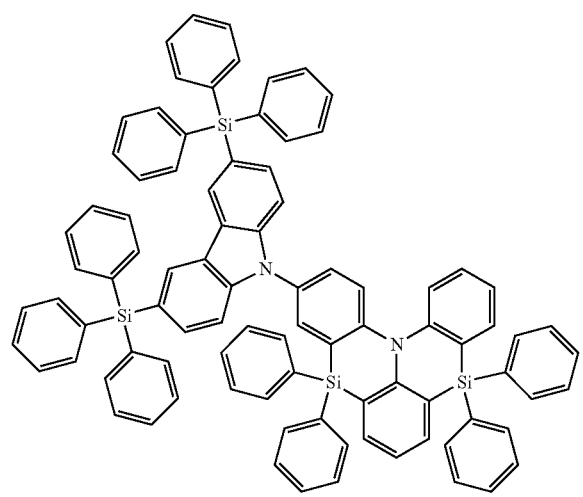
23
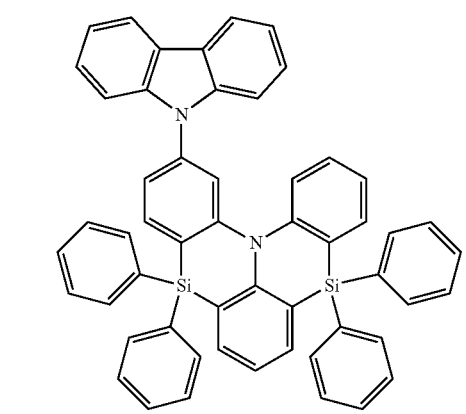
24
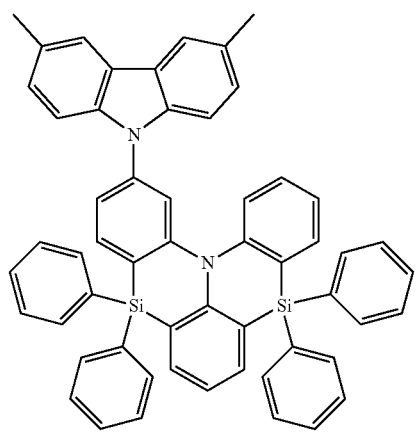
25
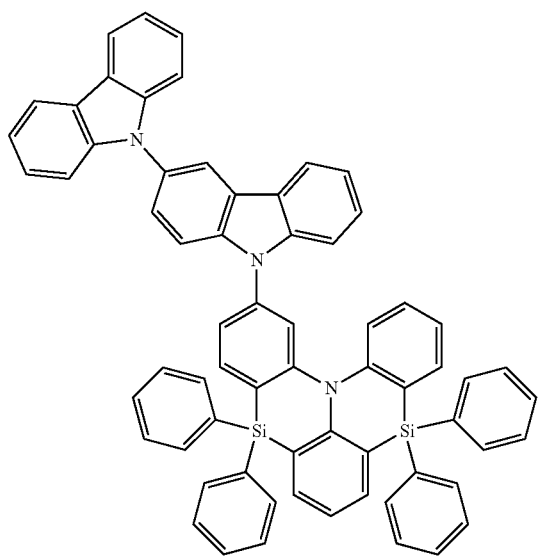
26
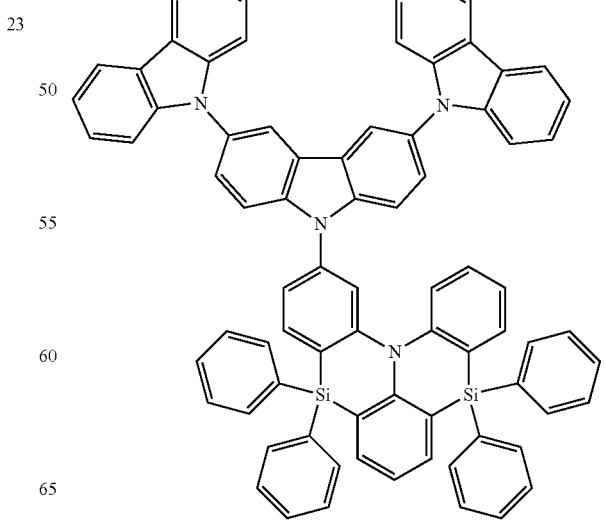

27
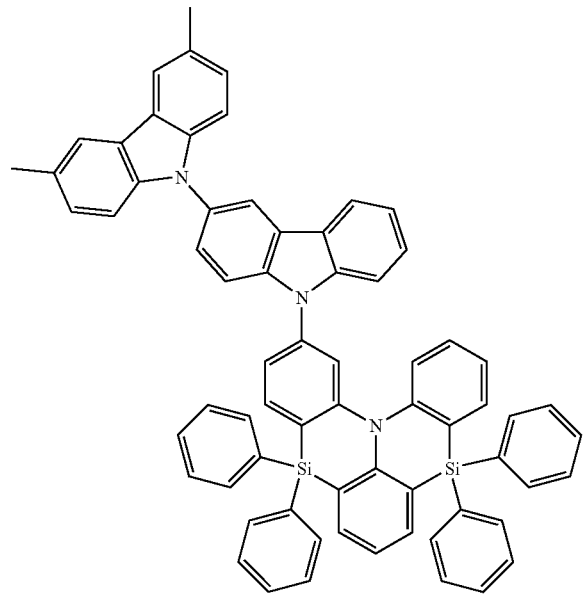
28
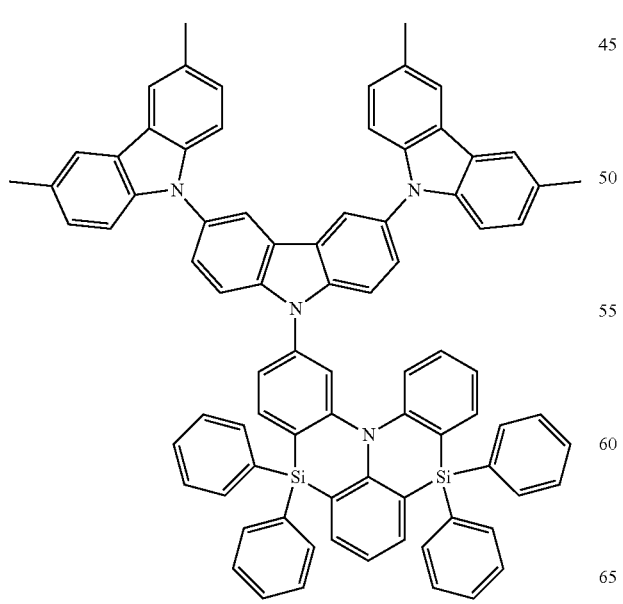
29
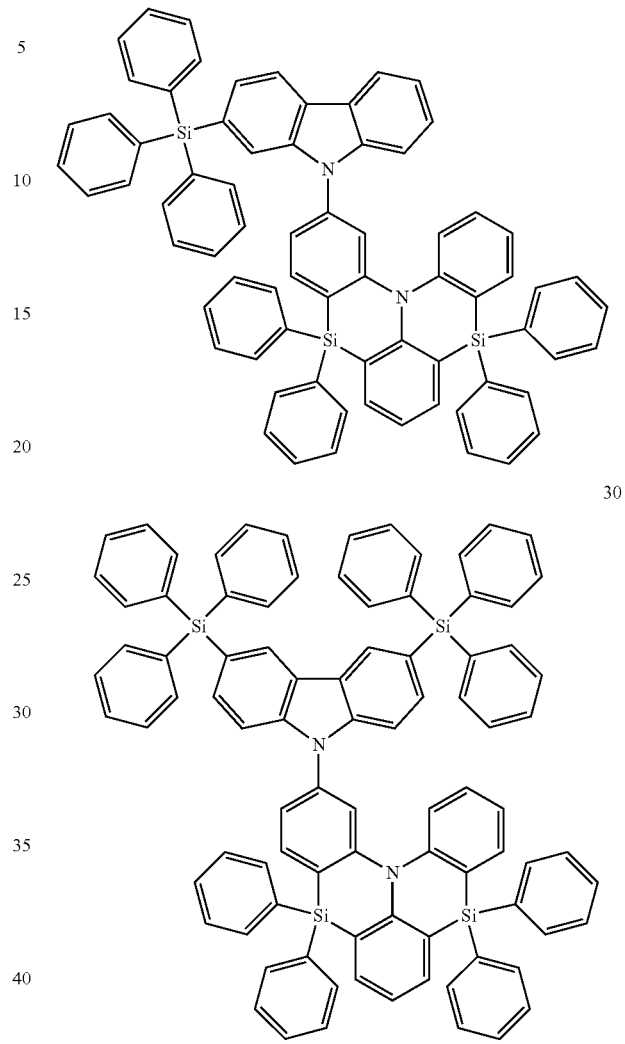
31
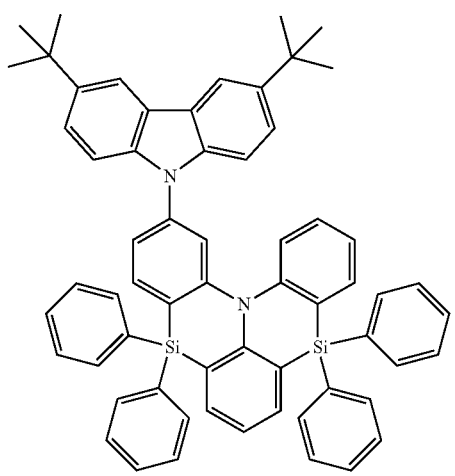

-continued
32
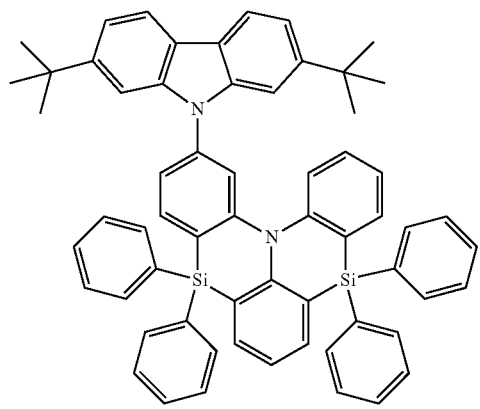
33
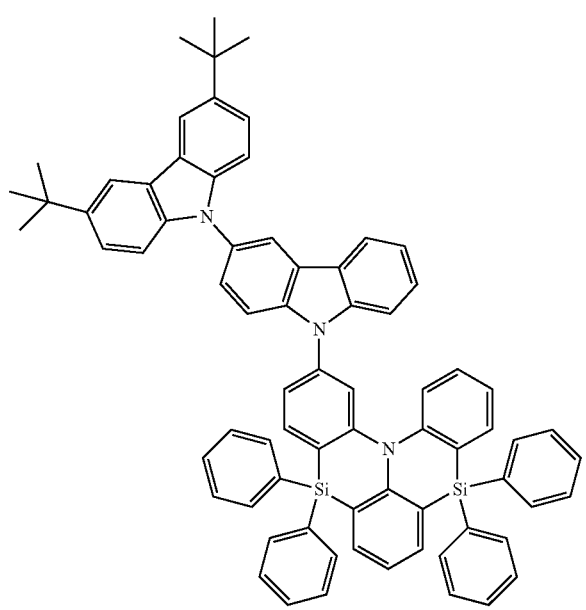
34
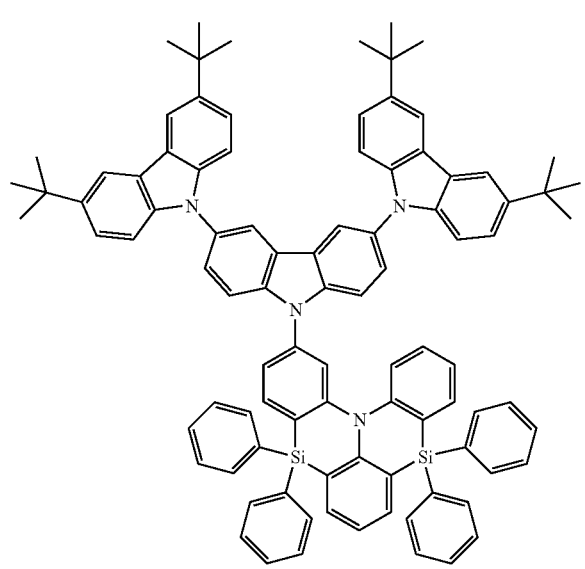
-continued
35
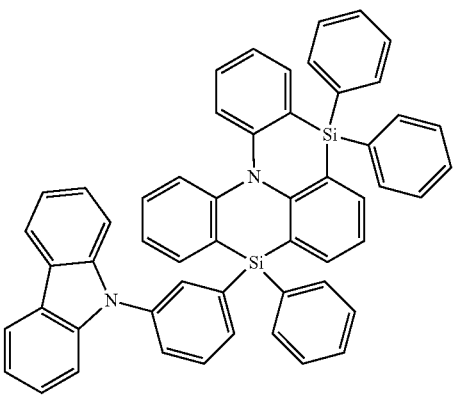
36
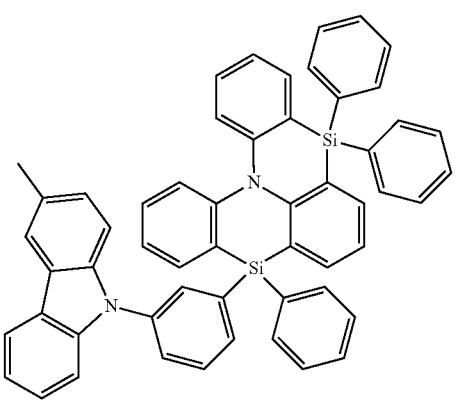
37
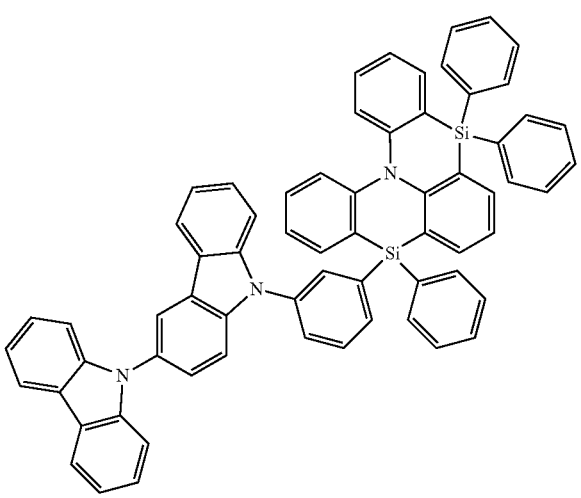

-continued
38
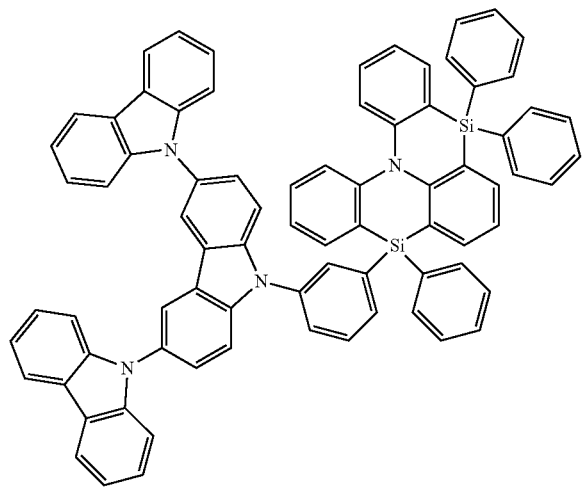
39
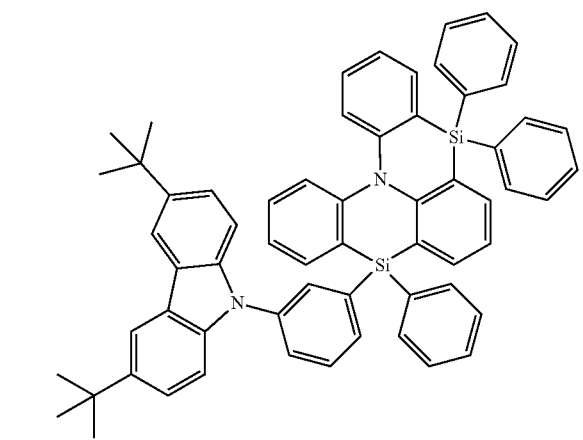
40
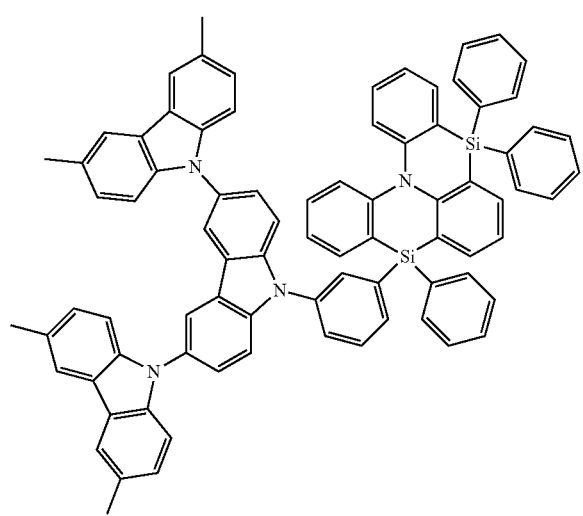
-continued
41
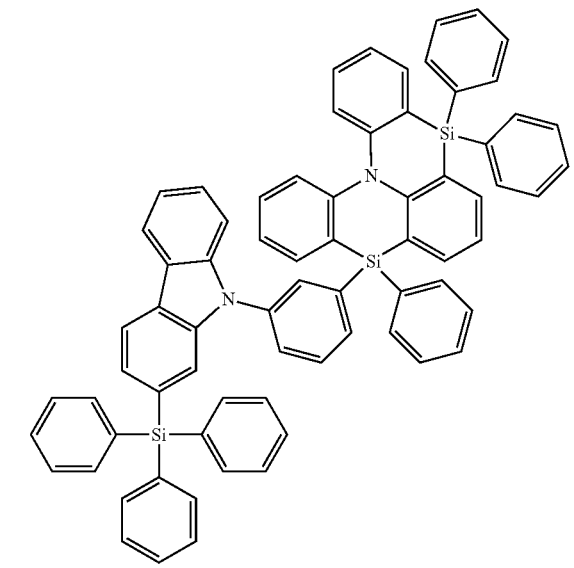
42
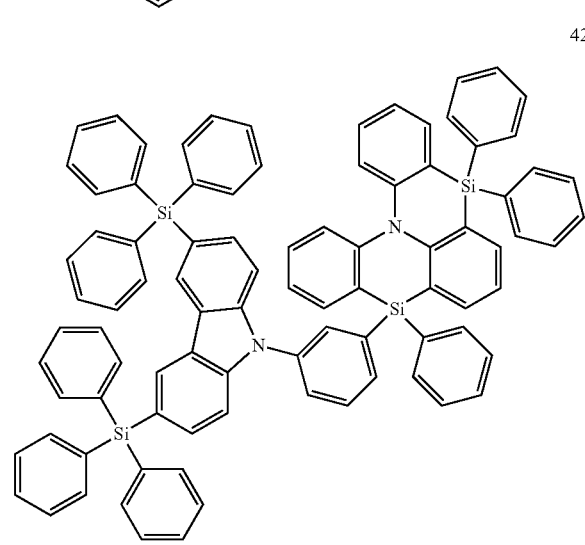
43
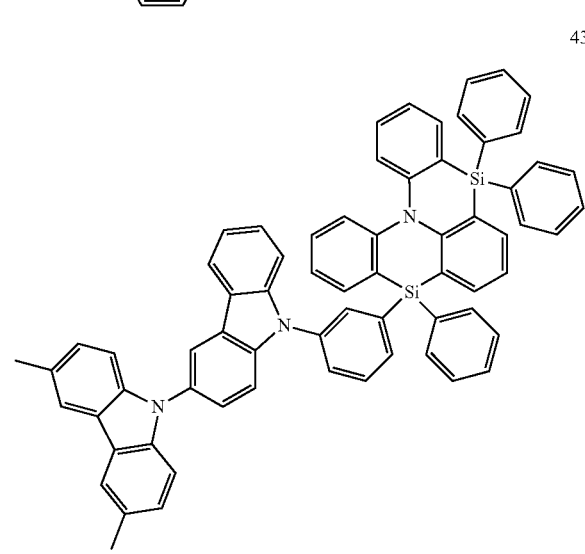

44
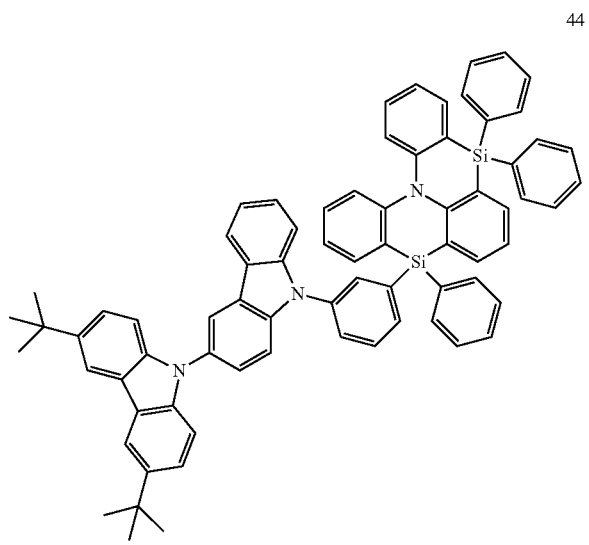
45
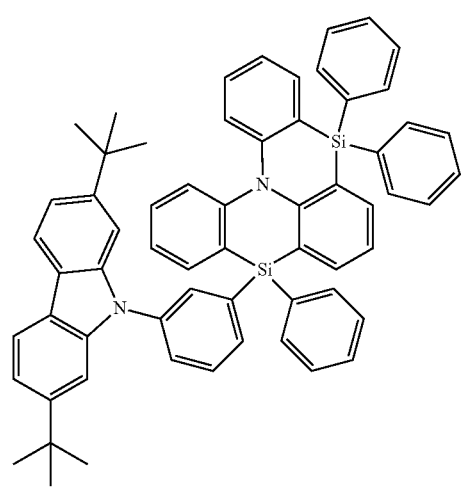
46
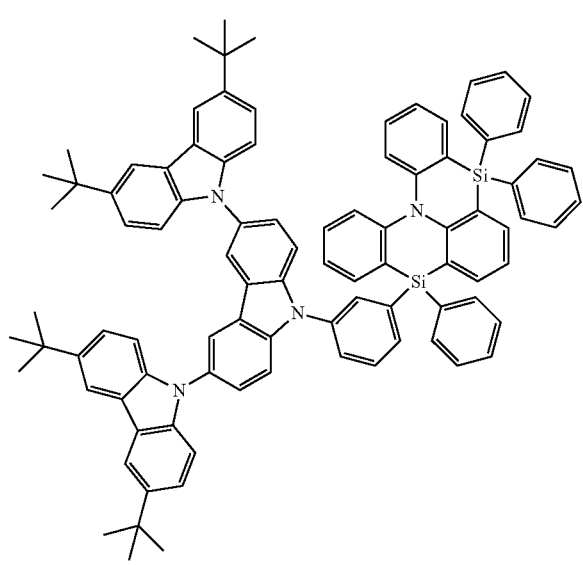
47
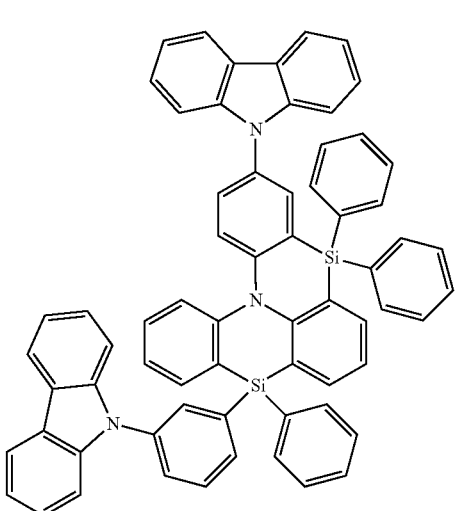
48
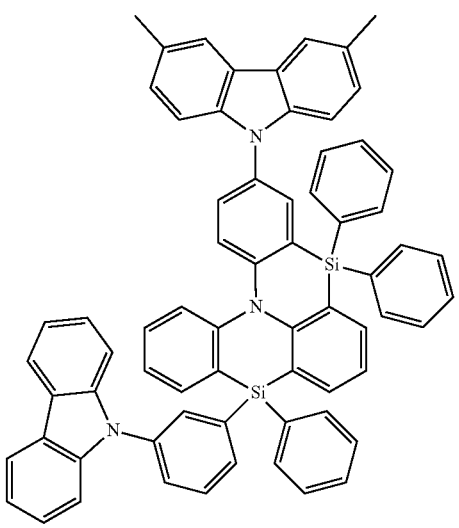
49
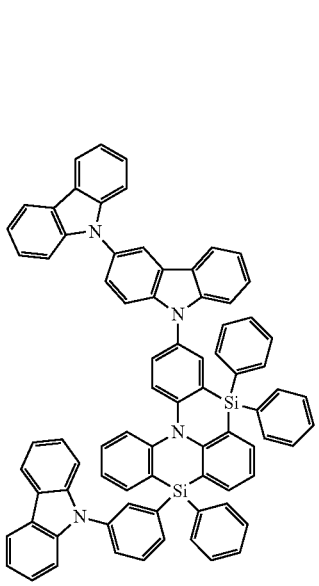

139
-continued
50
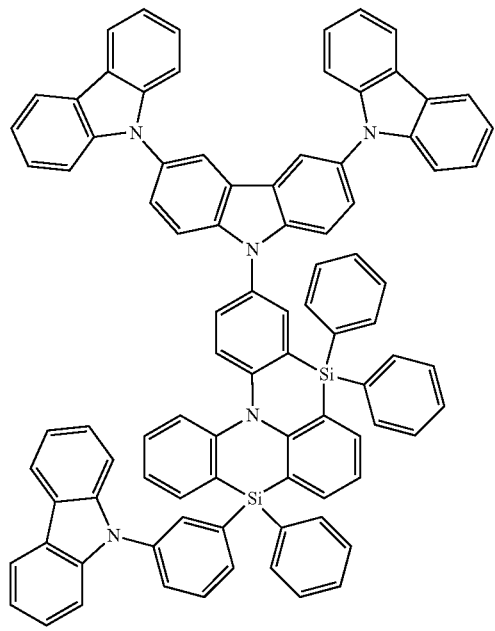
51
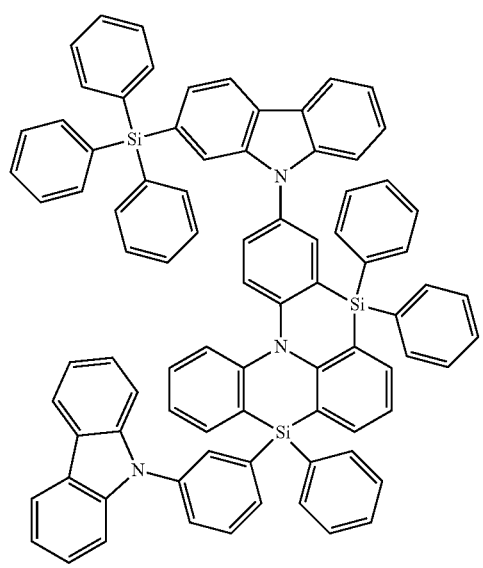
140
-continued
52
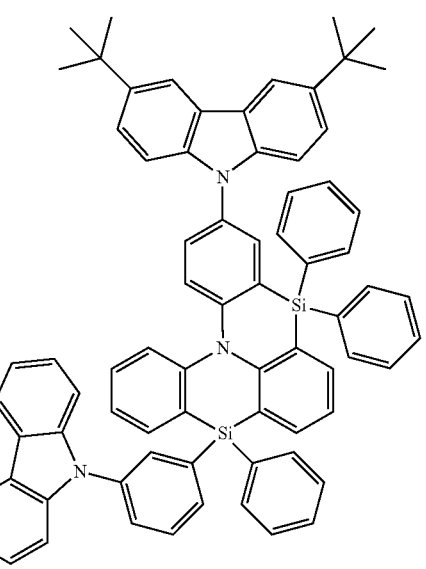
53
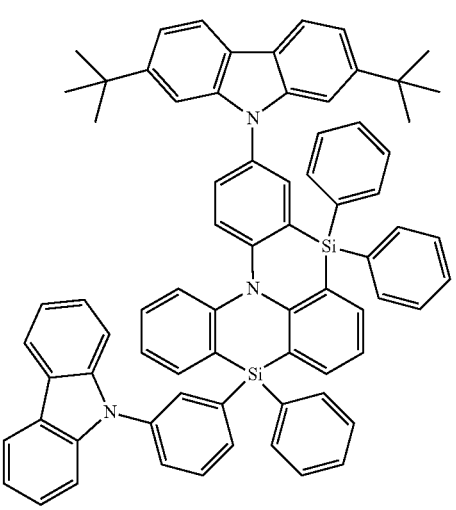

54
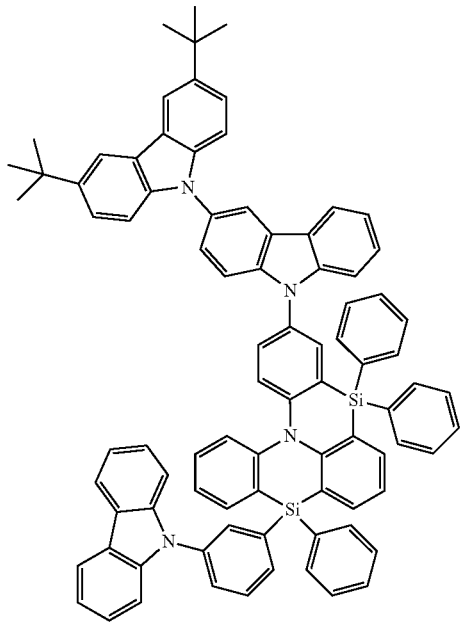
55
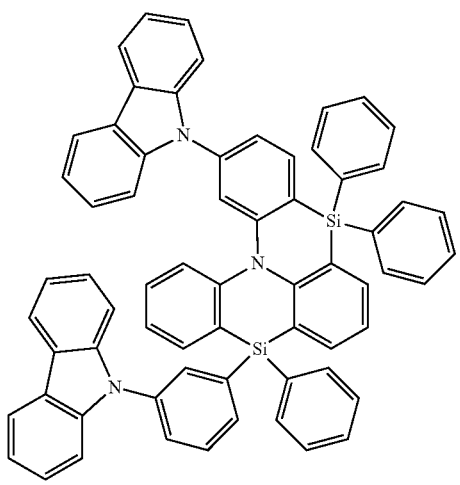
56
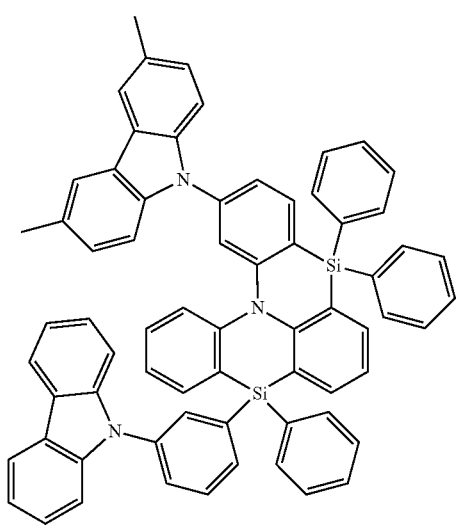
57
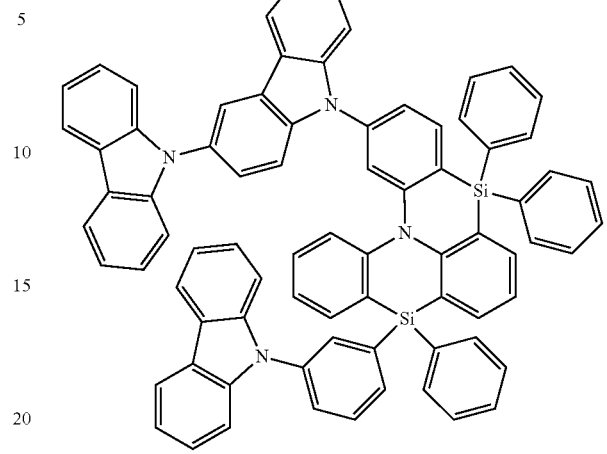
58
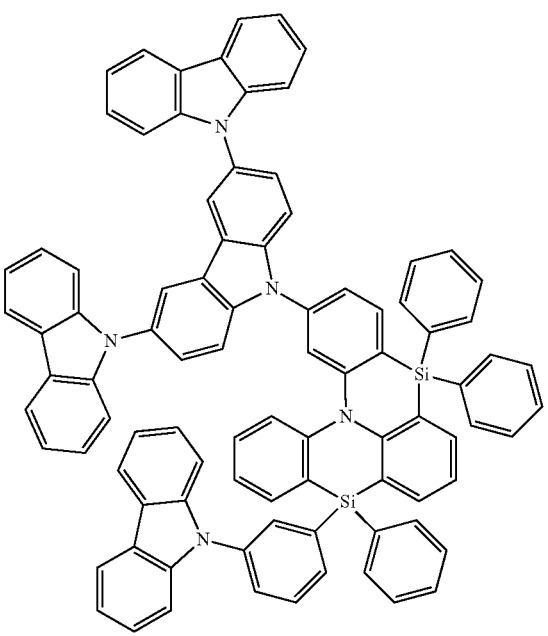

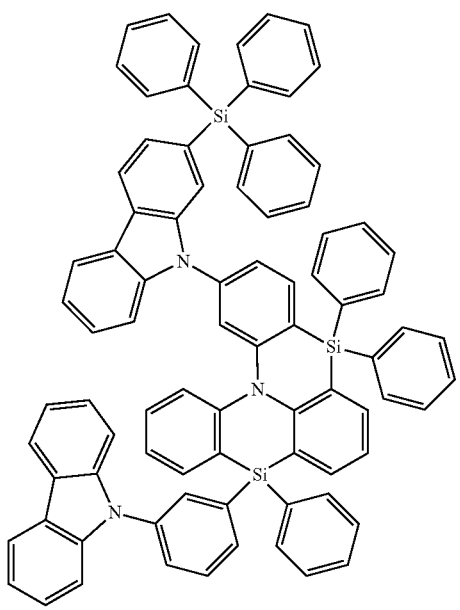
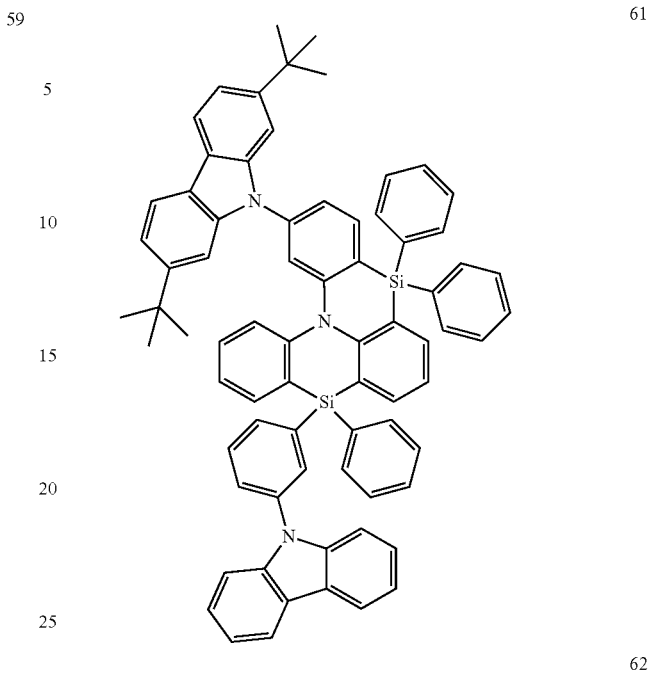
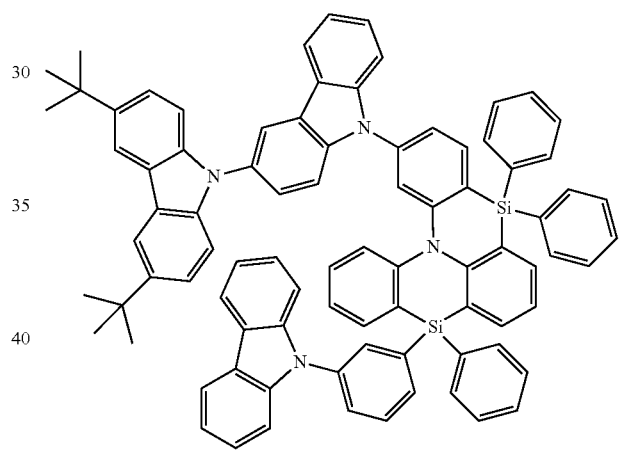
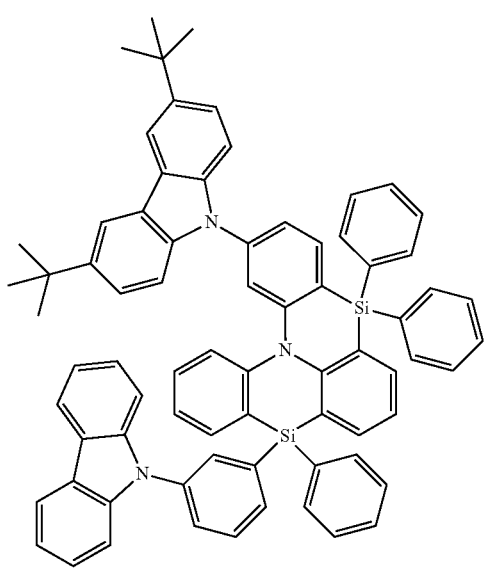
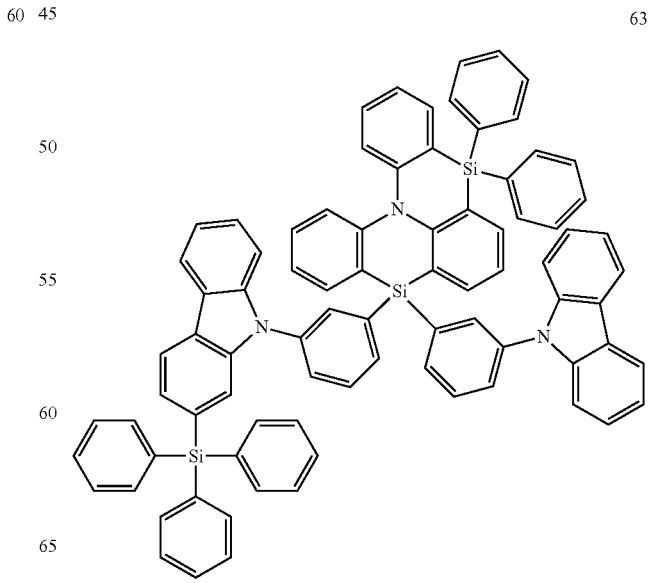

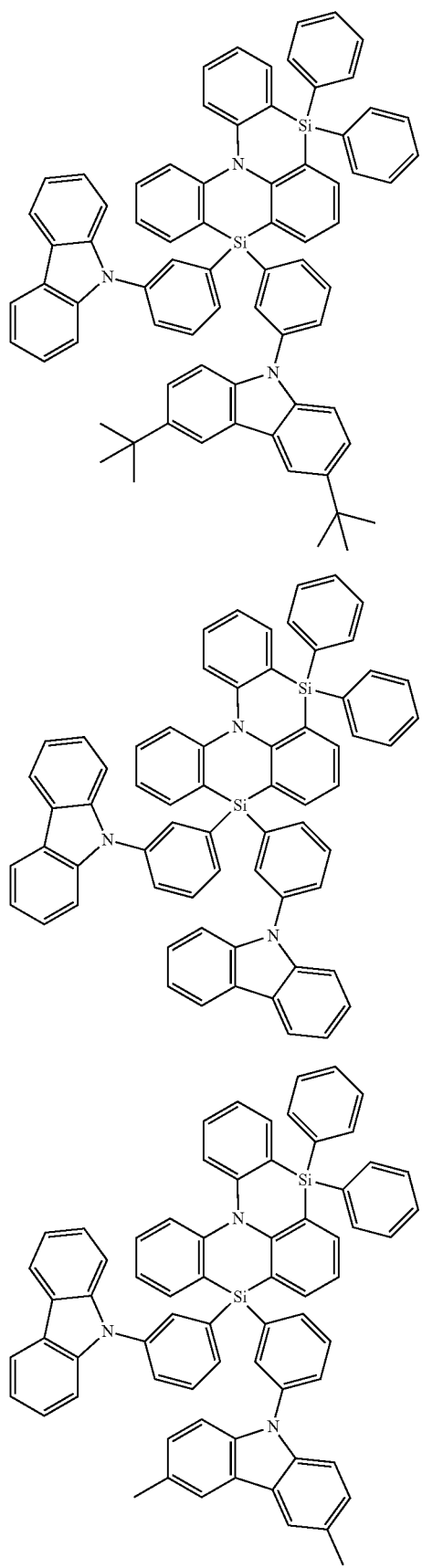
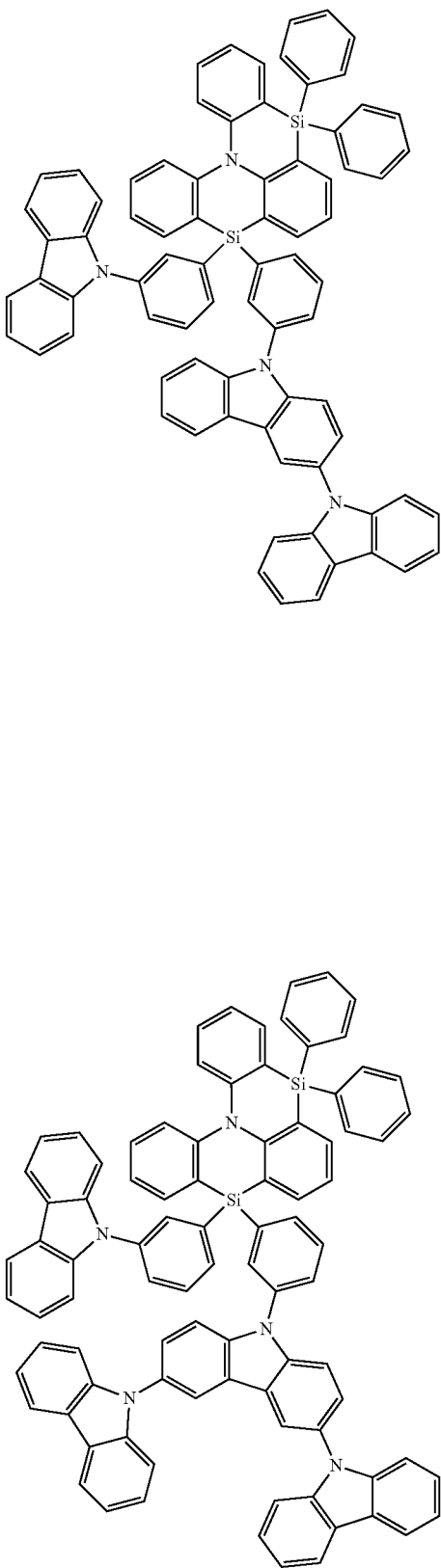

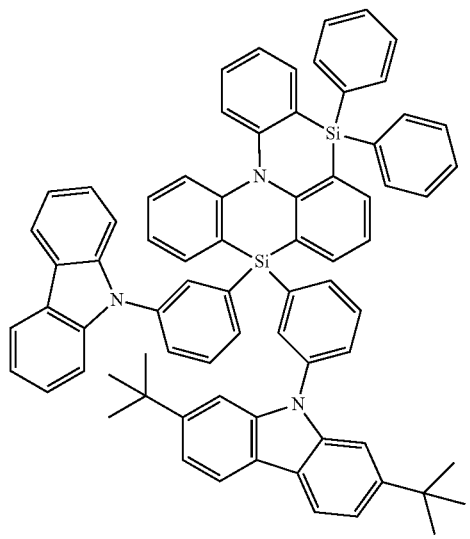
69
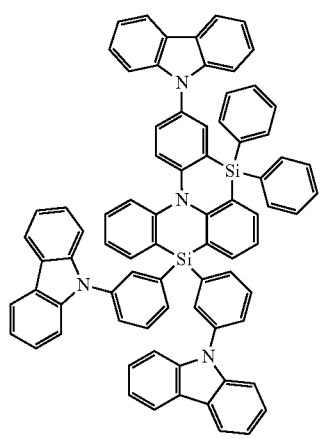
70
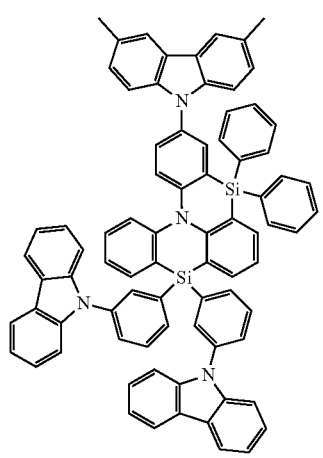
71
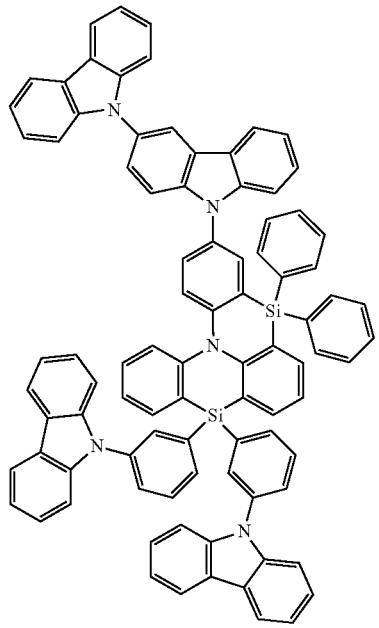
72
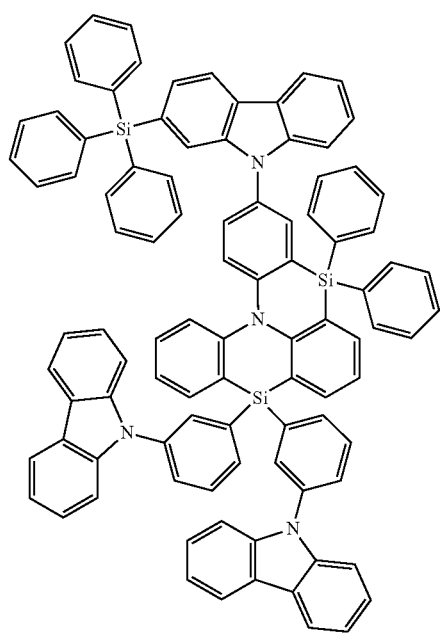
73

-continued
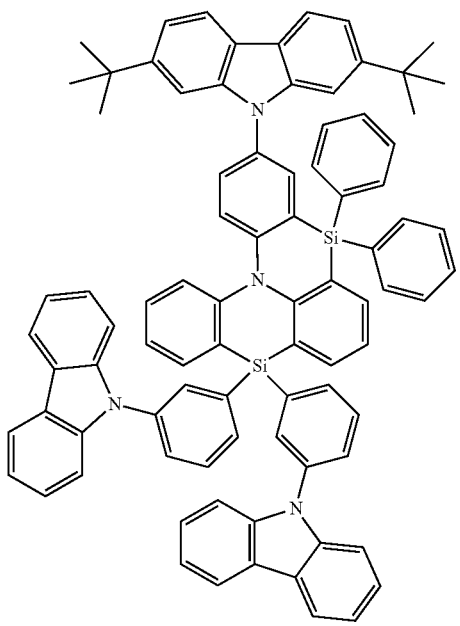
74
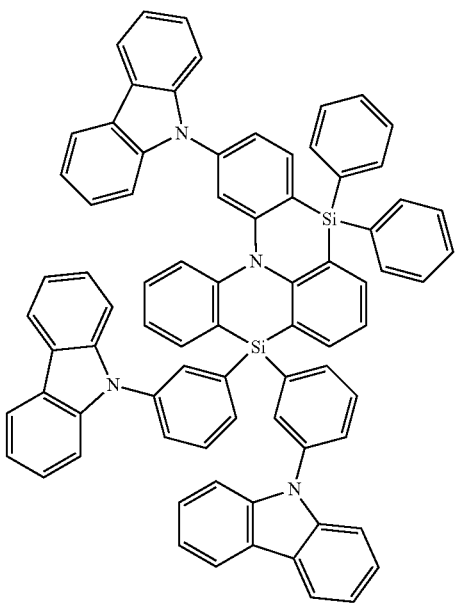
76
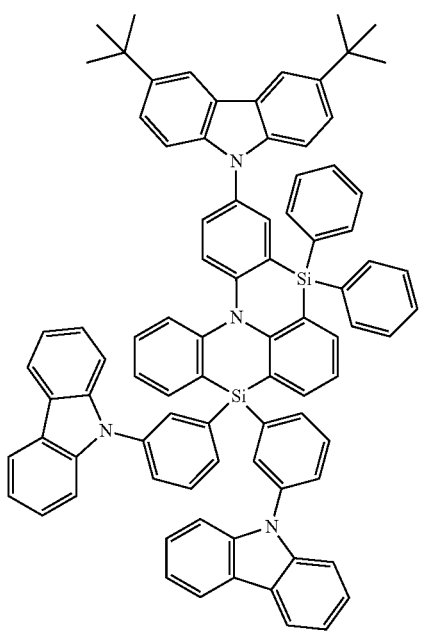
75
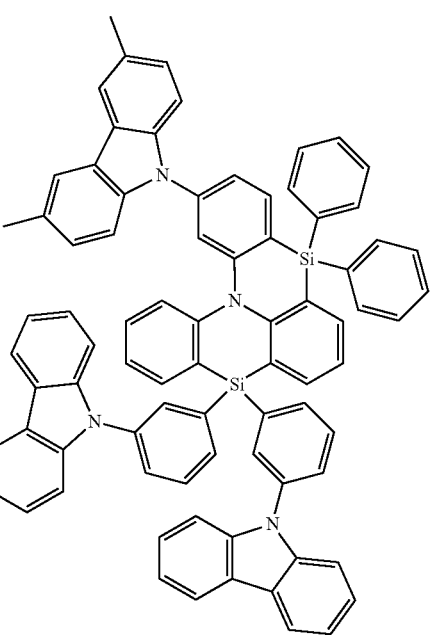
77

78

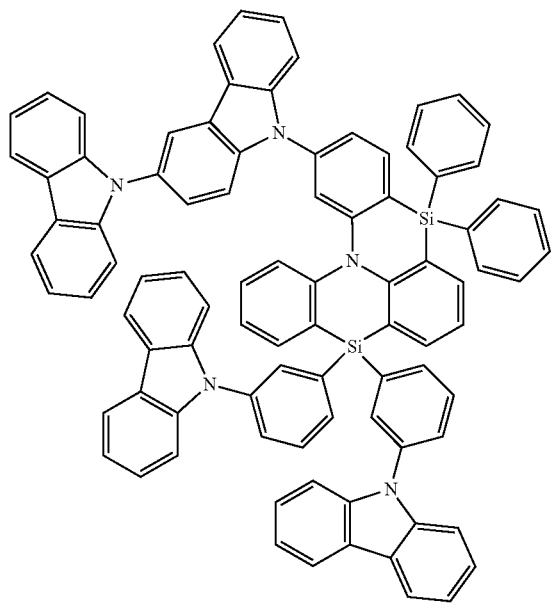

80

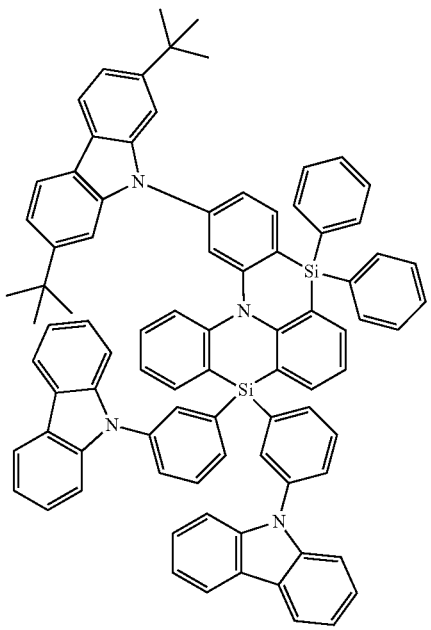

81

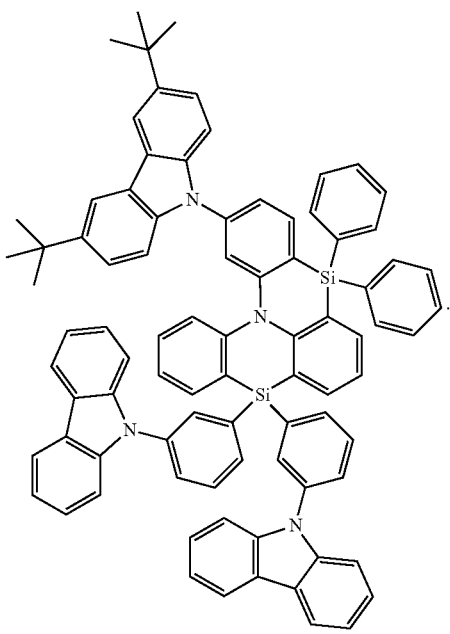

79

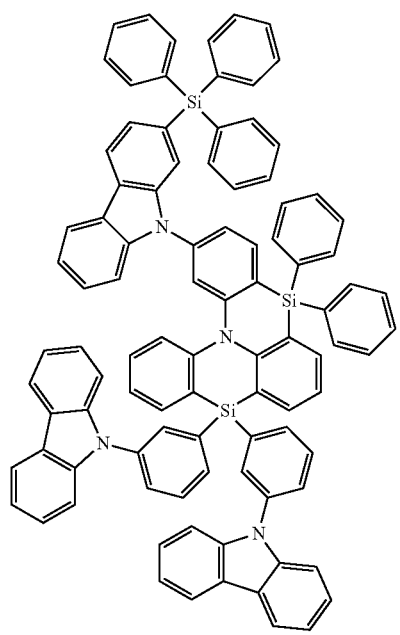

19. An organic electroluminescence device, comprising:
a first electrode;
a second electrode opposite the first electrode; and
multiple organic layers between the first electrode and the second electrode,
wherein at least one organic layer selected from the multiple organic layers comprises a fused polycyclic compound represented by Formula 1, and
the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn, and Yb, a compound of two or more thereof, a mixture of two or more thereof, or an oxide thereof:

Formula 1

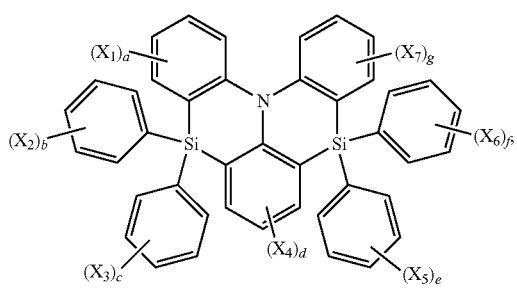

wherein, in Formula 1, $X_1$ to $X_7$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, a substituted or unsubstituted heteroaryl group of 2 to 30 ring-forming carbon atoms, or represented by Formula 2, "a" is an integer of 0 to 4, "b" and "c" are each independently an integer of 0 to 5, "d" is an integer of 0 to 3, "e" and "f" are each independently an integer of 0 to 5, "g" is an integer of 0 to 4, and at least one among $X_1$ to $X_7$ is represented by Formula 2:

Formula 2

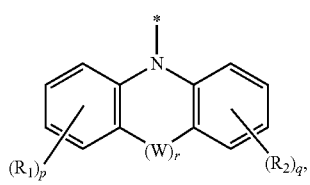

and wherein, in Formula 2, $R_1$ and $R_2$ are each independently a hydrogen atom, a deuterium atom, a halogen atom, a substituted or unsubstituted cyano group, a substituted or unsubstituted silyl group, a substituted or unsubstituted alkyl group of 1 to 30 carbon atoms, a substituted or unsubstituted alkenyl group of 2 to 30 carbon atoms, a substituted or unsubstituted amine group, a substituted or unsubstituted aryl group of 6 to 30 ring-forming carbon atoms, or a substituted or unsubstituted heteroaryl group of 2 to 30 ring-forming carbon atoms, and/or are optionally combined with an adjacent group to form a ring, "p" and "q" are each independently an integer of 0 to 4, "W" is a direct linkage, and "r" is 0 or 1.

20. The organic electroluminescence device of claim 19, wherein the fused polycyclic compound represented by Formula 1 comprises at least one selected from compounds represented in Compound Group 1:

Compound Group 1

1

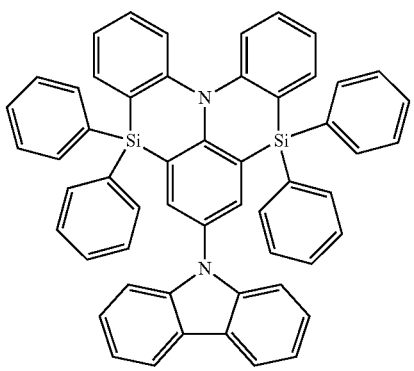

2

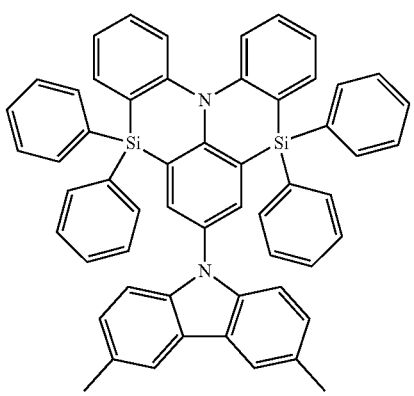

3

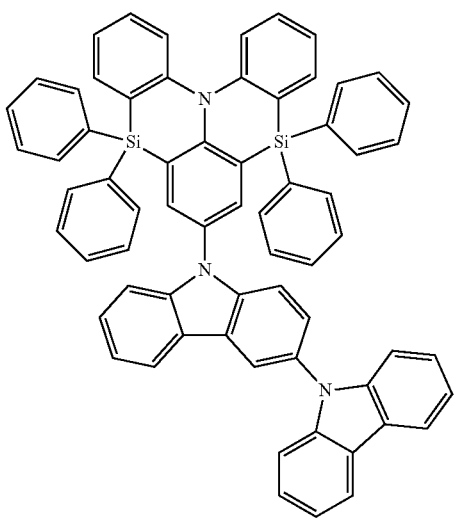

4
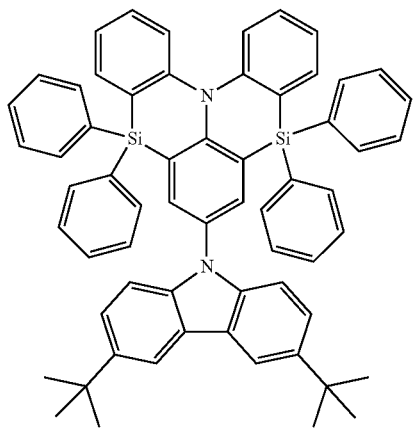
5
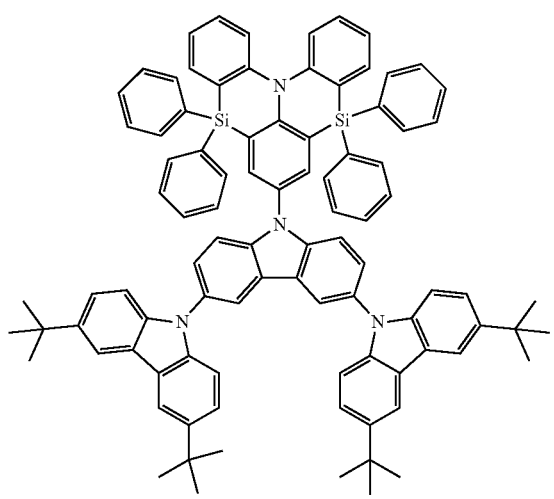
6
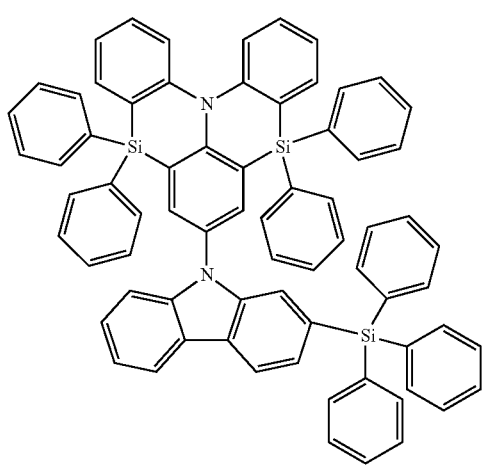
7
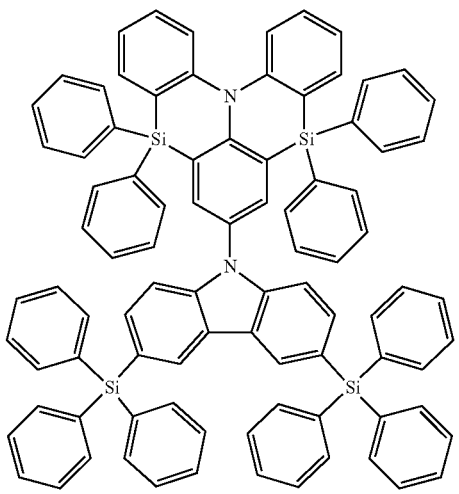
8
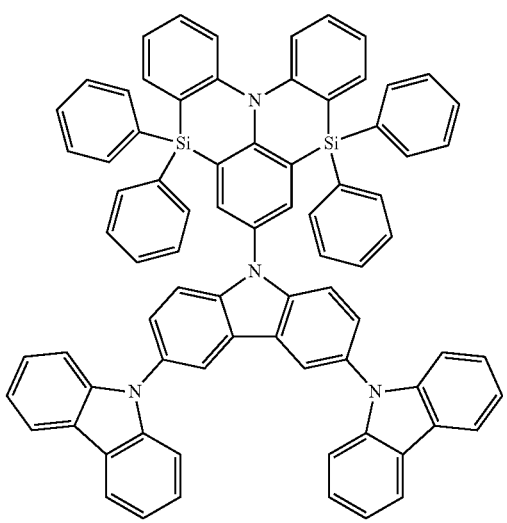
9
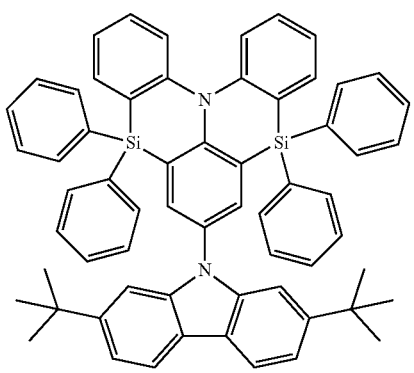

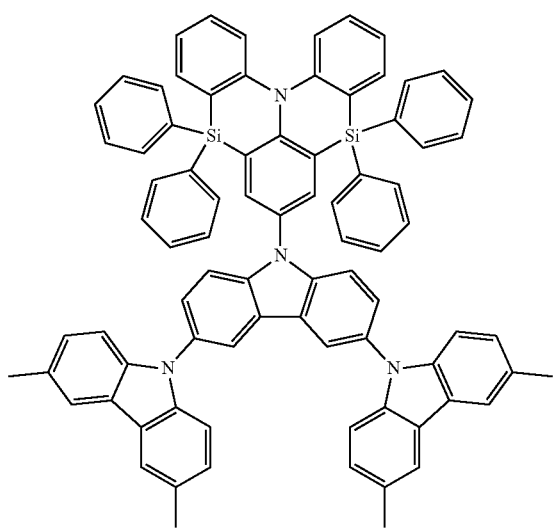
10
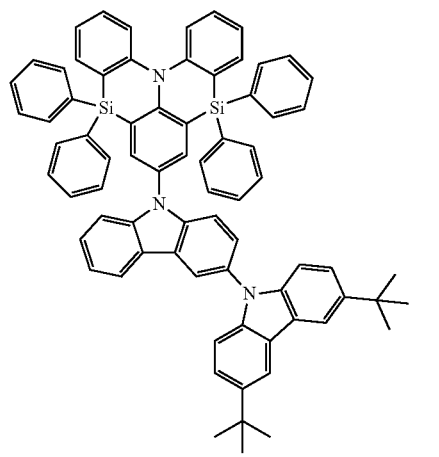
11
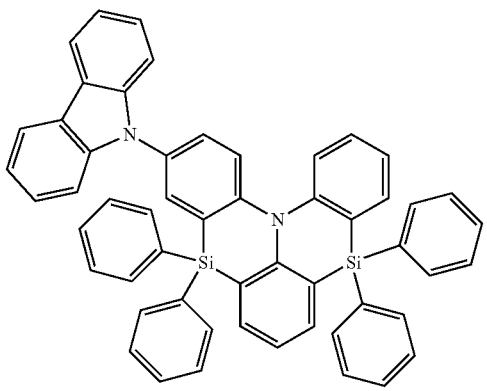
12
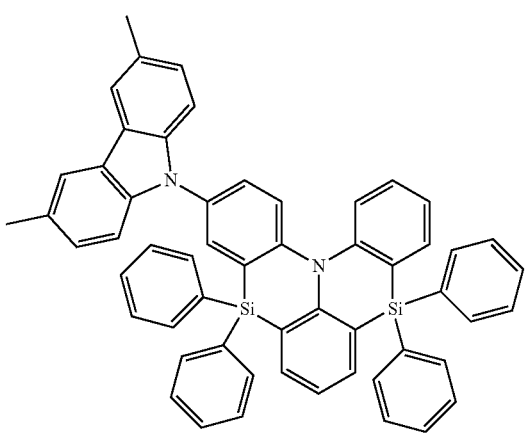
13
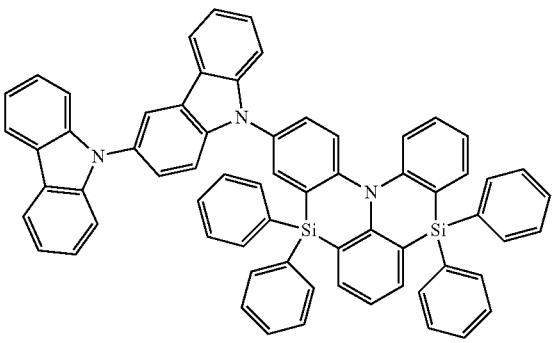
14
15

16
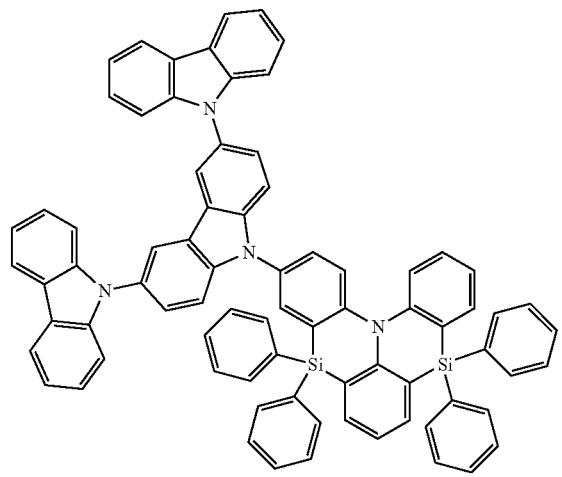
17
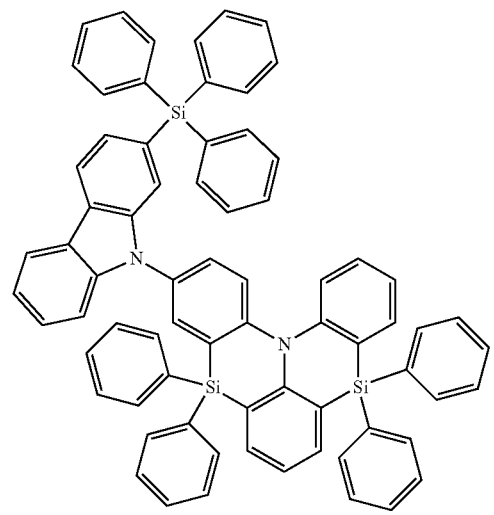
18
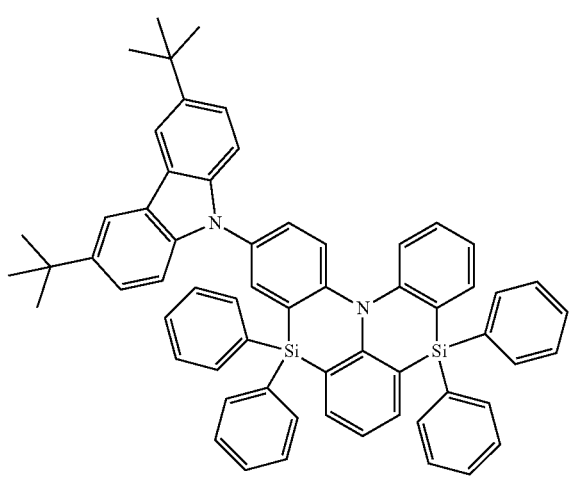
19
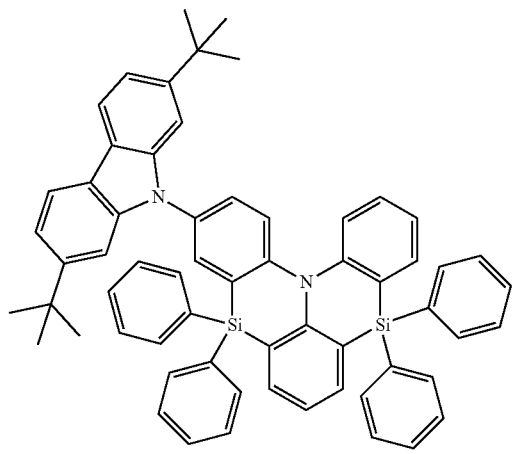
20
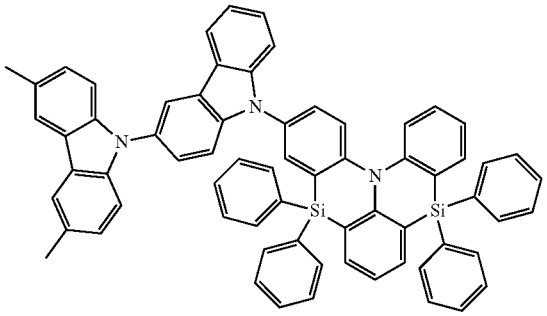
21

-continued
22
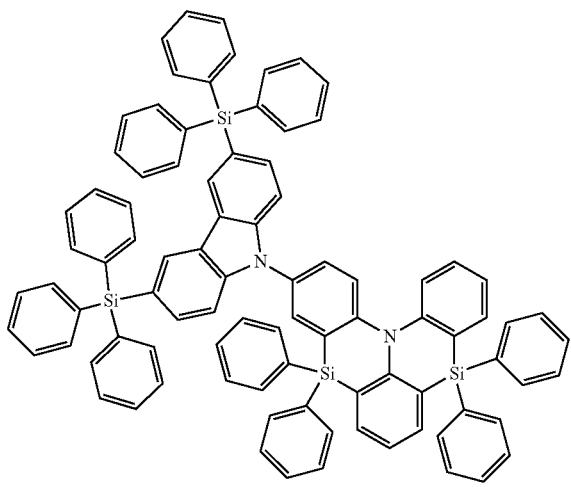
23
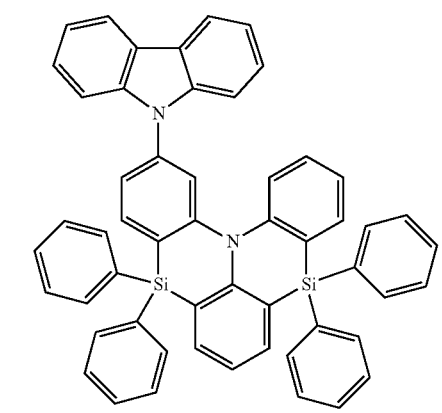
24
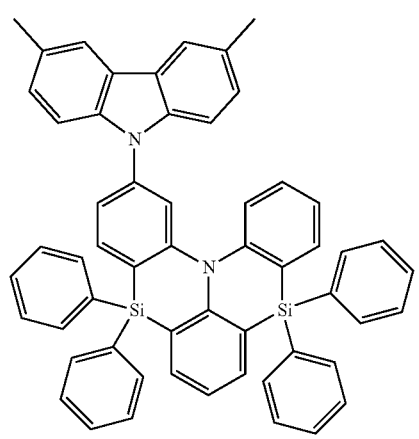
-continued
25
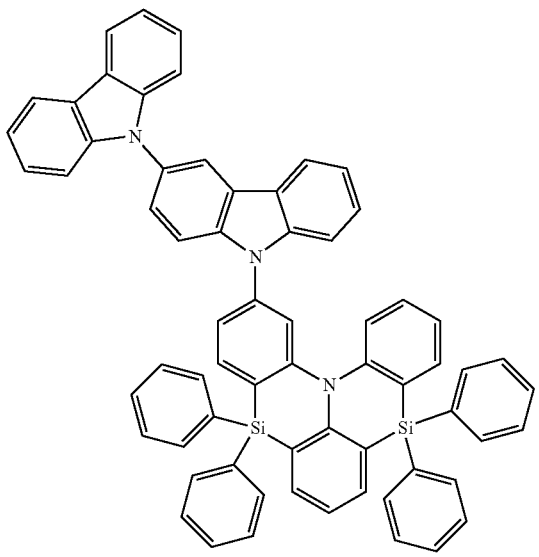
26
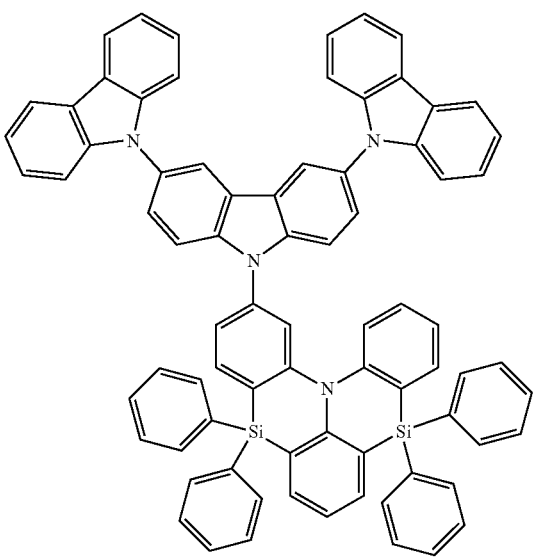

27
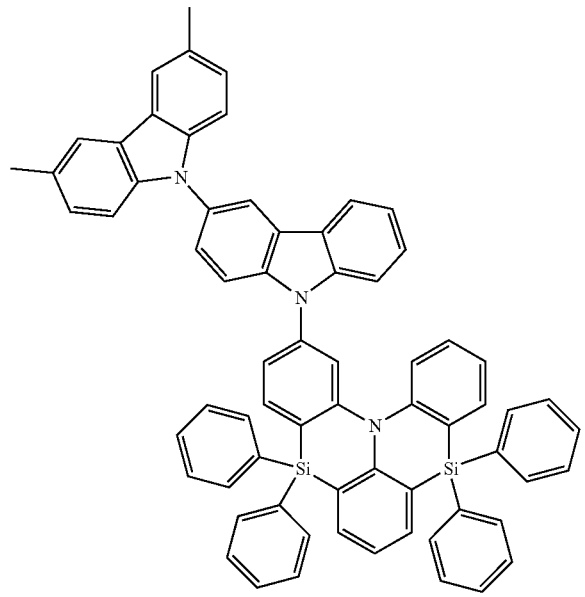
31
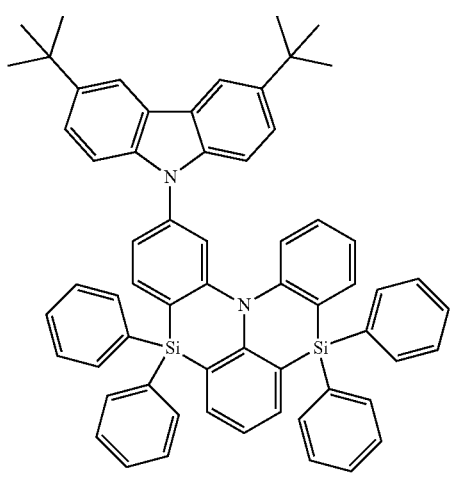
32
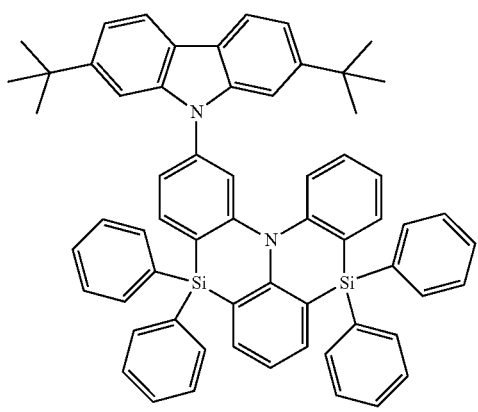
33
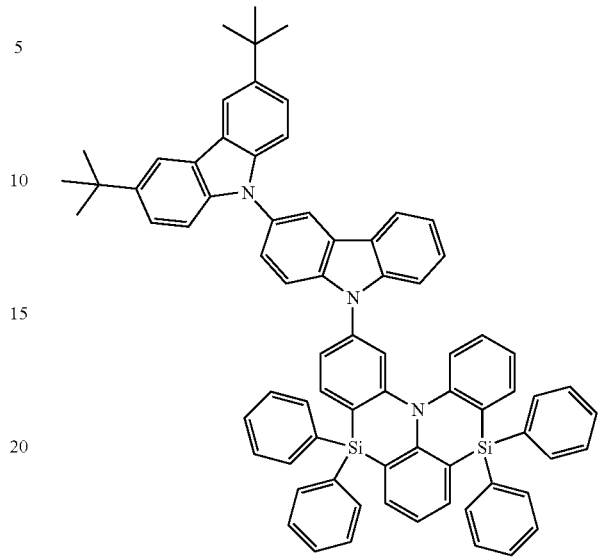
34
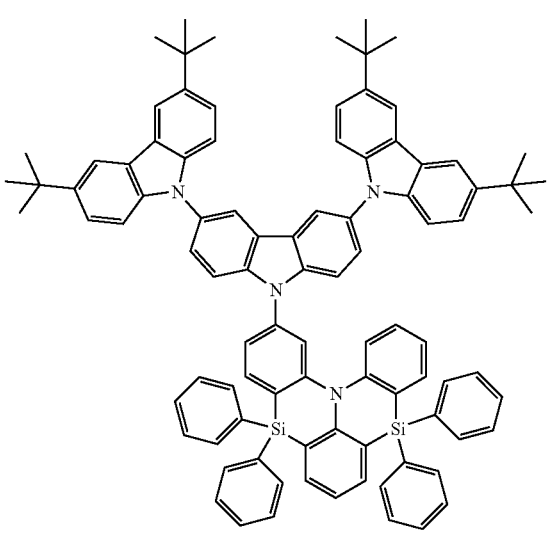
35
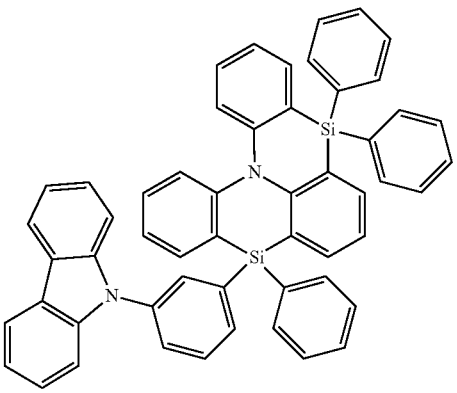

36
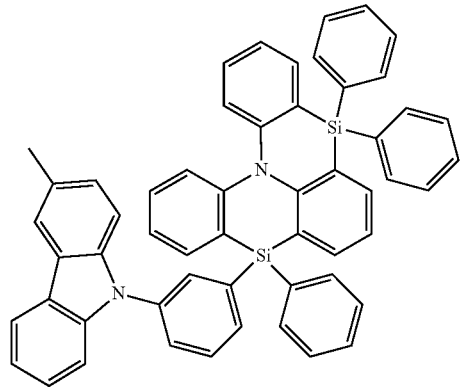
37
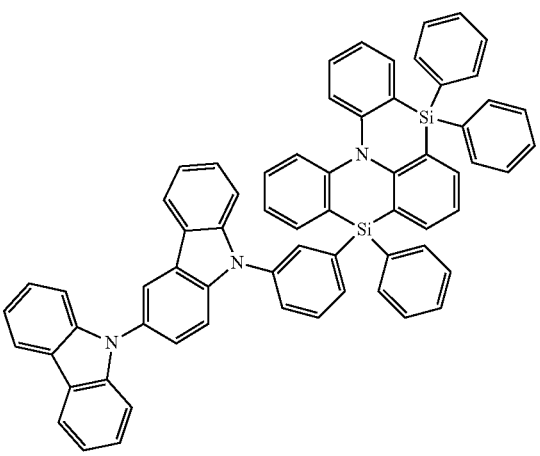
38
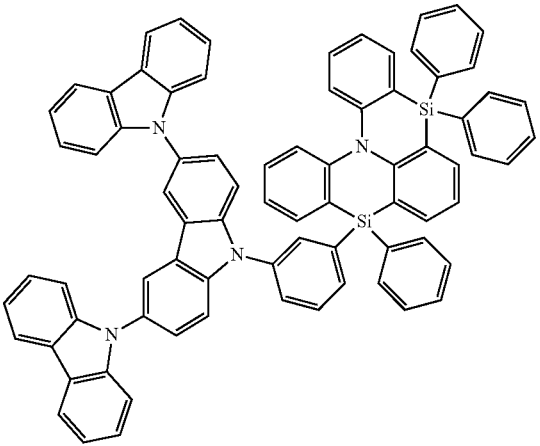
39
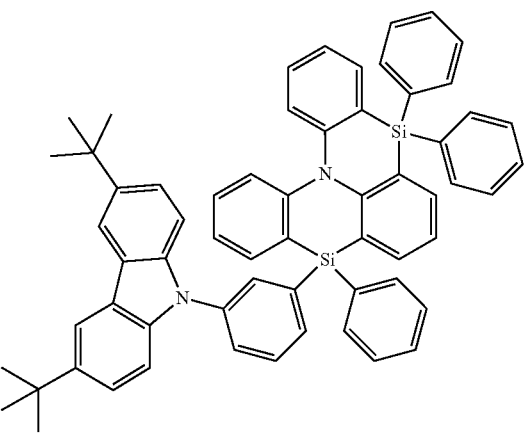
40
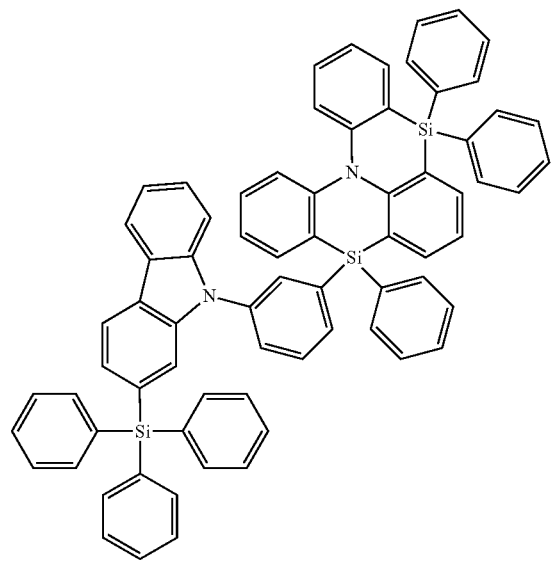
41

42
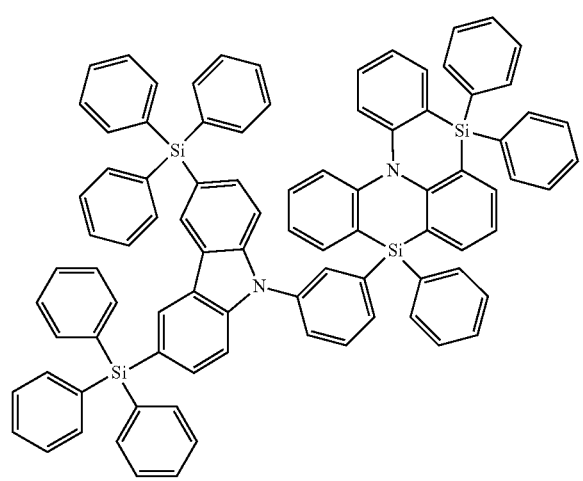
43
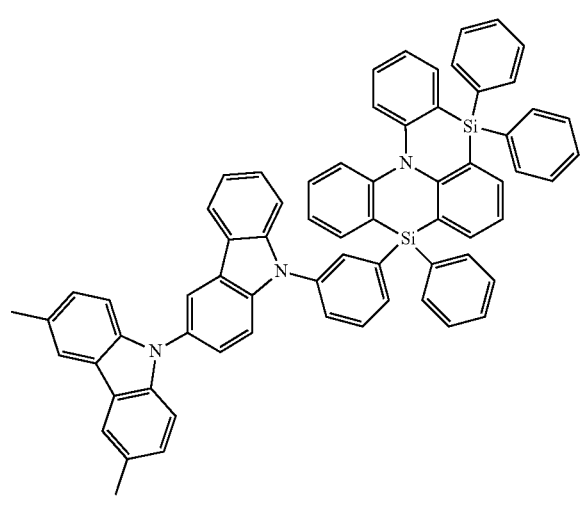
44
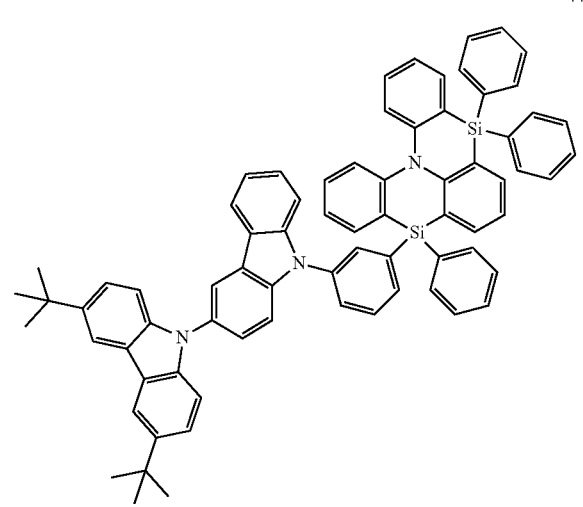
45
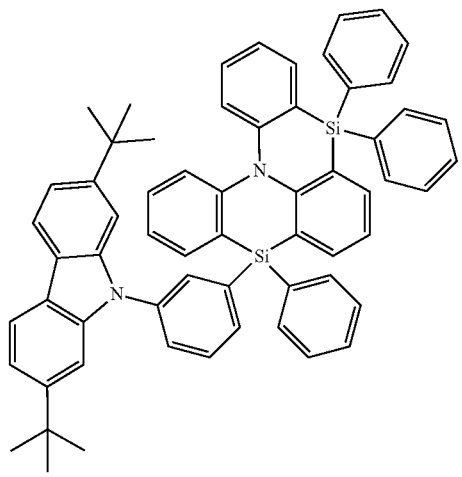
46
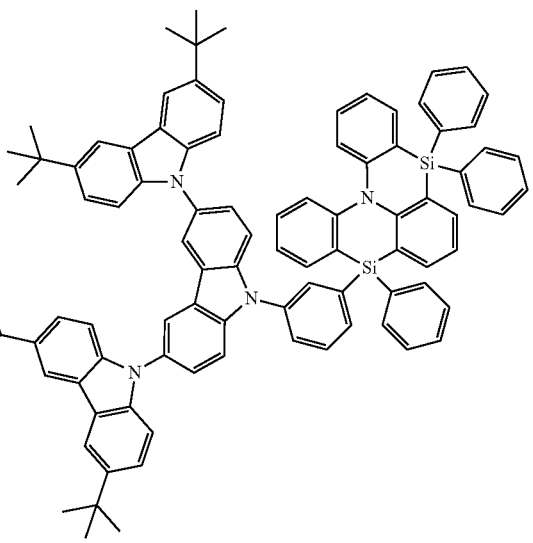
47
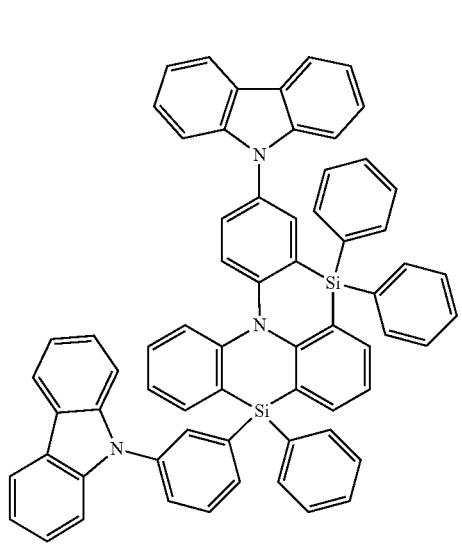

169
-continued
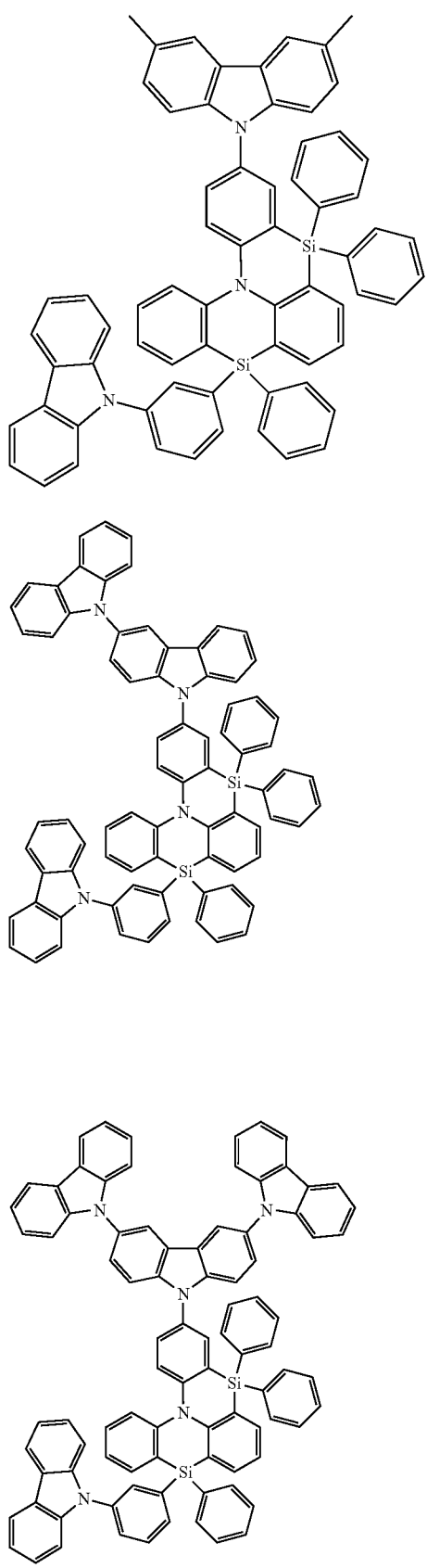
48
49
50
170
-continued
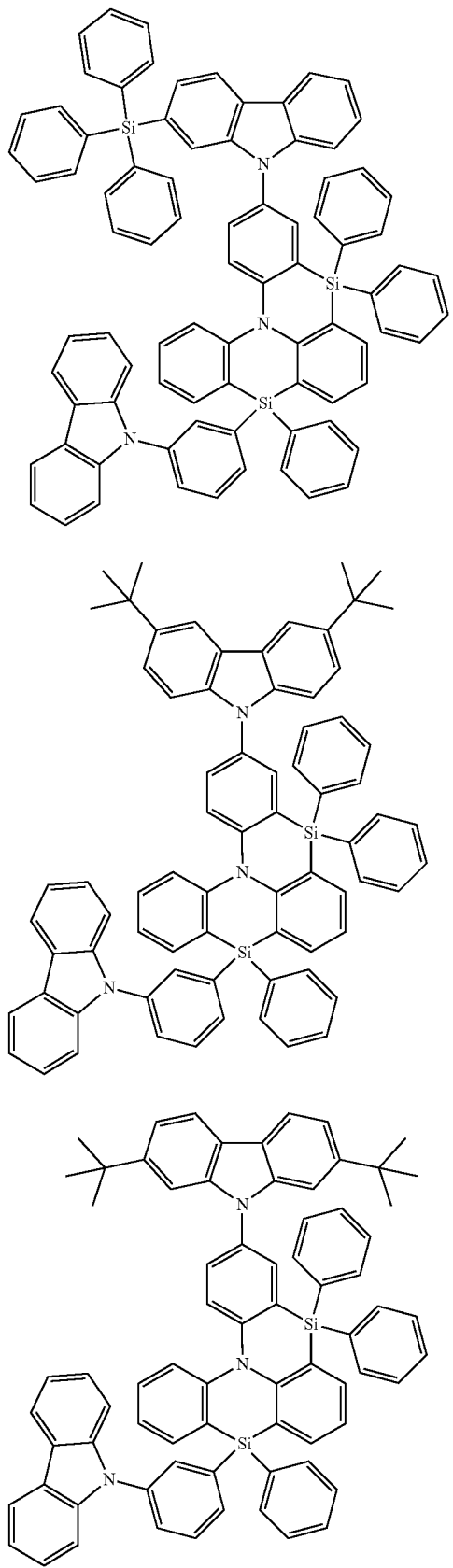
51
52
53

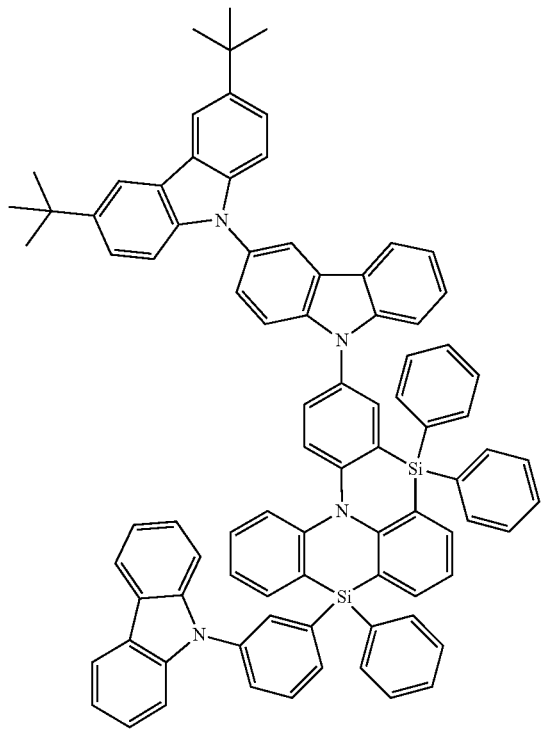
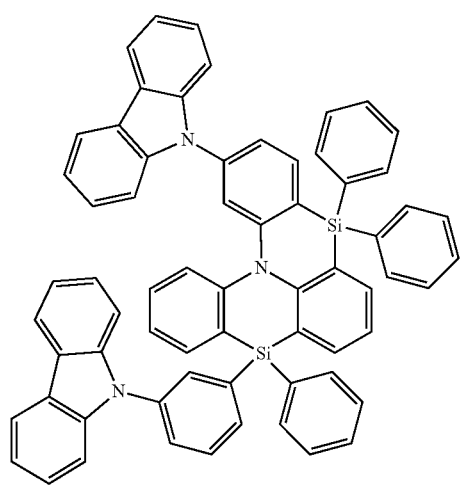
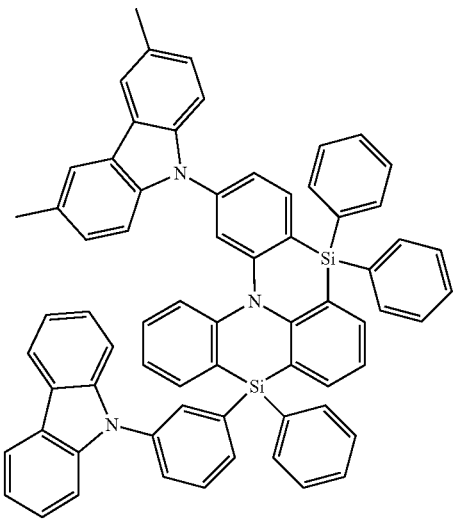
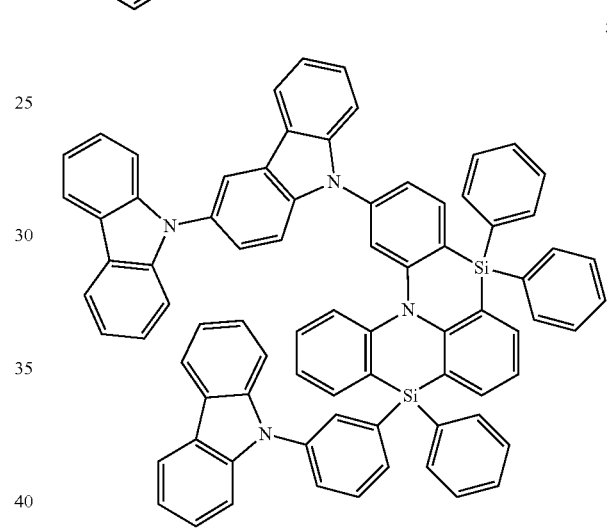
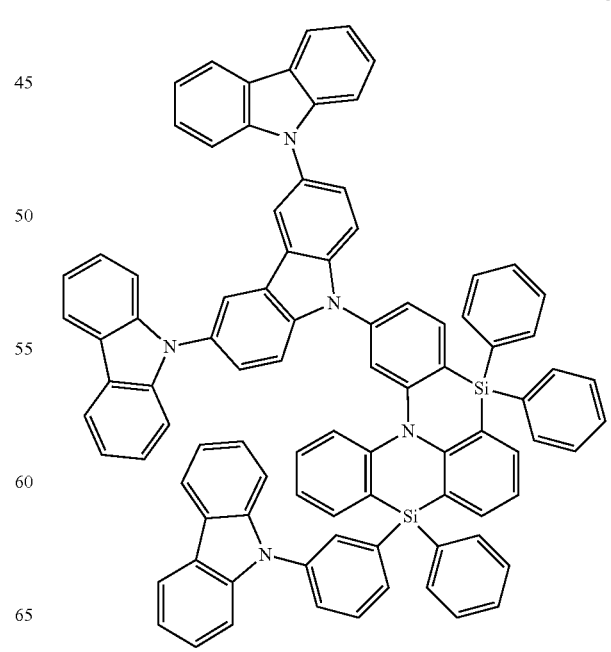

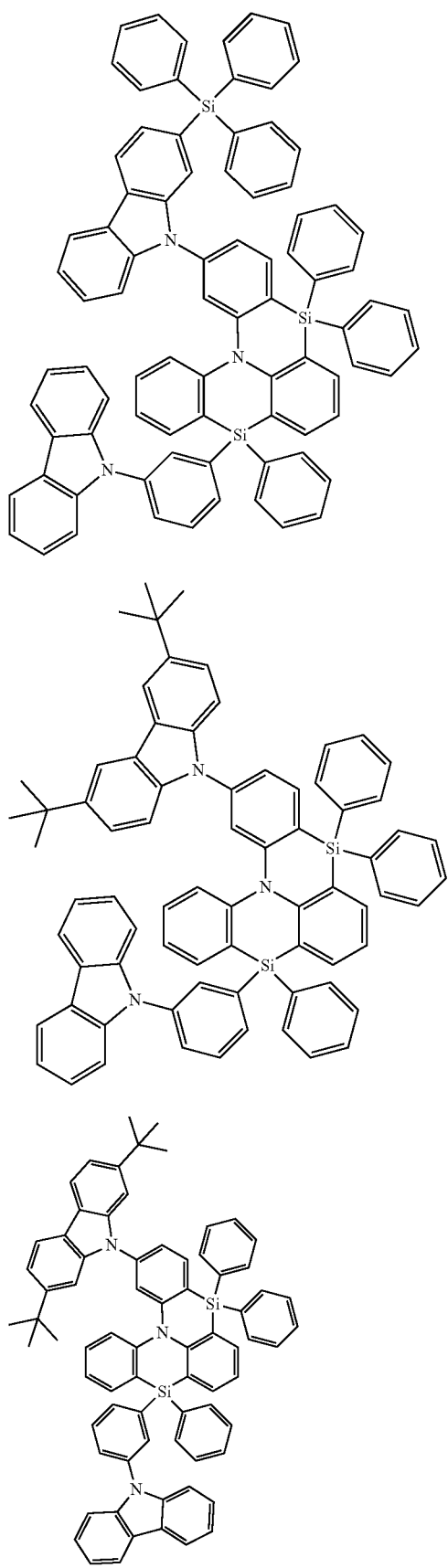
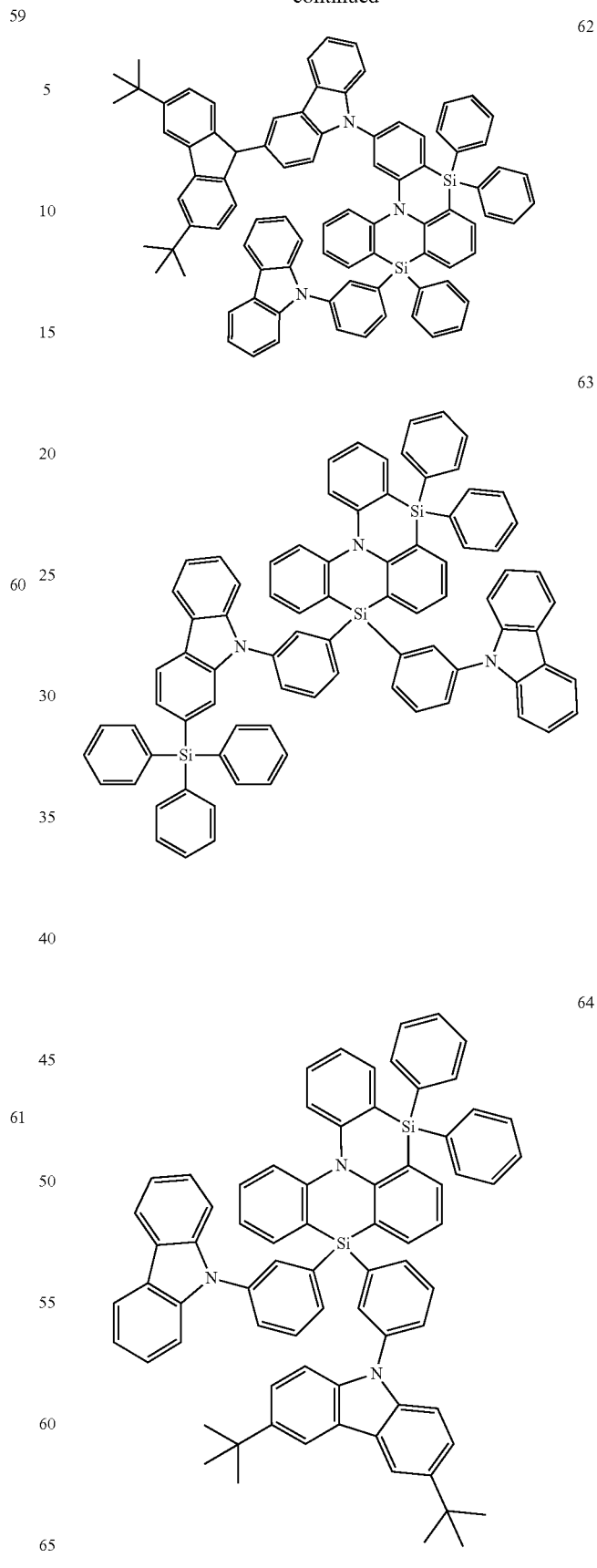

65
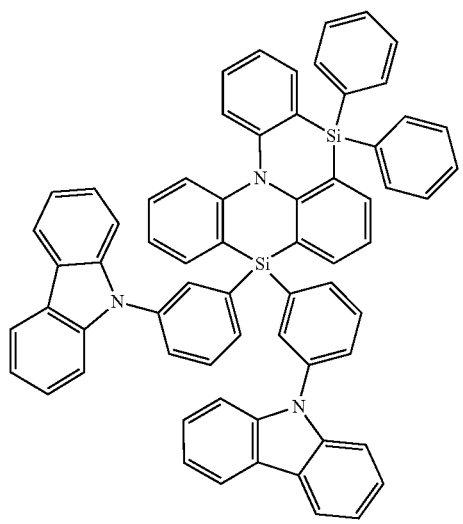
66
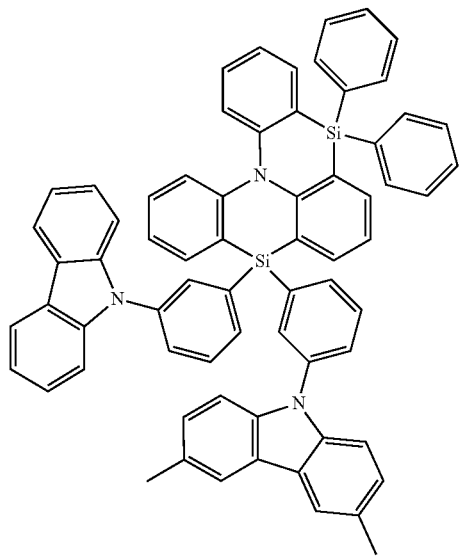
67
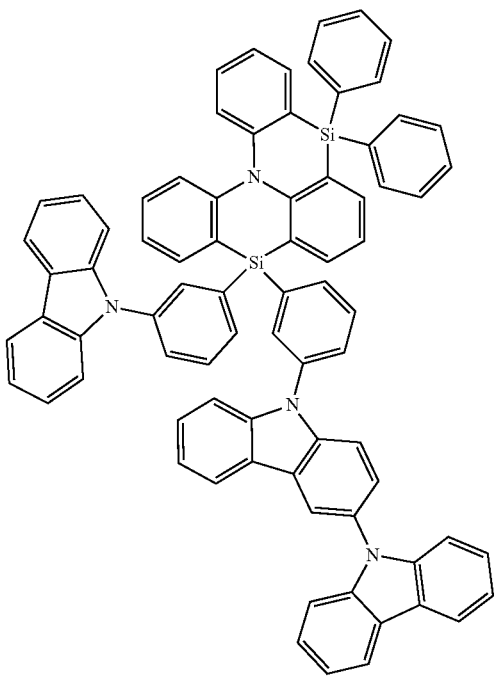
68
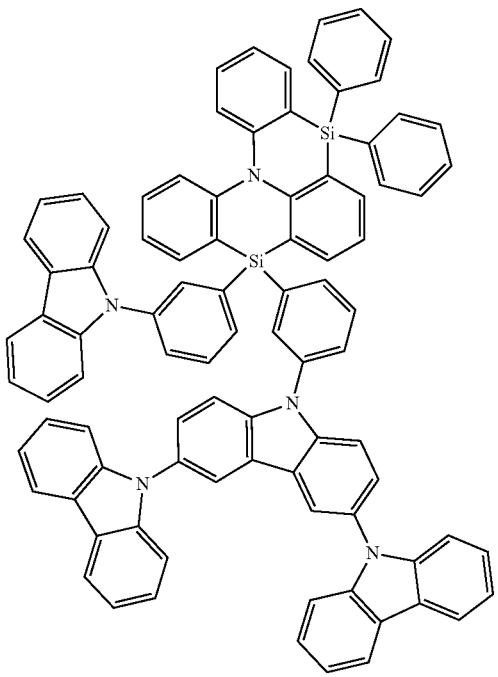

177
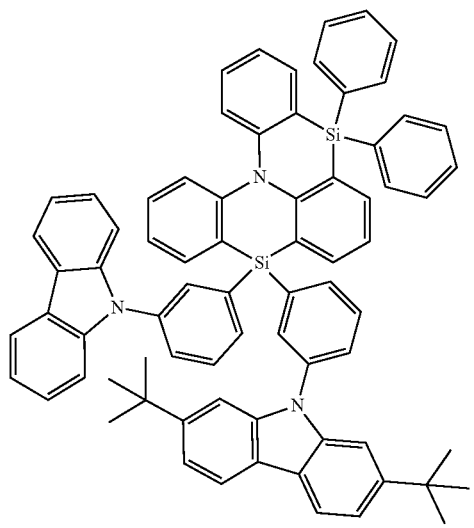
178
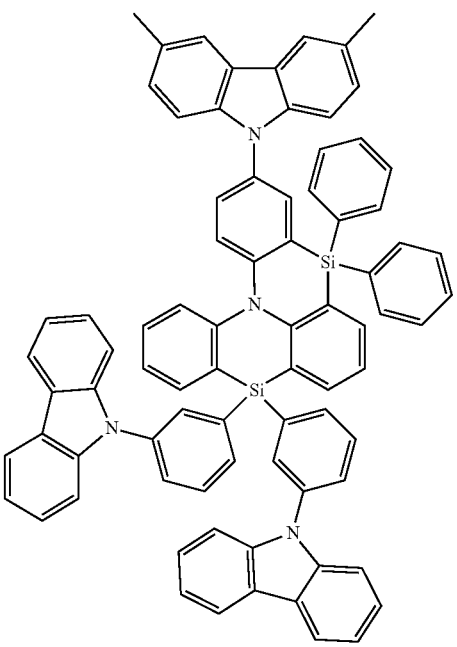
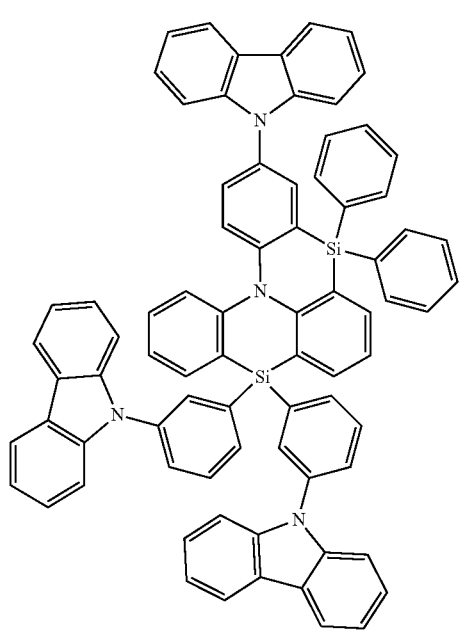
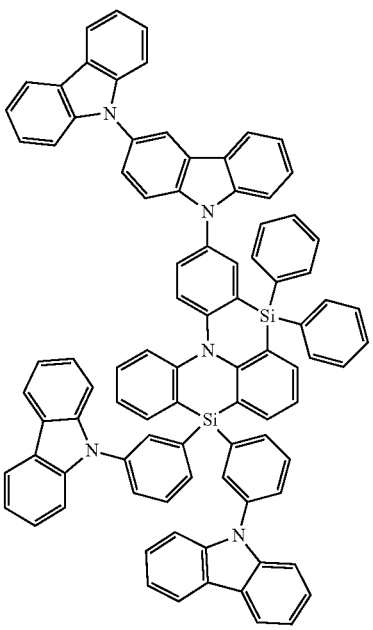

73
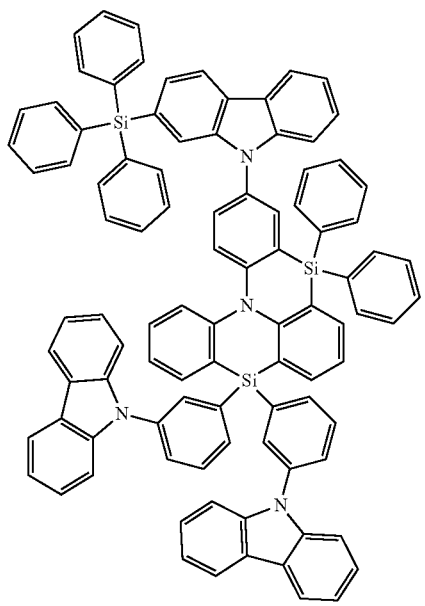
74
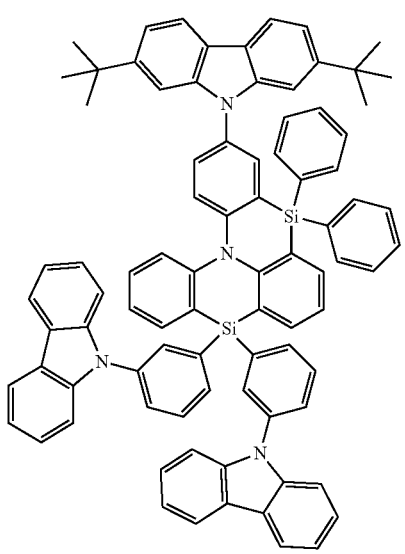
75
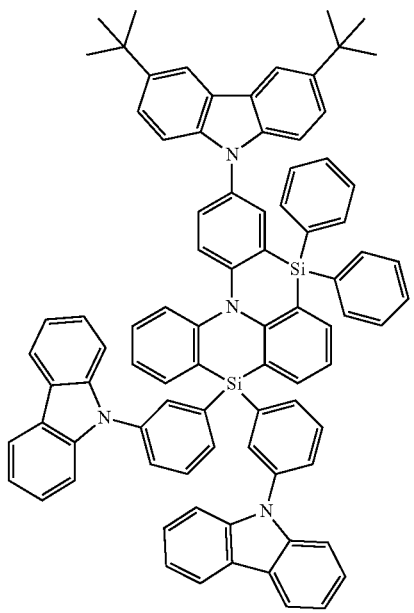
76
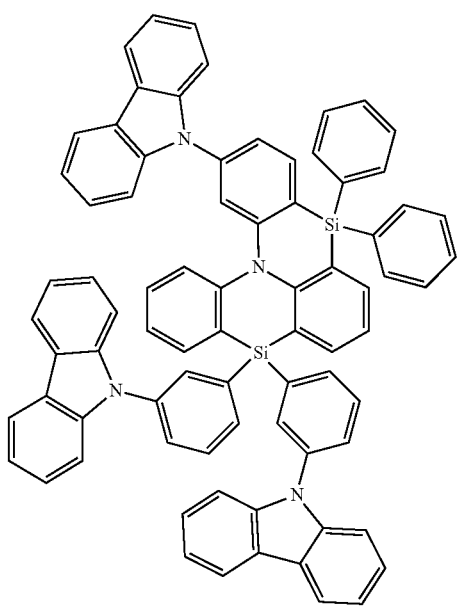

-continued
77
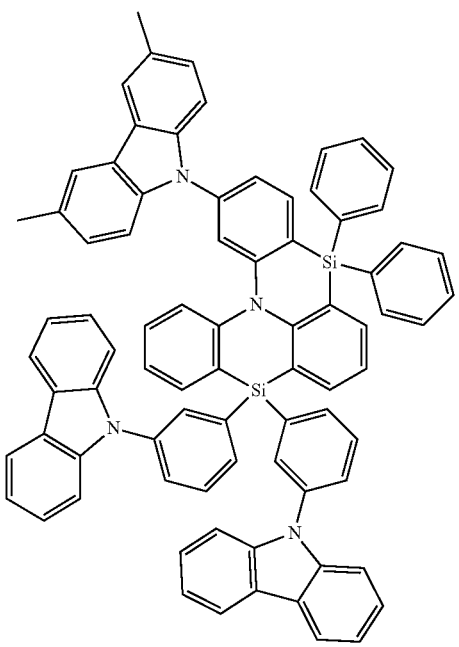
78
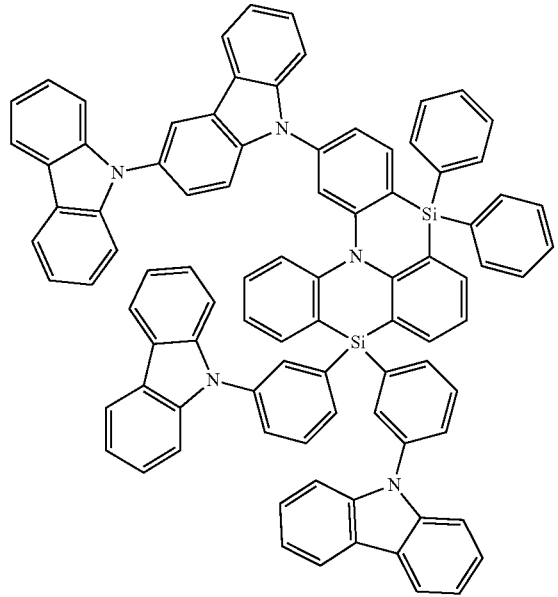
-continued
79
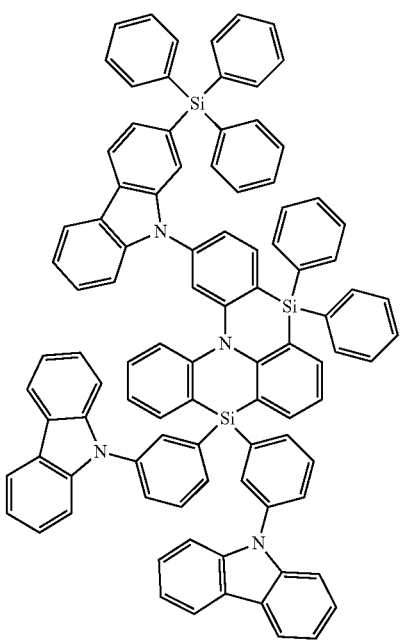
80
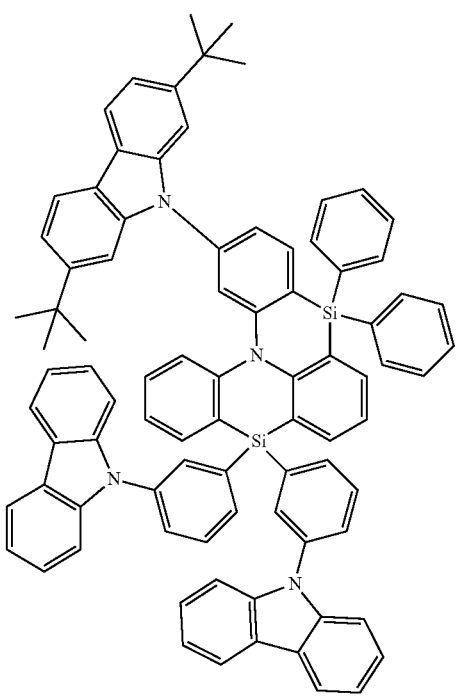

81
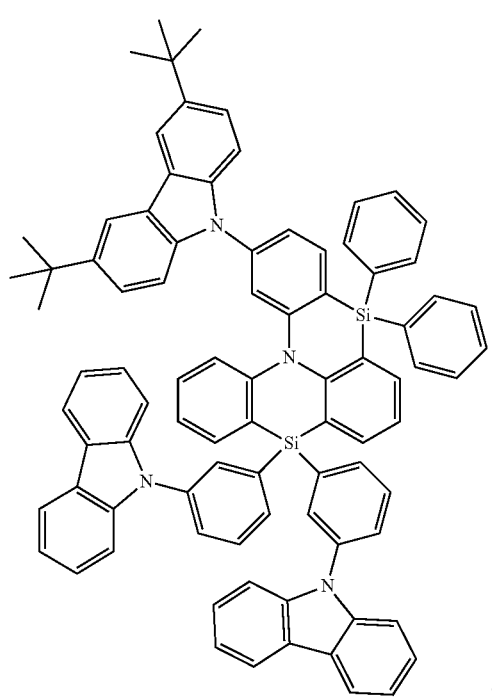
* * * * *

UNITED STATES PATENT AND TRADEMARK OFFICE
CERTIFICATE OF CORRECTION

PATENT NO. : 12,219,868 B2
APPLICATION NO. : 17/220707
DATED : February 4, 2025
INVENTOR(S) : Hyeongmin Kim et al.

Page 1 of 2

It is certified that error appears in the above-identified patent and that said Letters Patent is hereby corrected as shown below:

On the Title Page

Item (72), in Column 1, under "Inventors", Line 6, delete "Anyang-si" and insert -- Asan-si --.

In the Claims

In Column 174, Lines 3-17, in Claim 20, Compound 62, delete

" 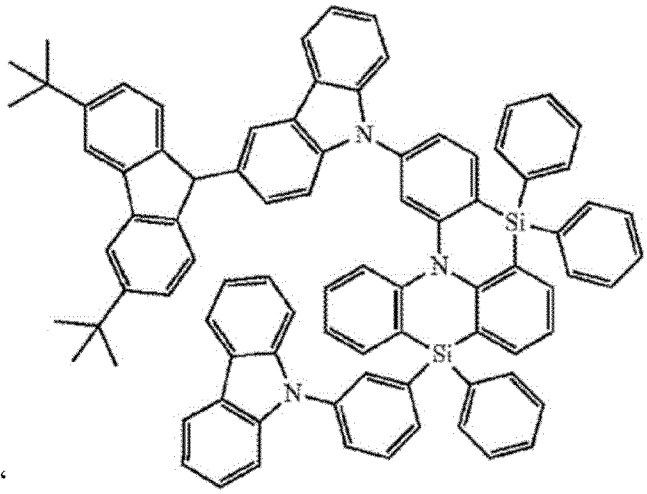 " and insert

Signed and Sealed this
Twenty-seventh Day of May, 2025

Coke Morgan Stewart
*Acting Director of the United States Patent and Trademark Office*